US010366922B2

(12) United States Patent
Lee

(10) Patent No.: US 10,366,922 B2
(45) Date of Patent: Jul. 30, 2019

(54) SEMICONDUCTOR DEVICE AND METHOD OF MANUFACTURING THE SAME

(71) Applicant: SK hynix Inc., Icheon-si, Gyeonggi-do (KR)

(72) Inventor: Nam Jae Lee, Cheongju-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 10 days.

(21) Appl. No.: 15/401,673

(22) Filed: Jan. 9, 2017

(65) Prior Publication Data

US 2017/0117182 A1 Apr. 27, 2017

Related U.S. Application Data

(63) Continuation of application No. 14/496,026, filed on Sep. 25, 2014, now Pat. No. 9,577,085.

(30) Foreign Application Priority Data

Jun. 3, 2014 (KR) ........................ 10-2014-0067598

(51) Int. Cl.

*H01L 29/78* (2006.01)
*H01L 21/768* (2006.01)

(Continued)

(52) U.S. Cl.

CPC .. *H01L 21/76897* (2013.01); *H01L 21/76816* (2013.01); *H01L 23/528* (2013.01);

(Continued)

(58) Field of Classification Search

CPC ......... H01L 21/76897; H01L 21/76816; H01L 23/5226; H01L 23/528; H01L 27/11524;

(Continued)

(56) References Cited

U.S. PATENT DOCUMENTS 7,429,524 B2 * 9/2008 Marshall ........... H01L 21/76813 257/E21.437
7,564,135 B2 * 7/2009 Park ................. H01L 21/76897 257/758

(Continued)

FOREIGN PATENT DOCUMENTS

CN 100459051 C 2/2009
CN 102544016 A 7/2012
KR 1020140000067 A 1/2014

*Primary Examiner* — Allen L Parker
*Assistant Examiner* — Charles N Ausar-El
(74) *Attorney, Agent, or Firm* — William Park & Associates Ltd.

(57) ABSTRACT

A semiconductor device may comprise a plurality of conductive lines and a plurality of contact plugs. The plurality of conductive lines may include a first conductive line a second conductive line. The plurality of contact plugs may include a first contact plug and a second contact plug. The first contact plug may have a first pillar portion and a first protruding portion protruding from a sidewall of the first pillar portion at a first depth, so as to be in alignment and contact with a sidewall of the first conductive line. The second contact plug may have a second pillar portion and a second protruding portion protruding from a sidewall of the second pillar portion at a second depth, so as to be in alignment and contact with a sidewall of the second conductive line.

20 Claims, 54 Drawing Sheets

(51) Int. Cl.

| | |
|---|---|
| ***H01L 23/522*** | (2006.01) |
| ***H01L 23/528*** | (2006.01) |
| ***H01L 27/1157*** | (2017.01) |
| ***H01L 27/11524*** | (2017.01) |
| ***H01L 27/11548*** | (2017.01) |
| ***H01L 27/11556*** | (2017.01) |
| ***H01L 27/11582*** | (2017.01) |

(52) U.S. Cl.
CPC ...... *H01L 23/5226* (2013.01); *H01L 27/1157* (2013.01); *H01L 27/11524* (2013.01); *H01L 27/11548* (2013.01); *H01L 27/11556* (2013.01); *H01L 27/11582* (2013.01); *H01L 29/78* (2013.01)

(58) Field of Classification Search
CPC ......... H01L 27/11548; H01L 27/11556; H01L 27/1157; H01L 27/11582; H01L 29/78
See application file for complete search history.

(56) References Cited

U.S. PATENT DOCUMENTS 7,576,011 B2 * 8/2009 Hyun ................ H01L 21/76832 257/483
7,989,880 B2 8/2011 Wada et al.
8,178,919 B2 * 5/2012 Fujiwara ........... H01L 27/11524 257/319
8,247,860 B2 * 8/2012 Iwase ................ H01L 21/28282 257/314
8,394,716 B2 * 3/2013 Hwang ............ H01L 27/11551 257/315
8,440,533 B2 5/2013 Toh et al.
8,492,824 B2 7/2013 Yahashi
8,692,314 B2 * 4/2014 Lee ................... H01L 27/11578 257/324
8,906,805 B2 12/2014 Park et al.
9,076,889 B2 7/2015 Lee et al.
9,082,769 B2 * 7/2015 Kageyama .......... H01L 23/5258
9,087,821 B2 * 7/2015 Lin ....................... H01L 23/481
9,130,052 B2 9/2015 Kim et al.
9,142,455 B2 9/2015 Kim et al.
9,184,177 B2 * 11/2015 Imamura ........... H01L 27/11582
9,263,368 B2 * 2/2016 Oh .......................... H01L 23/48
9,293,418 B2 * 3/2016 Wu ................... H01L 21/76898
9,331,082 B2 * 5/2016 Lee ................... H01L 27/11548
9,343,452 B2 * 5/2016 Yun ..................... H01L 27/1157
9,362,301 B2 * 6/2016 Lee ................... H01L 21/28282
9,373,540 B2 * 6/2016 Hyun ................ H01L 21/76843
9,429,774 B2 8/2016 Lee et al.
9,640,542 B2 * 5/2017 Lee ................... H01L 27/11548
9,711,603 B2 * 7/2017 Lim .................... H01L 29/4234
2002/0149958 A1 * 10/2002 Kunikiyo .............. H01L 27/115 365/51
2005/0088551 A1 * 4/2005 Lee ................... H01L 21/76805 348/272
2007/0090490 A1 * 4/2007 Chang ................... H01L 23/481 257/621
2009/0283819 A1 11/2009 Ishikawa et al.
2010/0155818 A1 * 6/2010 Cho ................. H01L 27/11578 257/324
2010/0207195 A1 8/2010 Fukuzumi et al.
2010/0323505 A1 12/2010 Ishikawa et al.
2011/0049607 A1 3/2011 Yahashi
2011/0151667 A1 6/2011 Hwang et al.
2011/0169062 A1 7/2011 Kadoya
2011/0169071 A1 * 7/2011 Uenaka ................. H01L 27/105 257/326
2011/0201167 A1 8/2011 Satonaka et al.
2011/0266691 A1 * 11/2011 Lin ................... H01L 21/76816 257/774
2012/0146122 A1 * 6/2012 Whang ............... H01L 29/7889 257/315
2012/0211816 A1 8/2012 Yahashi
2012/0238093 A1 9/2012 Park et al.
2013/0200331 A1 8/2013 Morikawa et al.
2013/0234338 A1 * 9/2013 Uenaka ............... H01L 23/5384 257/774
2013/0313627 A1 11/2013 Lee et al.
2014/0166963 A1 * 6/2014 Lee ................... H01L 21/02532 257/4
2015/0318263 A1 * 11/2015 Yu .......................... H01L 23/36 257/774
2016/0268264 A1 * 9/2016 Hwang ............. H01L 27/11578
2017/0084532 A1 * 3/2017 Son ..................... H01L 23/5226

* cited by examiner

SEMICONDUCTOR DEVICE AND METHOD OF MANUFACTURING THE SAME

CROSS-REFERENCE TO RELATED APPLICATION

The present application is a continuation application of U.S. application Ser. No. 14/496,026, filed on Sep. 25, 2014, and claims priority to Korean patent application number 10-2014-0067598 filed on Jun. 3, 2014, in the Korean Intellectual Property Office, the entire disclosure of which is incorporated by reference herein.

BACKGROUND

1. Technical Field

Various embodiments generally relate to a semiconductor device and a method of manufacturing the same and, more particularly, to a semiconductor device including contact plugs and a method of manufacturing the same.

2. Related Art

There technology proposals relating to stacking memory cells over substrates in order to increase the degrees of integration within semiconductor devices. The memory cells stacked over the substrates may be coupled to conductive patterns. The conductive patterns may be arranged over the substrates at different heights. In order to independently apply an electrical signal to the conductive patterns arranged at different heights, contact plugs may be coupled to the conductive patterns. The conductive patterns may be patterned to form a stepped structure to open contact regions of the conductive patterns, and the contact plugs may be coupled to the contact regions of the conductive patterns opened through the stepped structure.

However, errors may occur when the conductive patterns are patterned into the stepped structure. For example, misalignment may occur between the contact plugs and the conductive patterns due to these errors.

SUMMARY

In an embodiment, a semiconductor device (e.g. a memory device) may comprise a plurality of conductive lines and a plurality of contact plugs. The plurality of conductive lines may include a first conductive line and a second conductive line. The plurality of contact plugs may include a first contact plug and a second contact plug. The first contact plug may have a first pillar portion and a first protruding portion protruding from a sidewall of the first pillar portion at a first depth, so as to be in alignment and contact with a sidewall of the first conductive line at the first depth. The second contact plug may have a second pillar portion and a second protruding portion protruding from a sidewall of the second pillar portion at a second depth, so as to be in alignment and contact with a sidewall of the second conductive line at the second depth. The first and the second conductive lines may be first and second word lines, respectively.

In an embodiment, a semiconductor device (e.g. a memory device) may comprise a plurality of conductive lines and a plurality of contact plugs. The plurality of conductive lines may include a first conductive line and a second conductive line. A first contact plug of the plurality of contact plugs may have a first pillar portion and a first protruding portion protruding from a sidewall of the first pillar portion at a first depth, so as to be in alignment and contact with a sidewall of the first conductive line at the first depth. In addition, the first contact plug may have a second protruding portion protruding from a sidewall of the first pillar portion at a second depth, so as to be in alignment and contact with a sidewall of the second conductive line at the second depth. The first and the second conductive lines may be first and second select lines, respectively.

In an embodiment, a semiconductor device (e.g. a memory device) may comprise a plurality of conductive lines and a plurality of contact plugs arranged in a matrix format. The plurality of contact plugs may include a plurality of first contact plugs arranged in a first row of the matrix format, and a plurality of second contact plugs arranged in a second row of the matrix format. Each first contact plug has a first pillar portion and a first protruding portion protruding from a sidewall of the first pillar portion, so as to be in alignment and contact with a sidewall of a corresponding one of the conductive lines. Each second contact plug has a second pillar portion and a second protruding portion protruding from a sidewall of the second pillar portion, so as to be in alignment and contact with a sidewall of a corresponding one of the conductive lines. The alignments and contacts between the contact plugs and the conductive lines may be made at different depths of the semiconductor device.

DETAILED DESCRIPTION

Hereinafter, various embodiments will be described in detail with reference to the accompanying drawings. The figures are provided to allow those with ordinary skill in the art to understand the scope of the embodiments. The present embodiments may, however, be embodied in different forms and should not be construed as limited to the embodiments set forth. Rather, these embodiments are provided so that this disclosure will be thorough and complete. In addition, the embodiments are provided to fully convey the scope of the description to those skilled in the art.

Various embodiments may generally relate to a semiconductor device having improved alignment of contact plugs and a method of manufacturing the same.

Figure 1A:
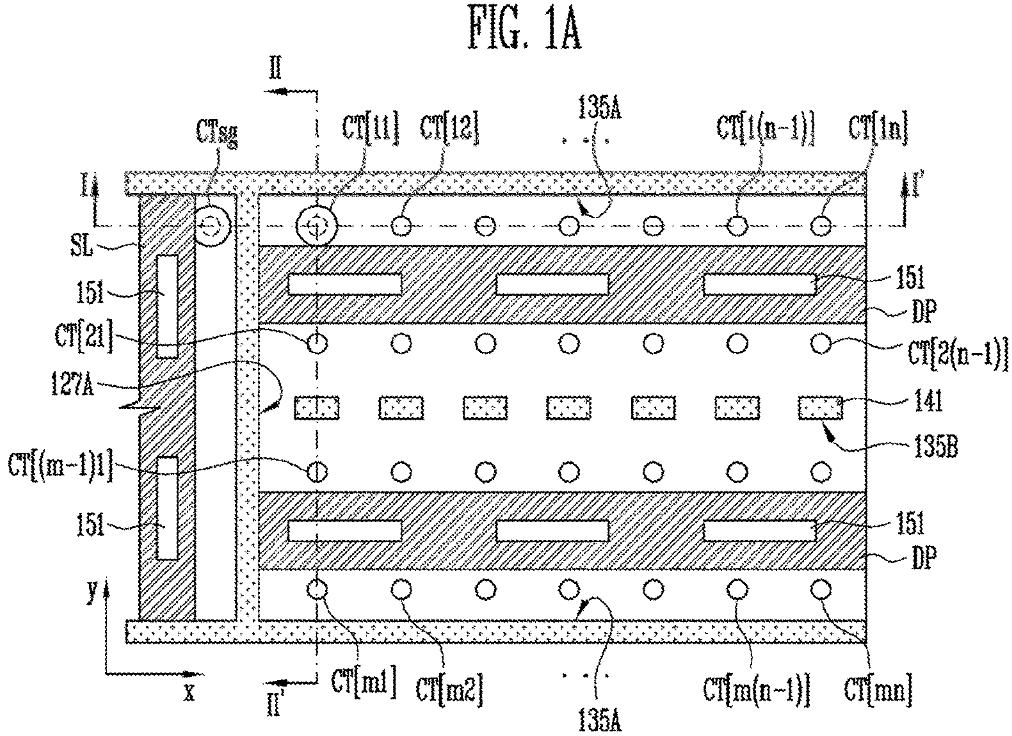
FIGS. 1A and 1B are plan views illustrating a representation of a layout of a semiconductor device according to an embodiment.
Figure 1B:
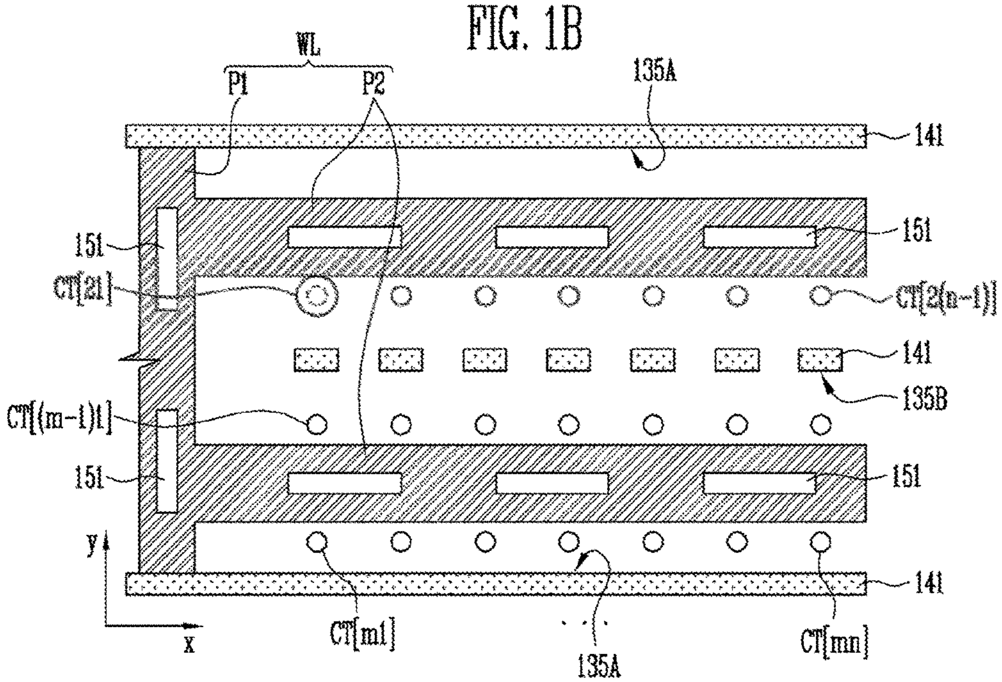

FIGS. 1A and 1B are plan views illustrating a representation of a layout of a semiconductor device according to an embodiment. Particularly, FIGS. 1A and 1B are plan views illustrating a representation of a contact region of the semiconductor device. More particularly, FIG. 1A is a plan view illustrating a layer on which a selection line is formed, and FIG. 1B is a plan view illustrating a layer in which a word line is formed.

Referring to FIGS. 1A and 1B, the semiconductor device according to an embodiment may include horizontal layers stacked over a substrate (not illustrated). Each of the horizontal layers may include conductive regions and sacrificial regions. Each of the horizontal layers may be arranged between interlayer insulating layers 111 illustrated in FIGS. 2A and 2B. Conductive patterns including a selection line SL, a dummy pattern DP, and a word line WL may be formed in the conductive regions. Sacrificial insulating layers 113 (see FIG. 2A) may be formed in the sacrificial regions. The horizontal layers may be separated into units of memory blocks by a first buried insulating layer 141.

The first buried insulating layer 141 may include first portions having a first depth. The first buried insulating layer 141 may include a second portion having a second depth lower than the first depth. The first portions of the first buried insulating layer 141 may be formed in a first slit 135A and second slits 135B. The first slit 135A may separate the horizontal layers in units of memory blocks. The second slits 135B may pass through the horizontal layers within a single memory block. The first portions of the first buried insulating layer 141 may support the horizontal layers. The first slit 135A and the second slits 135B may be formed at the same time or substantially the same time. The second portion of the first buried insulating layer 141 may be formed to prevent an electrical connection between the selection line SL and the dummy pattern DP, the selection line SL and the dummy pattern DP being formed in the same horizontal layer. The second portion of the first buried insulating layer 141 may be formed in a trench 127A extending from an uppermost horizontal layer, among the horizontal layers, to a bottom surface of a target horizontal layer. The target horizontal layer may be the horizontal layer on which the selection line SL and the dummy pattern DP are arranged. A depth of the trench 127A may be controlled so that the trench 127A may not pass through the word line WL.

The selection line SL and the word line WL may extend from a cell region (not illustrated) to the contact region. The selection line SL and the dummy pattern DP may be arranged over the word line WL. The selection line SL and the dummy pattern DP may be formed on each of two or more of the horizontal layers. The dummy pattern DP and the selection line SL arranged on the same horizontal layer may be separated from each other with the sacrificial insulating layer 113 and the first buried insulating layer 141 interposed therebetween. The dummy pattern DP may have a linear shape or substantially a linear shape extending in one direction. The dummy pattern DP may be separated into two or more patterns in a direction crossing the extending direction. The sacrificial insulating layer 113 may be arranged between the two or more dummy patterns DP.

The word line WL may include a first portion P1 and a second portion P2. The first portion P1 may be parallel with or substantially parallel with the selection line SL. The second portion P2 may be parallel with or substantially parallel with the dummy pattern DP. The second portion P2 of the word line WL may be extended and coupled to the first portion P1. The second portion P2 of the word line WL may have a linear shape or substantially a linear shape extending in one direction. Two or more of the second portions P2 of the word line WL may be arranged in the direction crossing the extending direction. The sacrificial insulating layer 113 may be arranged between the two or more second portions P2. The word line WL may be arranged on each of the two or more horizontal layers.

The selection line SL, the dummy pattern DP, and the word line WL may contact sidewalls of second buried insulating layers 151 passing through the horizontal layers, and being extended to the side portions. The selection line SL, the dummy pattern DP and the word line WL may be coupled to one of the contact plugs CT[11] to CT[mn], and CTsg, where m and n are natural numbers greater than or equal to 2.

The contact plugs CT[11] to CT[mn], and CTsg may include the cell contact plugs CT[12] to CT[mn] coupled to the word lines WL, the select contact plug CTsg coupled to the selection line SL, and the dummy contact plug CT[11] coupled to the dummy pattern DP. The select contact plug CTsg may pass through the sacrificial insulating layer 113 (see FIG. 2A) arranged between the dummy pattern DP and the selection line SL. The select contact plug CTsg may be insulated from the dummy contact plug CT[11] through the first buried insulating layer 141. A bottom surface of each of the contact plugs CT[11] to CT[mn], and CTsg may be arranged on the horizontal layer on which the conductive patterns SL, DP, or WL to contact with is formed.

The contact plugs CT[11] to CT[mn], and CTsg may extend to the target horizontal layer on which the conductive patterns SL, DP or WL to contact with is formed. Each of the contact plugs CT[11] to CT[mn], and CTsg may have different cross-sectional areas varying in the z direction shown in FIGS. 2A and 2B. Each of the contact plugs CT[11] to CT[mn], and CTsg may have the largest cross-sectional area at the position at which the conductive patterns SL, DP or WL to contact with is arranged. The dummy contact plug CT[11] and the cell contact plugs CT[12] to CT[mn] may be arranged in a matrix format including a plurality of rows and a plurality of columns. The dummy contact plug CT[11] may pass through at least one sacrificial insulating layer 113 and be located adjacent to the dummy pattern DP. The cell contact plugs CT[12] to CT[mn] may pass through at least one sacrificial insulating layer 113 and be adjacent to the second portion P2 of the word line WL.

Figure 2A:
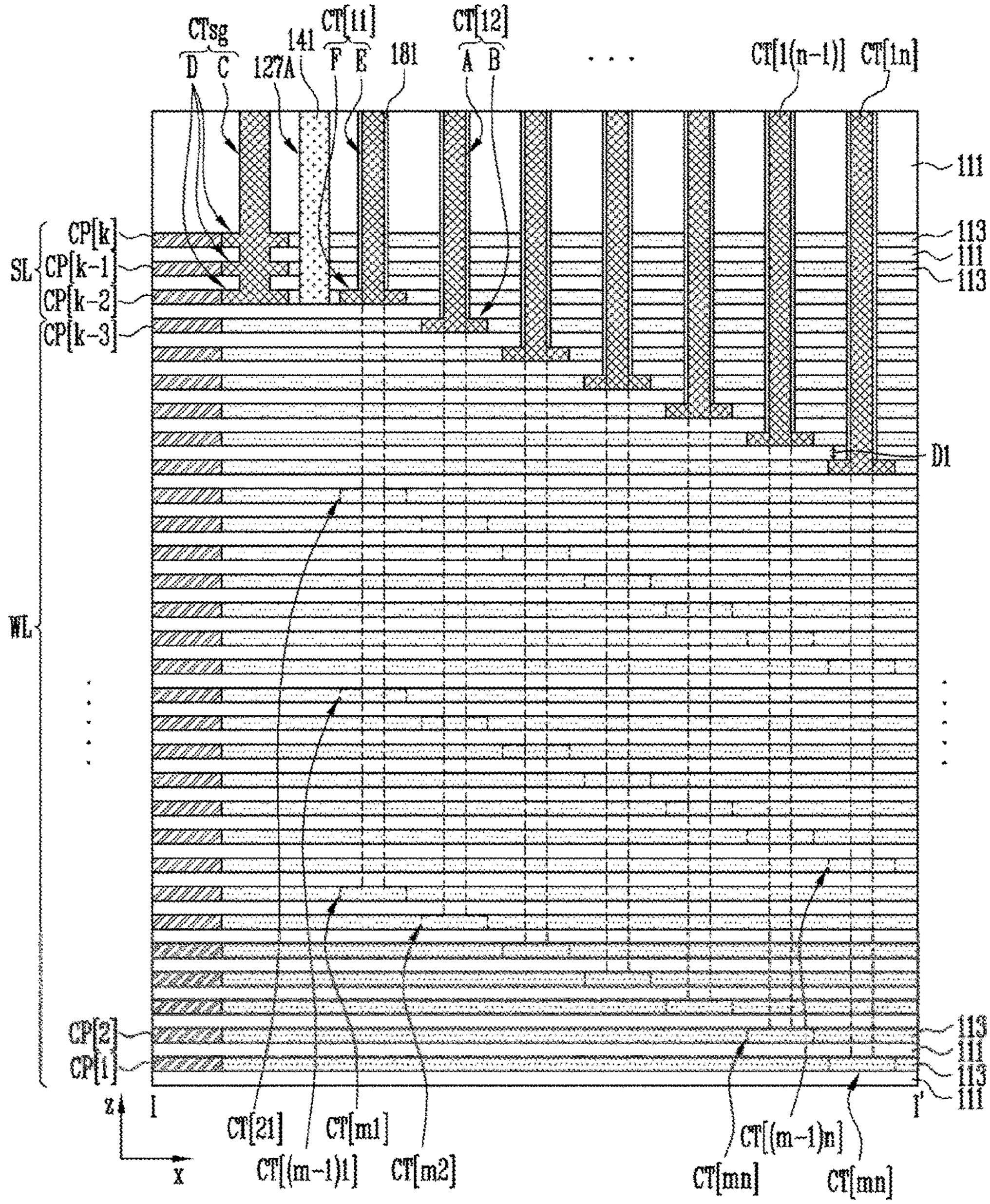
FIGS. 2A and 2B are cross-sectional views illustrating a representation of a contact region of a semiconductor device according to an embodiment.
Figure 2B:
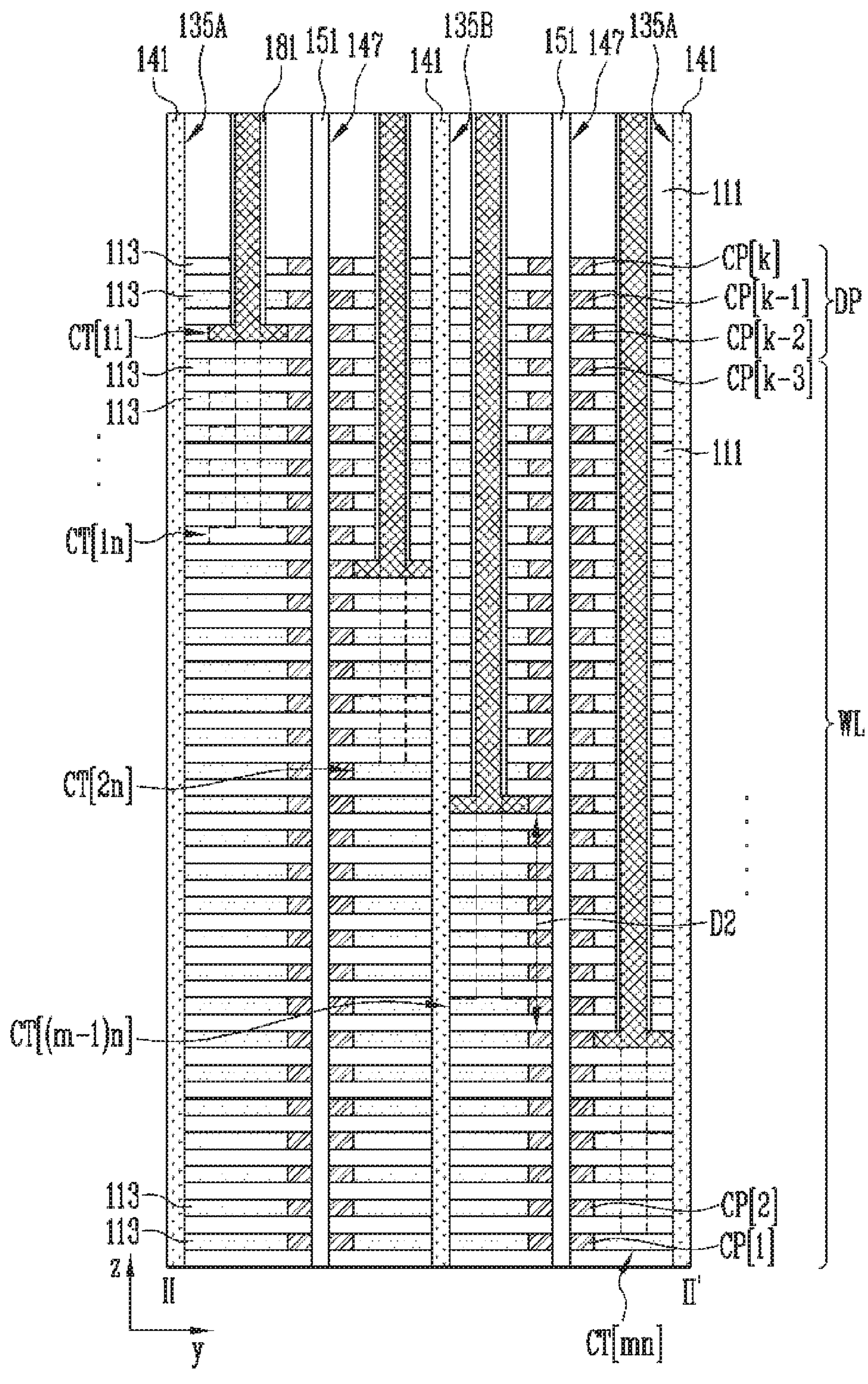

FIGS. 2A and 2B are cross-sectional views illustrating a representation of a contact region of a semiconductor device according to an embodiment. More specifically, FIG. 2A is a cross-sectional view taken along line I-I' of FIG. 1A. FIG. 2B is a cross-sectional view taken along line II-II' of FIG. 1A. In FIGS. 2A and 2B, the cell contact plugs not taken along lines I-I' and II-II' are indicated by dotted lines.

As illustrated in FIGS. 2A and 2B, a semiconductor device according to an embodiment may include the interlayer insulating layers 111, and conductive patterns CP[1] to CP[k], where k is a natural number greater than or equal to 2. The semiconductor device may also include the sacrificial insulating layers 113, and the contact plugs CTsg and CT[11] to CT[mn]. The interlayer insulating layers 111 may be stacked in a first direction (z direction) and separated from each other. The conductive patterns CP[1] to CP[k] and the sacrificial insulating layers 113 may be formed in spaces between the interlayer insulating layers 111. The sacrificial insulating layers 113 may be arranged at heights where the conductive patterns CP[1] to CP[k] are arranged. The contact plugs CTsg and CT[11] to CT[mn] may be coupled to the conductive patterns CP[1] to CP[k], respectively.

Two or more of the conductive patterns, for example, CP[k−2] to CP[k] from an uppermost conductive pattern, among the conductive patterns CP[1] to CP[k], may be the selection lines SL or the dummy patterns DP. The conductive patterns CP[1] to CP[k−3] formed under the selection lines SL and the dummy patterns DP may be the word lines WL. The selection line SL and the dummy pattern DP formed on the same layer may be separated from each other.

The contact plugs CT[11] to CT[mn], and CTsg may include the cell contact plugs CT[12] to CT[mn] coupled to the word lines WL, the select contact plug CTsg coupled to the selection lines SL, and the dummy contact plug CT[11] coupled to the dummy pattern DP. As illustrated above in FIG. 1A, the dummy contact plug CT[11] and the cell contact plugs CT[12] to CT[mn] may be arranged in a matrix format. The dummy contact plug CT[11] may be arranged in the first row and column of the matrix. The cell contact plugs CT[12] to CT[mn] may increase in depth going away from the dummy contact plug CT[11]. In other words the cell contact plugs CT[12] to CT[mn] may increase in depth the further the contact plugs CT[12] to CT[mn] are located away from the dummy contact plug CT[11]. The cell contact plugs CT[12] to CT[mn] may be sequentially arranged with a first depth difference D1 in a row direction (x direction) and sequentially arranged with a second depth difference D2 greater than the first depth difference D1 in a column direction (y direction).

Each of the cell contact plugs CT[12] to CT[mn] may include a first pillar portion A. Each of the cell contact plugs CT[12] to CT[mn] may include a first protruding portion B protruding from a sidewall of the first pillar portion A. The first pillar portion A may pass through one or more interlayer insulating layers 111 and one or more sacrificial insulating layers 113 in the first direction (z direction) and extend to the target word line WL. The first protruding portion B may protrude from the sidewall of the first pillar portion A in the horizontal layer on which the target word line WL is formed, and contact a sidewall of the target word line WL. The number of cell contact plugs CT[12] to CT[mn], for example, may be the same as the number of stacked word lines WL. The cell contact plugs CT[12] to CT[mn] may have different depths and be coupled to the word lines WL, respectively.

The select contact plug CTsg may be coupled to the selection lines SL arranged on two or more of the horizontal layers. The select contact plug CTsg may include a second pillar portion C extending in the first direction (z direction) and two or more second protruding portions D protruding from a sidewall of the second pillar portion C. The second pillar portion C may pass through one or more of the interlayer insulating layers 111 and one or more of the sacrificial insulating layers 113 and extend to the layer on which the lowermost selection line is arranged, for example, the layer on which the selection line CP[k−2] is arranged. The second protruding portions D may protrude from the sidewall of the second pillar portion in the layers on which the selection lines SL are formed, and contact sidewalls of the selection lines SL. The number of second protruding portions D may be, for example, the same as the number of stacked selection lines SL.

The dummy contact plug CT[11] may be coupled to the dummy pattern DP formed on the layer on which the lowermost selection line is arranged (for example, the layer in which the selection line CP[k−2] is arranged). The dummy contact plug CT[11] may include a third pillar portion E extending in the first direction (z direction) and a third protruding portion F protruding from a sidewall of the third pillar portion E. The third pillar portion E may pass through one or more interlayer insulating layers 111 and one or more sacrificial insulating layers 113 and extend to the layer on which the lowermost selection line is arranged (for example, the layer in which the selection line CP[k−2] is arranged). The third protruding portion F may protrude from the sidewall of the third pillar portion E in the layer on which the target dummy pattern DP is formed, and contact a sidewall of the target dummy pattern DP. The third protruding portion F may contact a sidewall of the lowermost dummy pattern among the dummy patterns DP stacked in the first direction (z direction).

Each of the dummy contact plug CT[11] and the cell contact plugs CT[12] to CT[mn] may be surrounded by a spacer insulating layer 181. In order to prevent protruding portions from being formed in another layer other than the target layer, the spacer insulating layer 181 may surround only the sidewall of the first pillar portion A above the first protruding portion B or only the sidewall of the third pillar portion E above the third protruding portion F. In other words, the first protruding portion B or the third protruding portion F may not be surrounded by the spacer insulating layer 181.

A trench 127A may pass through one or more of the interlayer insulating layers 111 and one or more sacrificial insulating layers 113. The trench 127A may be formed between the select contact plug CTsg and the dummy contact plug CT[11]. The trench 127A may be filled with the first buried insulating layer 141. The depth of the trench 127A may be controlled by the distance from the uppermost layer of the interlayer insulating layers 111 and the sacrificial insulating layers 113, which are alternately stacked with each other, to the horizontal layer on which the lowermost selection line is arranged (for example, the horizontal layer on which the selection line CP[k−2] is arranged) so that the trench 127A may not pass through the word line WL.

A first slit 135A, a second slit 135B, and a third slit 147 may pass through the interlayer insulating layers 111 and the sacrificial insulating layers 113 stacked alternately with each other. The first slit 135A and the second slit 135B may be filled with the first buried insulating layer 141. The third slit 147 may be filled with the second buried insulating layer 151. The conductive patterns CP[1] to CP[k] may contact a sidewall of the second buried insulating layer 151 and have a predetermined width extending from the sidewall of the second buried insulating layer 151. The second slits 135B may be formed between the neighboring cell contact plugs CT[12] to CT[mn] to prevent the cell contact plugs CT[12] to CT[mn] from being coupled to each other.

A lower structure of the word lines WL may vary depending on a cell structure formed in a cell region.

According to an embodiment, one of the contact plugs CTsg or CT[11] to CT[mn] may include the protruding portion B, D, or F protruding from the sidewall of the pillar portion A, C or E. The protruding portion B, D, or F may be extended and coupled to a sidewall of the target conductive pattern, i.e., one of the conductive patterns CP[1] to CP[k]. Thus, according to an embodiment, even when the conductive patterns CP[1] to CP[k] are not formed to have a stepped structure, one of the contact plugs CTsg or CT[11] to CT[mn] may be coupled to the target conductive pattern, i.e., one of the conductive patterns CP[1] to CP[k]. According to an embodiment, since the conductive patterns CP[1] to CP[k] are not necessarily patterned in a stepwise manner, processes may be simplified, and process stability may be increased. According to an embodiment, the area occupied by the stepped structure may be removed, so that the size of the semiconductor device may be reduced.

Figure 3:
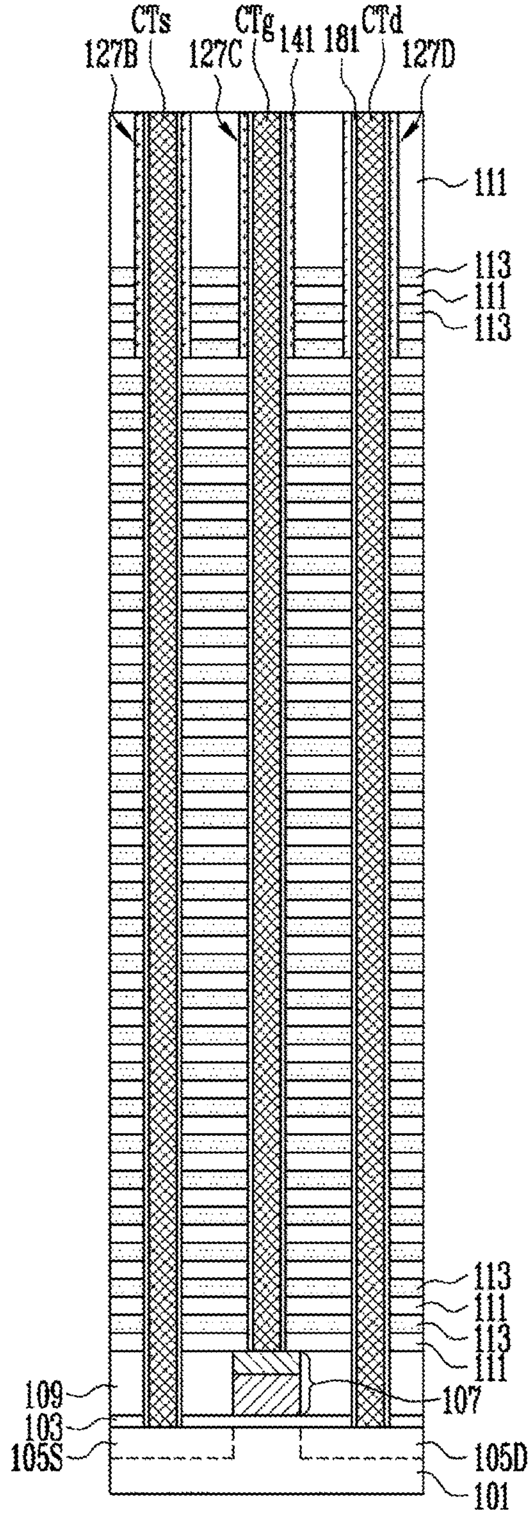
FIG. 3 is a cross-sectional view illustrating a representation of a peripheral region of a semiconductor device according to an embodiment.

FIG. 3 is a cross-sectional view illustrating a representation of a peripheral region of a semiconductor device according to an embodiment. Peripheral transistors forming circuits for driving memory cells may be arranged in the peripheral region. FIG. 3 illustrates a portion of the peripheral region in which a single peripheral transistor is formed for convenience of explanation.

Referring to FIG. 3, in the peripheral region, the interlayer insulating layers 111 and the sacrificial insulating layers 113 extending from the contact region and the cell region may be alternately stacked over the substrate 101. A peripheral transistor may be arranged under a stacked structure including the interlayer insulating layers 111 and the sacrificial insulating layers 113. The peripheral transistor may include a gate 107 formed over a substrate 101 with a gate insulating layer 103 interposed therebetween, and a source region 105S and a drain region 105D formed in the substrate 101 at both sides of the gate 107. A lower insulating layer 109 may be formed under the stacked structure of the interlayer insulating layers 111 and the sacrificial insulating layers 113.

The gate 107, the source region 105S, and the drain region 105D may be coupled to peripheral contact plugs CTg, CTs, and CTd, respectively, and receive signals from an external device. The peripheral contact plugs CTg, CTs and CTd may pass through the interlayer insulating layers 111 and the sacrificial insulating layers 113 and extend to surfaces of the gate 107, the source region 105S and the drain region 105D, respectively. Each of the peripheral contact plugs CTg, CTs, and CTd may be surrounded by the spacer insulating layer 181. A top portion of each of the peripheral contact plugs CTg, CTs, and CTd higher than the word lines WL, illustrated in FIG. 2A, may be surrounded by the first buried insulating layer 141. The first buried insulating layer 141 formed in the peripheral region may be formed in each of grooves 127B, 127C, and 127D having the same depth or substantially the same depth as the trench 127A illustrated in FIG. 2A. The spacer insulating layer 181 and the peripheral contact plugs CTg, CTs, and CTd may pass through the first buried insulating layers 141 formed in the grooves 127B, 127C, and 127D.

According to an embodiment, the interlayer insulating layers 111 and the sacrificial insulating layers 113 stacked alternately with each other may remain in the peripheral region. Therefore, a stepped portion may be prevented from being formed between the peripheral region, the cell region (not illustrated) and the contact region. As a result, according to an embodiment, since a separate process for reducing errors caused by the stepped portion between the peripheral region, the cell region and the contact region may not be additionally performed, the processes of manufacturing semiconductor devices may be simplified.

FIGS. 4A to 17C are views illustrating a representation of a method of manufacturing a semiconductor device according to an embodiment. FIGS. 4A, 5A, 6A, 7A, 8A, 9A, 10A, 11A, 12A, 13A and 14A are plan views of a contact region. FIGS. 4B, 6B, 7B, 8B, 9B, 10B, 14B, 15A, 16A and 17A are cross-sectional views taken along line I-I' of the plan views. FIGS. 5B, 6C, 7C, 11B, 12B, 13B, 14C, 15B, 16B and 17B are cross-sectional views taken along line II-II' of the plan views. FIGS. 4C, 5C, 6D, 7D, 8C, 9C, 10C, 11C, 12C, 13C, 14D, 15C, 16C and 17C are cross-sectional views of a peripheral region.

Figure 4A:
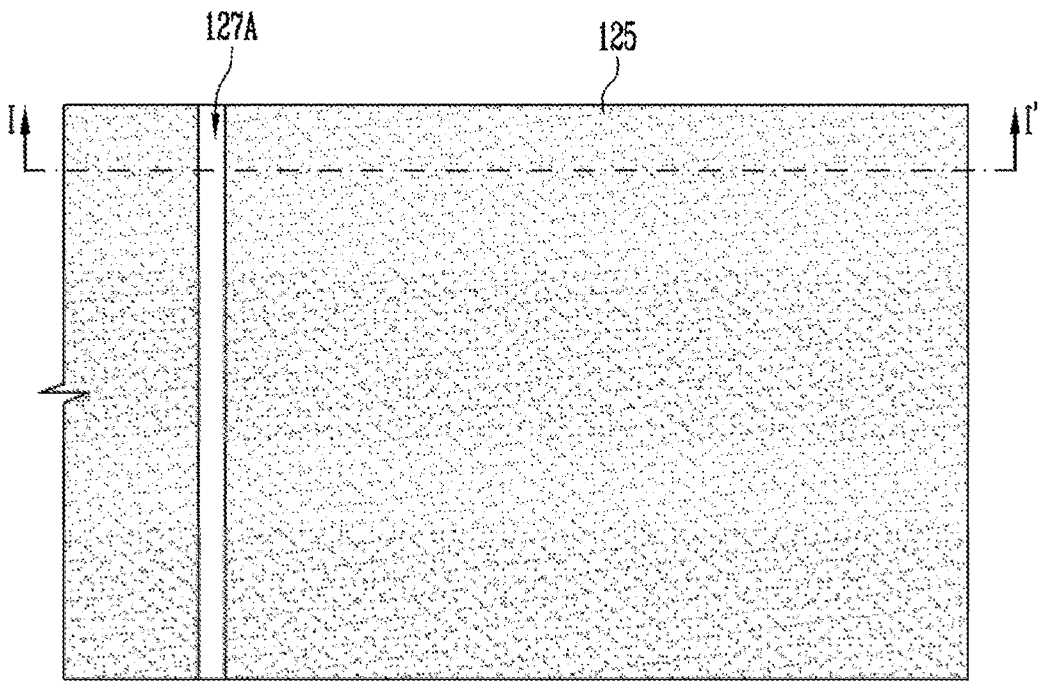
FIGS. 4A to 17C are views illustrating a representation of a method of manufacturing a semiconductor device according to an embodiment.
Figure 4B:
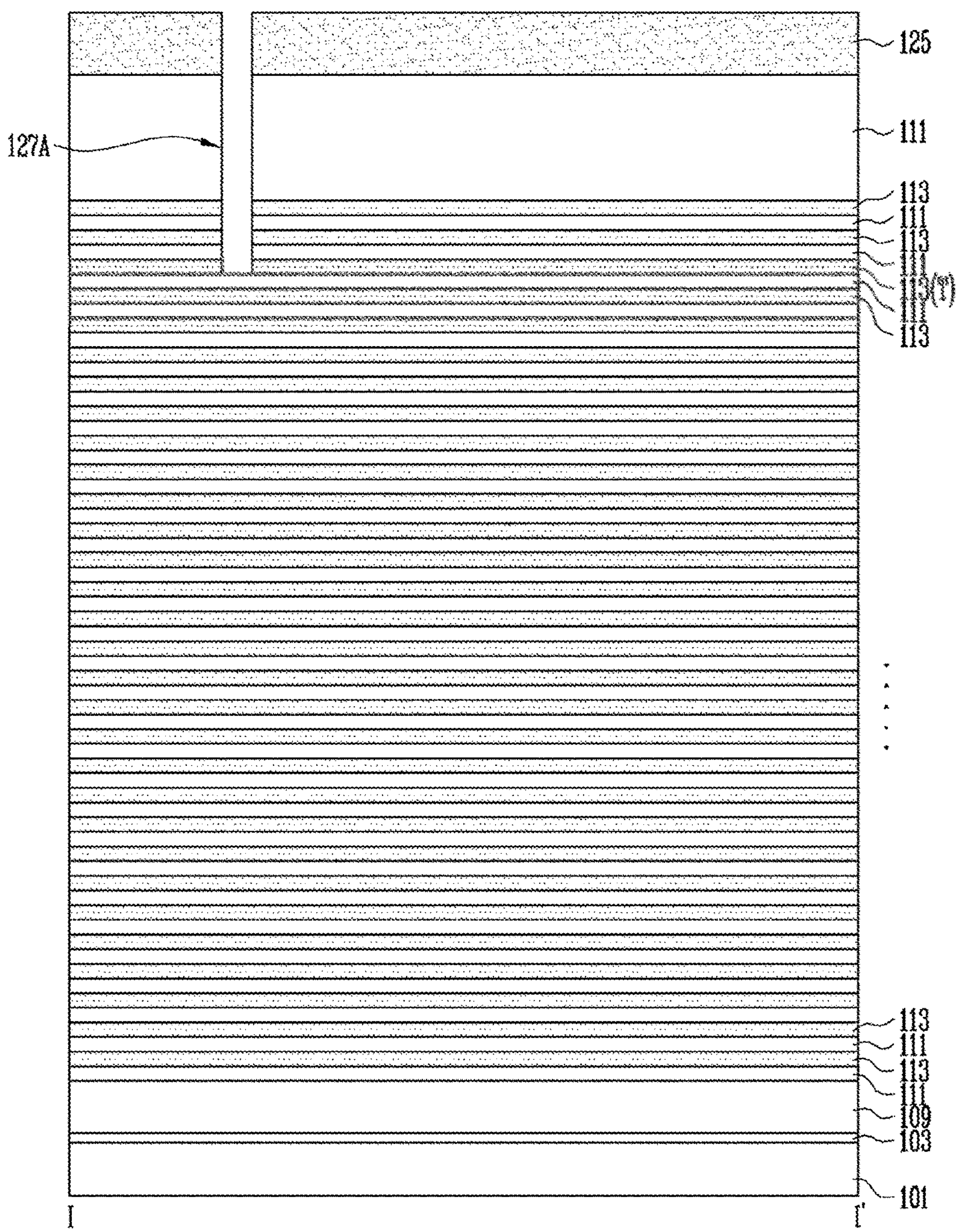
Figure 4C:
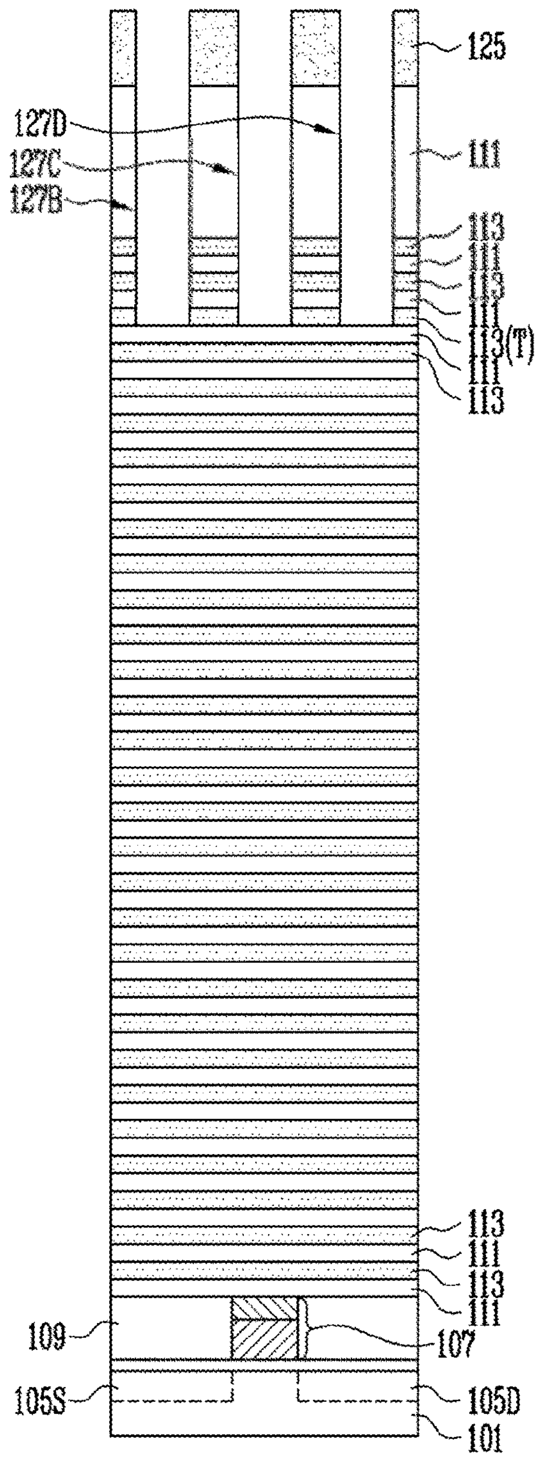

Referring to FIGS. 4A to 4C, the peripheral transistor including the gate 107, the source region 105S and the drain region 105D may be formed over the substrate 101. An example of forming the peripheral transistor is described below.

First, the gate insulating layer 103 and at least one gate conductive layer may be stacked over the substrate 101. Subsequently, the gate conductive layer may be patterned to form the gate 107. Subsequently, in the peripheral region, impurities may be implanted into the semiconductor substrate 101 exposed by the gate 107 to form the source region 105S and the drain region 105D. When the gate 107 of the peripheral transistor is formed, a pipe gate may be formed in the cell region (not illustrated). On the other hand, before the peripheral transistor is formed, a cell source region may be formed by implanting impurities into the substrate 101 in the cell region. The process of forming the pipe gate or the cell source region may be selected according to cell structures. Various embodiments of the cell structures will be described below with reference to FIGS. 19 and 20.

After the peripheral transistor is formed, the lower insulating layer 109 may be formed to cover the peripheral transistor. A surface of the lower insulating layer 109 may be planarized.

Subsequently, the interlayer insulating layers 111 and the sacrificial insulating layers 113 may be alternately stacked over the lower insulating layer 109. The number of interlayer insulating layers 111 and the number sacrificial insulating layers 113 to be stacked may vary. The sacrificial insulating layers 113 may be formed on the horizontal layers on which conductive patterns are formed. The sacrificial insulating layers 113 may be formed of a different material from the interlayer insulating layers 111. More specifically, the sacrificial insulating layers 113 may include a material having an etch selectivity with respect to the interlayer insulating layers 111. For example, the interlayer insulating layers 111 may include an oxide layer, and the sacrificial insulating layers 113 may include a nitride layer having an etch selectivity with respect to the oxide layer. The thicknesses of the interlayer insulating layers 111 and the sacrificial insulating layers 113 may vary. For example, the thickness of the sacrificial insulating layers in which selection lines are arranged may be greater than that of the sacrificial insulating layers in which word lines are arranged. In addition, the thickness of the interlayer insulating layers arranged with the selection lines interposed therebetween may be greater than that of the remaining interlayer insulating layers.

A dummy mask pattern 125 may be formed over the stacked structure including the interlayer insulating layers 111 and the sacrificial insulating layers 113 to open regions in which the trench 127A and the first, second and third grooves 127B, 127C, and 127D are formed. The dummy mask pattern 125 may be a photoresist pattern.

Subsequently, the interlayer insulating layers 111 and the sacrificial insulating layers 113 may be etched using the dummy mask pattern 125 as an etch barrier until a target sacrificial insulating layer T, among the sacrificial insulating layers 113, is removed. As a result, the trench 127A may be formed in the contact region, and the first to third grooves 127B, 127C, and 127D may be formed in the peripheral region. The target sacrificial insulating layer T may be arranged under the uppermost sacrificial insulating layer, among the sacrificial insulating layers 113. The position of the target sacrificial insulating layer T may change depending on the number of selection lines to be stacked. For example, when three selection lines are stacked, the target sacrificial insulating layer T may be the third layer from the top of the stacked sacrificial insulating layers 113. The etching process of forming the trench 127A and the first to third grooves 127B, 127C, and 127D may be controlled so that the target sacrificial insulating layer T may be removed and the sacrificial insulating layer under the target sacrificial insulating layer T may not be removed.

Though not illustrated in FIGS. 4A to 4C, before the dummy mask pattern 125 is formed, a channel layer may be formed in the cell region so that the channel layer may pass through the interlayer insulating layers 111 and the sacrificial insulating layers 113. The channel layer is described below with reference to FIGS. 19 and 20.

Figure 5A:
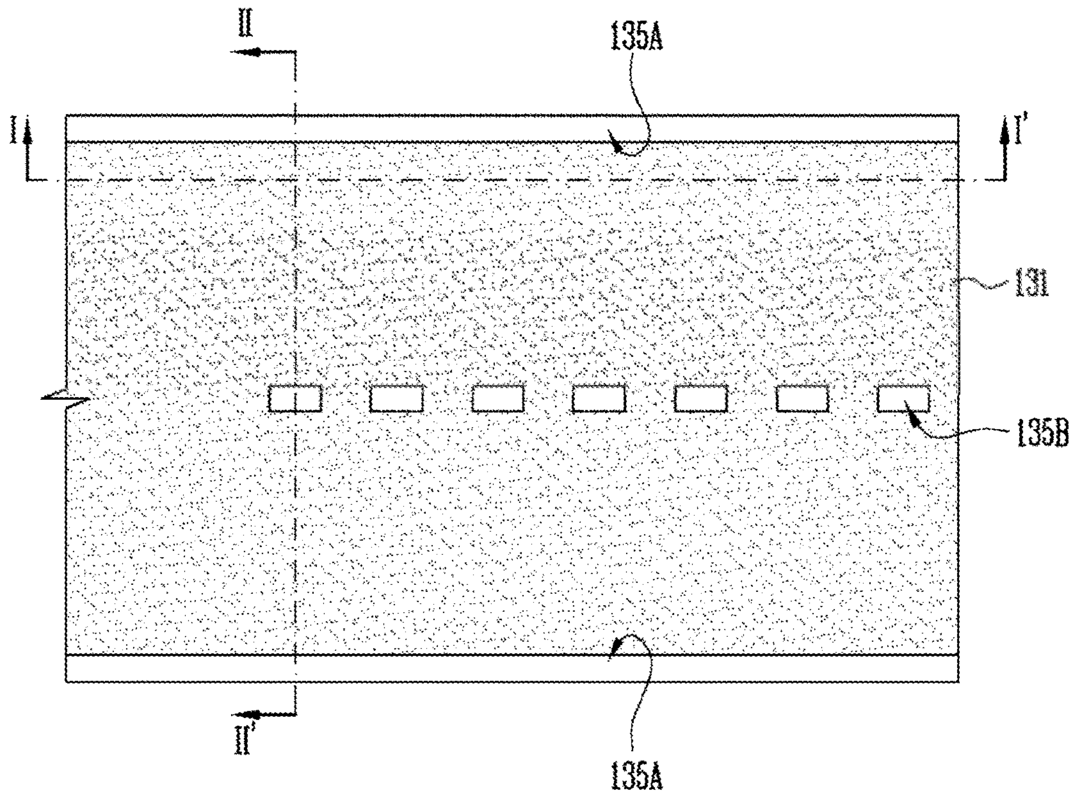
Figure 5B:
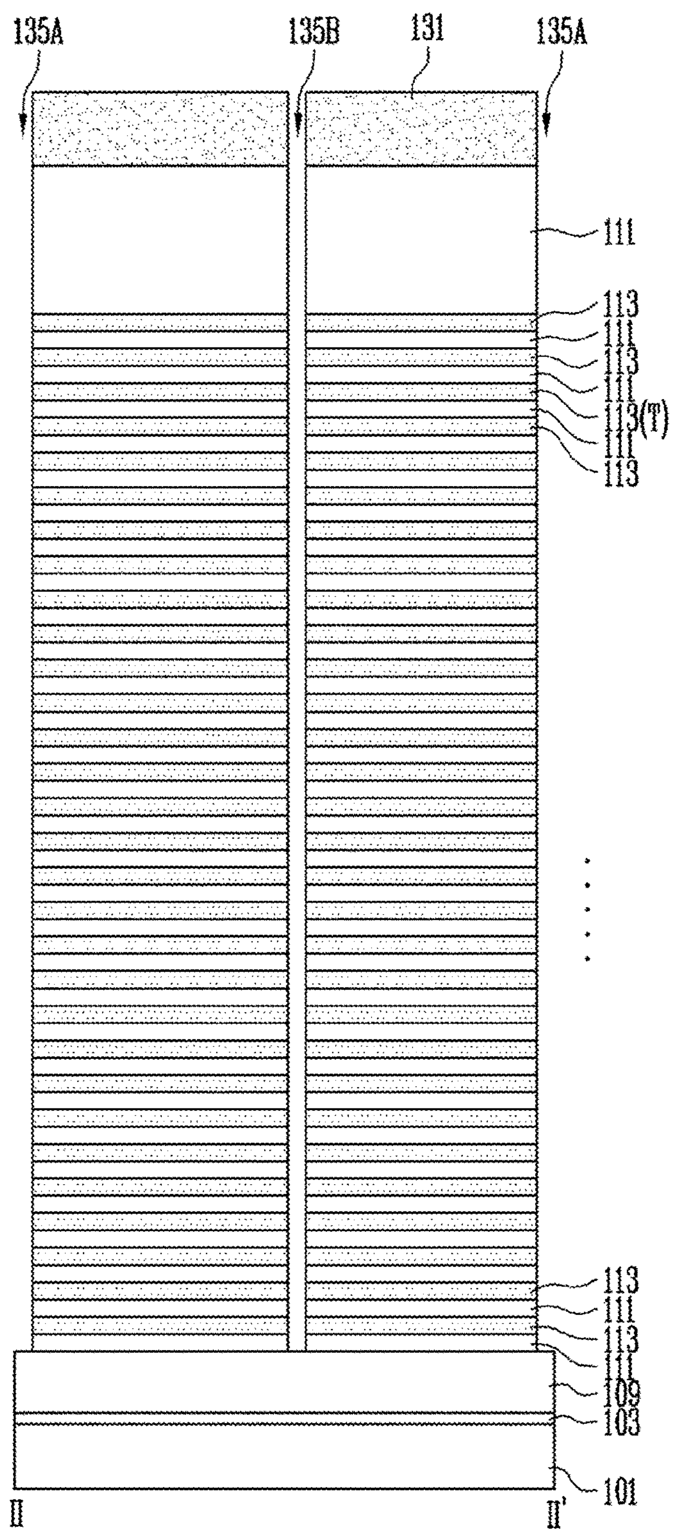
Figure 5C:
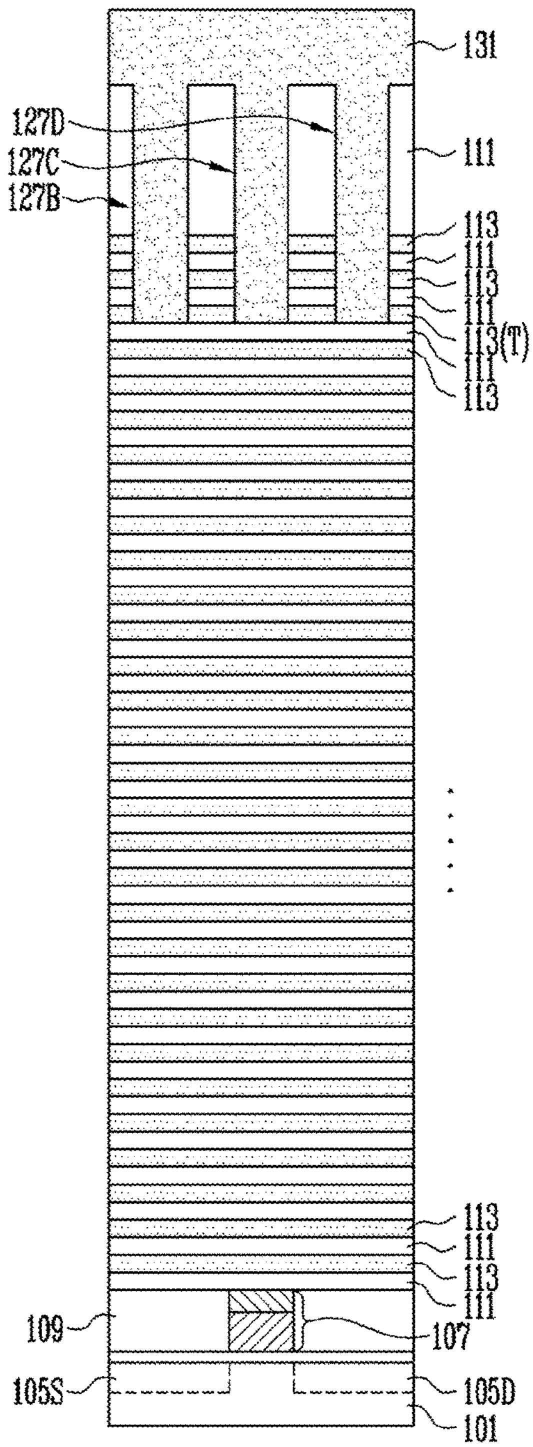

Referring now to FIGS. 5A to 5C, after the dummy mask pattern 125 is removed, a block mask pattern 131 may be formed to open regions in which the first slits 135A and second slits 135B are formed. The block mask pattern 131 may be a photoresist pattern.

Subsequently, using the block mask pattern 131 as an etch barrier, the interlayer insulating layers 111 and the sacrificial insulating layers 113 may be etched. As a result, the first slit 135A and the second slits 135B that pass through the interlayer insulating layers 111 and the sacrificial insulating layers 113 may be formed. The first slit 135A may separate the interlayer insulating layers 111 and the sacrificial insulating layers 113 into units of memory blocks. The second slits 135B may be separated from each other in a region divided by the first slit 135A. The shape and arrangement of the first slit 135A and the second slits 135B may vary.

Referring to FIGS. 6A to 6D, after the block mask pattern 131 is removed, the first slit 135A and the second slits 135B may be filled with the first buried insulating layer 141. The trench 127A and the first to third grooves 127B, 127C, and 127D may be filled with the first buried insulating layer 141. The first buried insulating layer 141 may include an oxide layer.

Subsequently, a recess mask pattern 145 may be formed over the first buried insulating layer 141 to open a region in which the third slits 147 are formed. The recess mask pattern 145 may be a photoresist pattern.

Subsequently, the interlayer insulating layers 111 and the sacrificial insulating layers 113 may be etched using the recess mask pattern 145 as an etch barrier. As a result, the third slits 147 that pass through the interlayer insulating layers 111 and the sacrificial insulating layers 113 may be formed. The third slits 147 may be formed in the contact region and the cell region (not illustrated).

Subsequently, the sacrificial insulating layers 113 exposed through the third slits 147 may be selectively etched to open conductive regions 149. The conductive regions 149 may be opened in spaces between the interlayer insulating layers 111.

Referring now to FIGS. 7A to 7D, the conductive regions 149 may be filled with the conductive patterns CP[1] to CP[k], where k is a natural number greater than or equal to 2. The conductive patterns CP[1] to CP[k] may be formed by filling the conductive regions 149 (see FIG. 6C) with a conductive layer and removing portions of the conductive layer from the third slits 147 (see FIG. 6A) so that the conductive layer may be separated into the conductive patterns CP[1] to CP[k]. The conductive layer may include at least one of polysilicon, a metal layer and a metal silicide layer. For example, the metal layer may include a metal having lower resistance than polysilicon, such as tungsten.

Figure 6A:
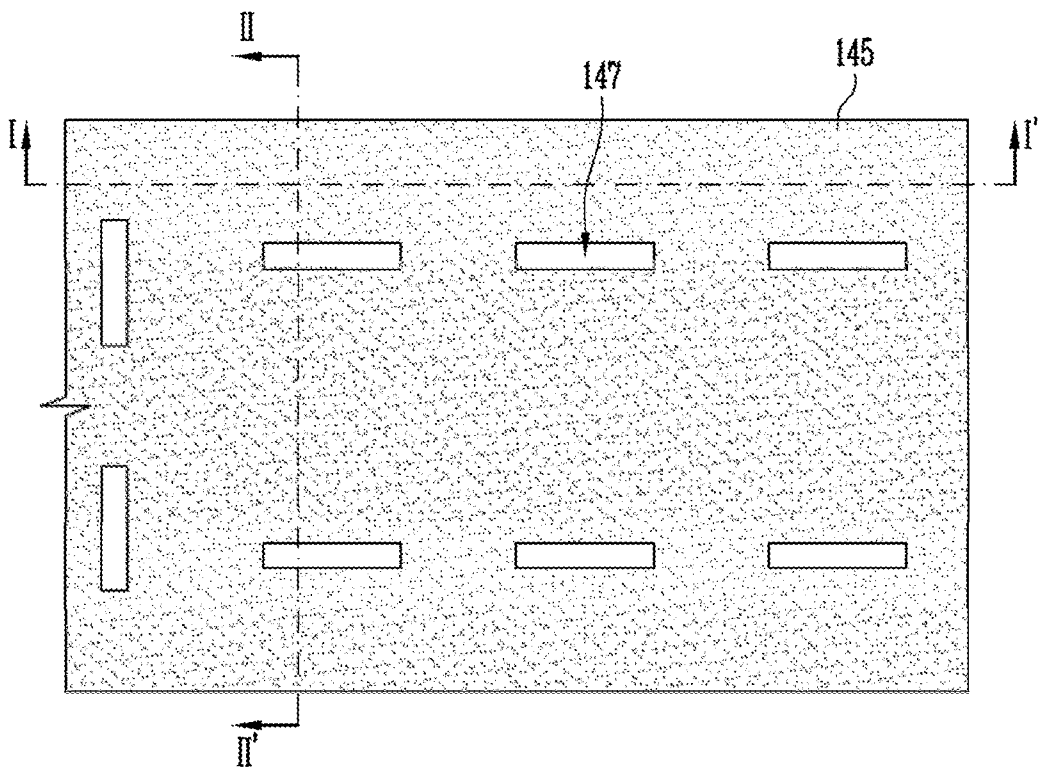
Figure 6B:
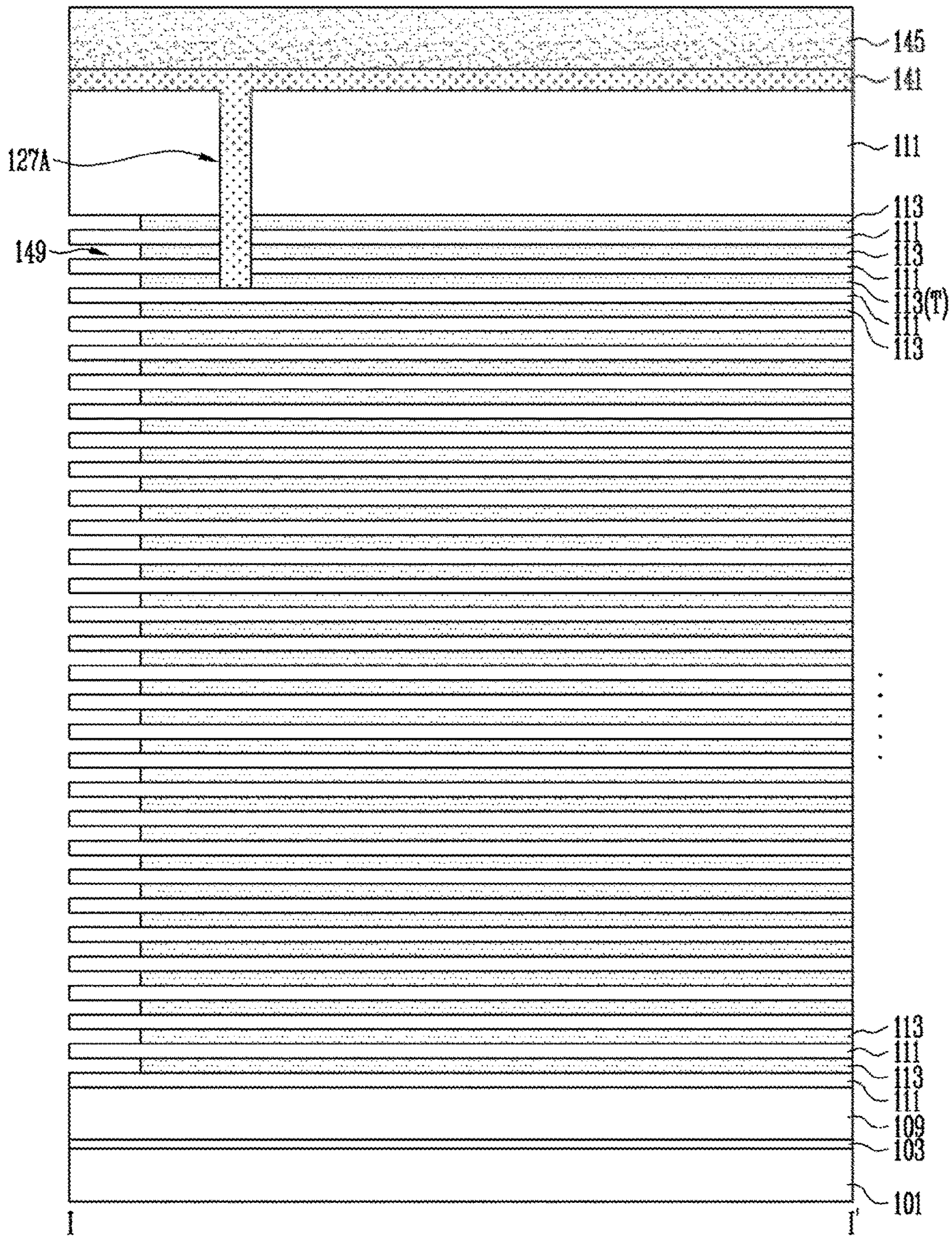
Figure 6C:
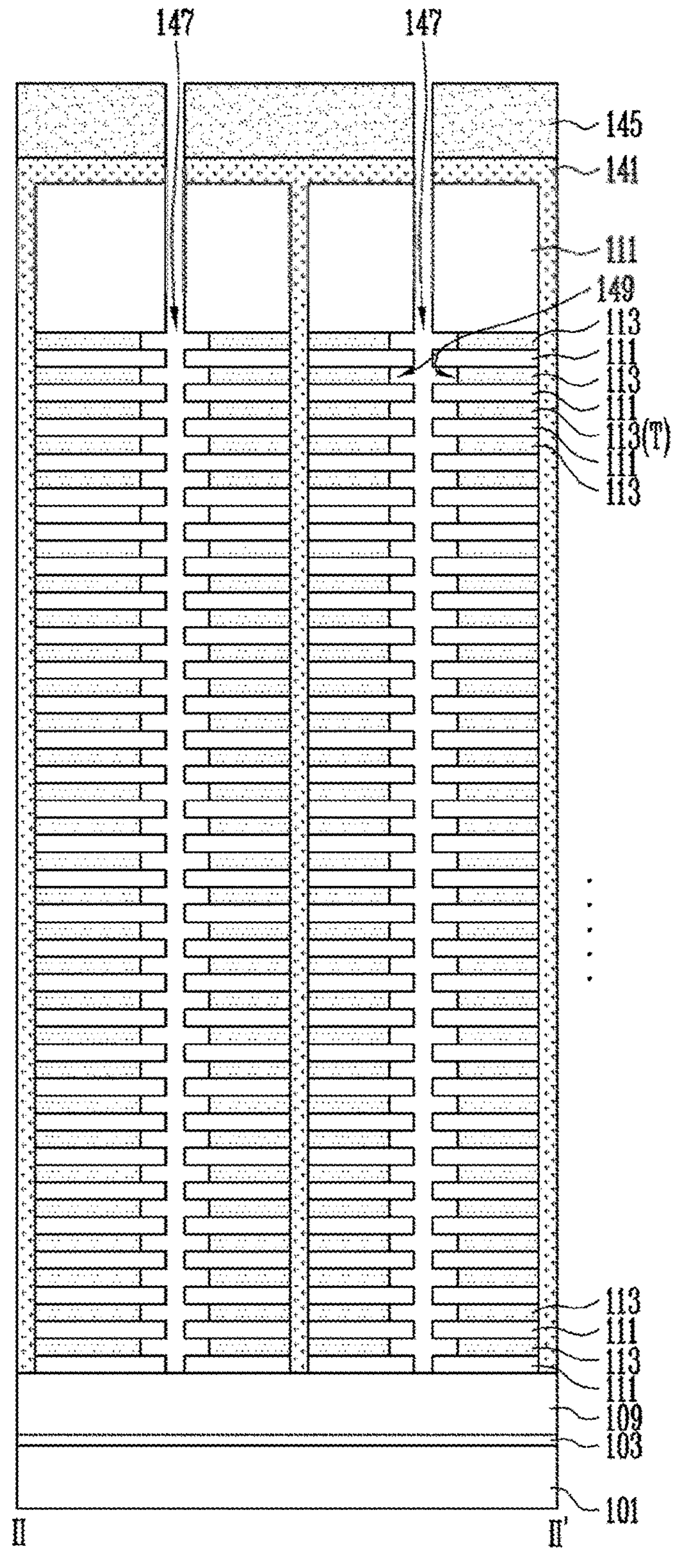
Figure 6D:
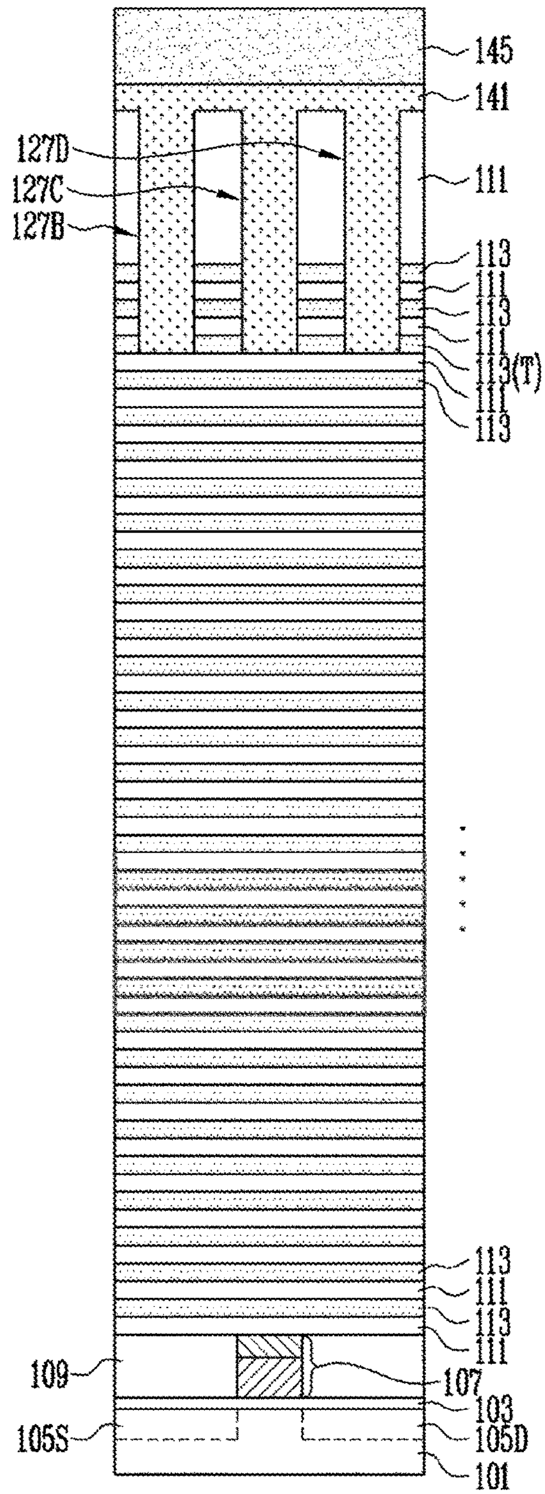
Figure 7A:
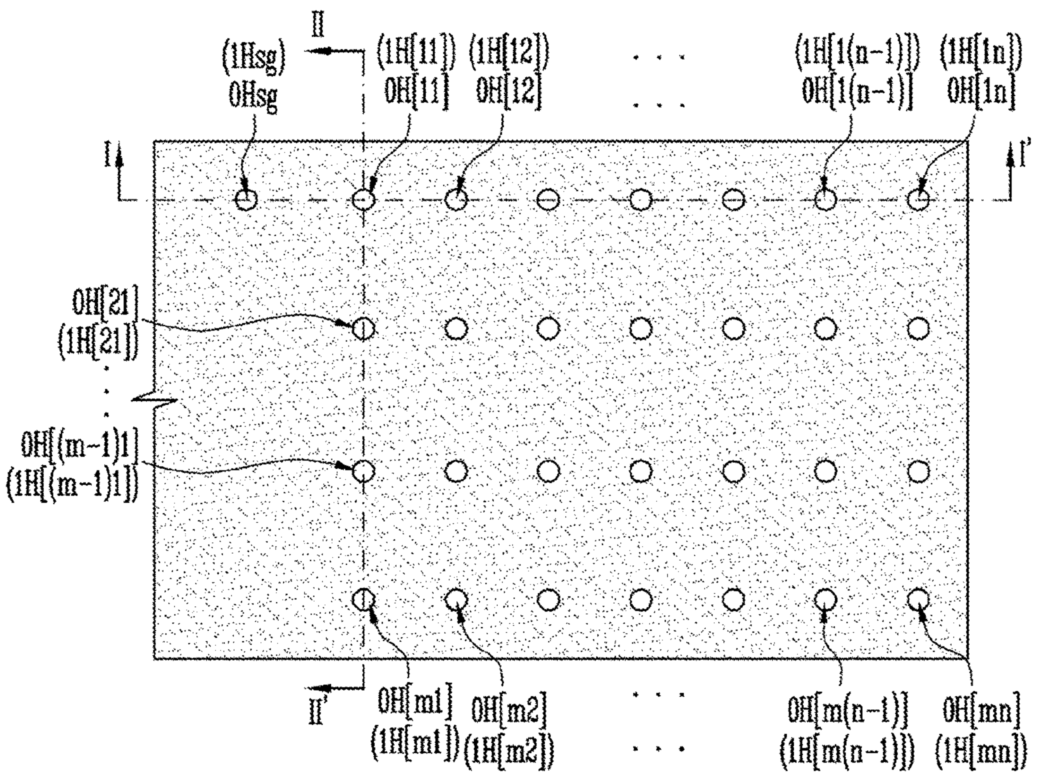
Figure 7B:
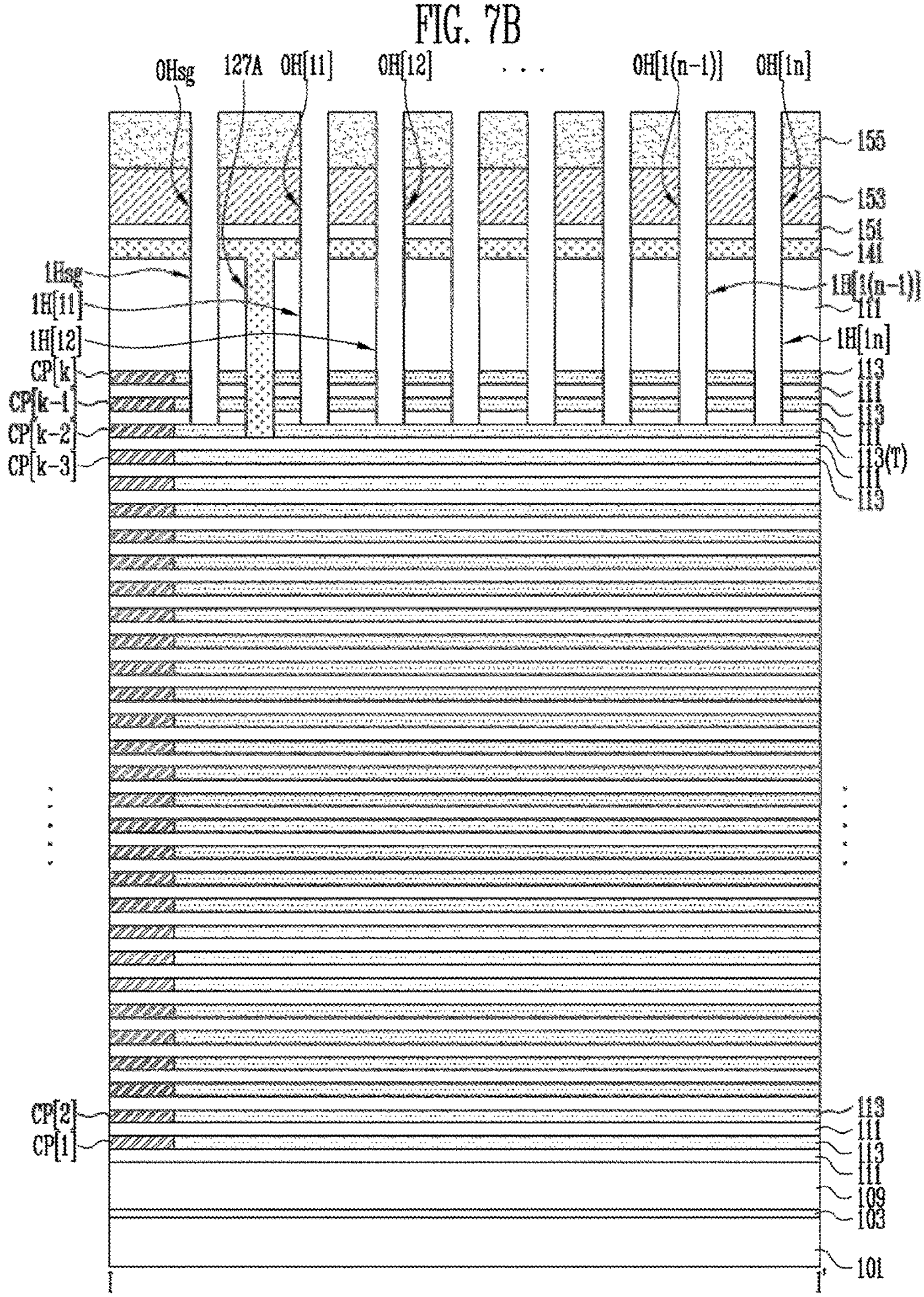
Figure 7C:
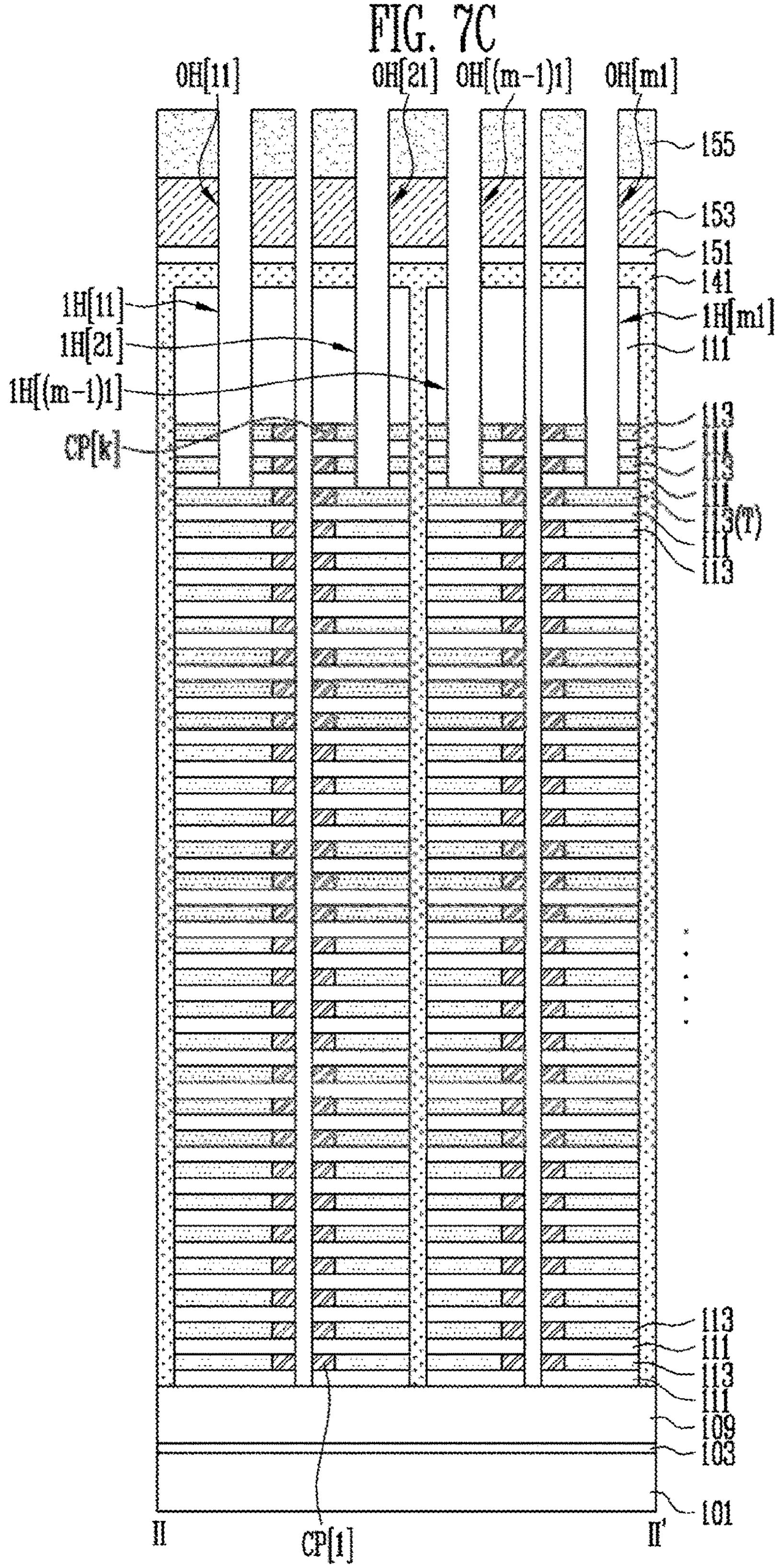
Figure 7D:
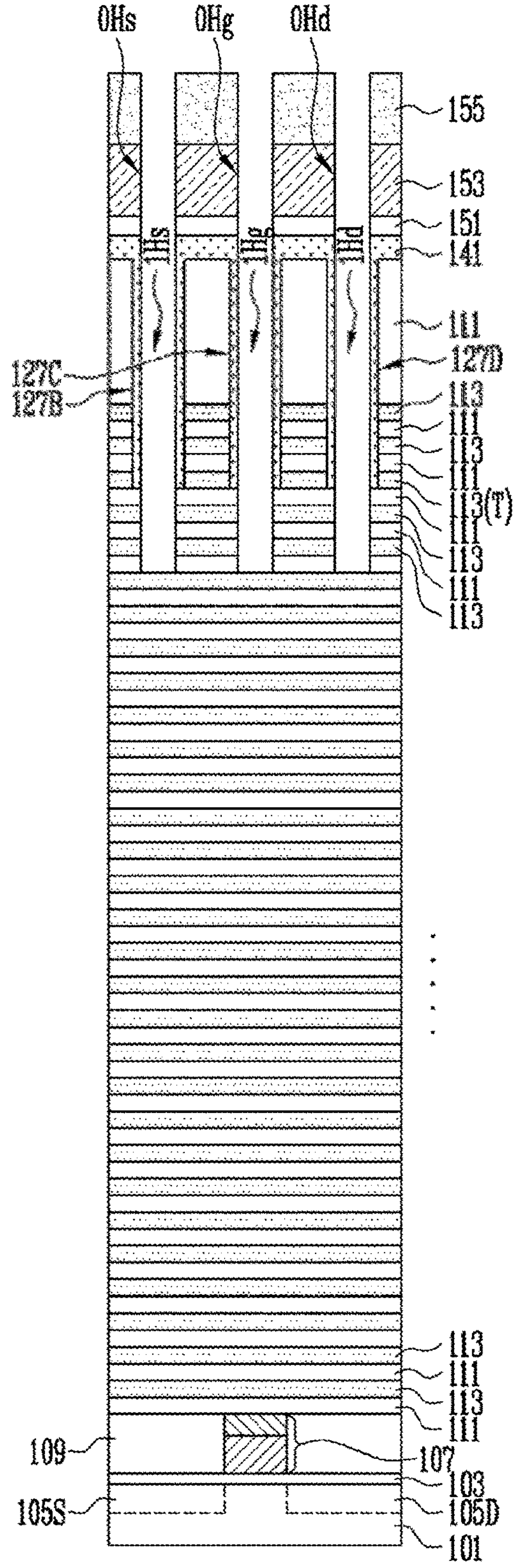

Before the conductive layer is formed, a barrier metal layer (not illustrated) may further be formed on a surface of each of the conductive regions 149 (see FIG. 6C). A portion of the barrier metal layer formed outside each of the conductive regions 149 may be removed by an etching process.

Before the conductive layer or the barrier metal layer is formed, a multilayer film (not illustrated) may be formed on the surface of each of the conductive regions 149. The multilayer film may include at least one of a tunnel insulating layer, a data storage layer, and a blocking insulating layer. The tunnel insulating layer may include, for example, a silicon oxide layer. The data storage layer may include a material layer capable of storing charge. For example, the data storage layer may include a polysilicon layer or a silicon nitride layer. The blocking insulating layer may include at least one of a silicon oxide layer and a high dielectric layer having a higher dielectric constant than the silicon oxide layer. For example, a $Al_2O_3$ layer may be used as the high dielectric layer. A portion of the multilayer film formed outside each of the conductive regions 149 may be removed through an etching process.

After the conductive patterns CP[1] to CP[k] are formed, the third slits 147 (see FIG. 6A) may be filled with the second buried insulating layer 151. The second buried insulating layer 151 may include an oxide layer.

A first contact mask pattern 153 including first opening holes OH[11] to OH[mn], a second opening hole OHsg, and third opening holes OHs, OHg, and OHd may be formed on the second buried insulating layer 151. The first contact mask pattern 153 may include a material having an etch selectivity with respect to the interlayer insulating layers 111 and the sacrificial insulating layers 113. For example, the first contact mask pattern 153 may include polysilicon or TiN. The first contact mask pattern 153 may be formed by sequentially forming a first contact mask layer and a photoresist pattern 155, and then etching the first contact mask layer by using the photoresist pattern 155 as an etch barrier. The first opening holes OH[11] to OH[mn] may open a region in which cell contact plugs may be formed. A region in which a select contact plug is formed may be opened through the second opening hole OHsg. A region in which peripheral contact plugs are formed may be opened through the third opening holes OHs, OHg, and OHd. The first opening holes OH[11] to OH[mn] may be arranged in a matrix format having m rows and n columns, where m and n are natural numbers greater than or equal to 2. A layout of the first contact mask pattern 153 may be defined so that the trench 127A (see also FIG. 1A) may be aligned between the second opening hole OHsg and the first opening holes OH[11] to OH[mn].

Subsequently, portions of the interlayer insulating layers 111 and the sacrificial insulating layers 113 may be etched by using the first contact mask pattern 153 including the first opening holes OH[11] to OH[mn], the second opening hole OHsg and the third opening holes OHs, OHg, and OHd as an etch barrier until a top surface of the target sacrificial insulating layer T is exposed in the contact region. As a result, a first contact hole group (1Hsg, 1H[11] to 1H[mn], 1Hs, 1Hg, and 1Hd) may be formed. The first contact hole group may include a select contact hole 1Hsg, a dummy contact hole 1H[11], first preliminary cell contact holes 1H[12] to 1H[mn] and first preliminary peripheral contact holes 1Hs, 1Hg, and 1Hd. The select contact hole 1Hsg may be separated from the dummy contact hole 1H[11] and the first preliminary cell contact holes 1H[12] to 1H[mn] with the trench 127A interposed therebetween. The dummy contact hole 1H[11] and the first preliminary cell contact holes 1H[12] to 1H[mn] may be arranged in a matrix having m rows and n columns. The dummy contact hole 1H[11] may be arranged in the first row and column of the matrix. The first preliminary peripheral contact holes 1Hs, 1Hg, and 1Hd may pass through the first buried insulating layer 141 formed in the first to third grooves 127B, 127C, and 127D and portions of the interlayer insulating layers 111 and the sacrificial insulating layers 113 located under the first buried insulating layer 141. Since the first preliminary peripheral contact holes 1Hs, 1Hg, and 1Hd are arranged in the first to third grooves 127B, 127C, and 127D formed in the previous processes, the first preliminary peripheral contact holes 1Hs, 1Hg, and 1Hd may be deeper than the select contact hole 1Hsg, the dummy contact hole 1H[11], and the first preliminary cell contact holes 1H[12] to 1H[mn]. Therefore, a top surface of the sacrificial insulating layer arranged under the target sacrificial insulating layer T may be opened through the first preliminary peripheral contact holes 1Hs, 1Hg, and 1Hd.

Figure 8A:
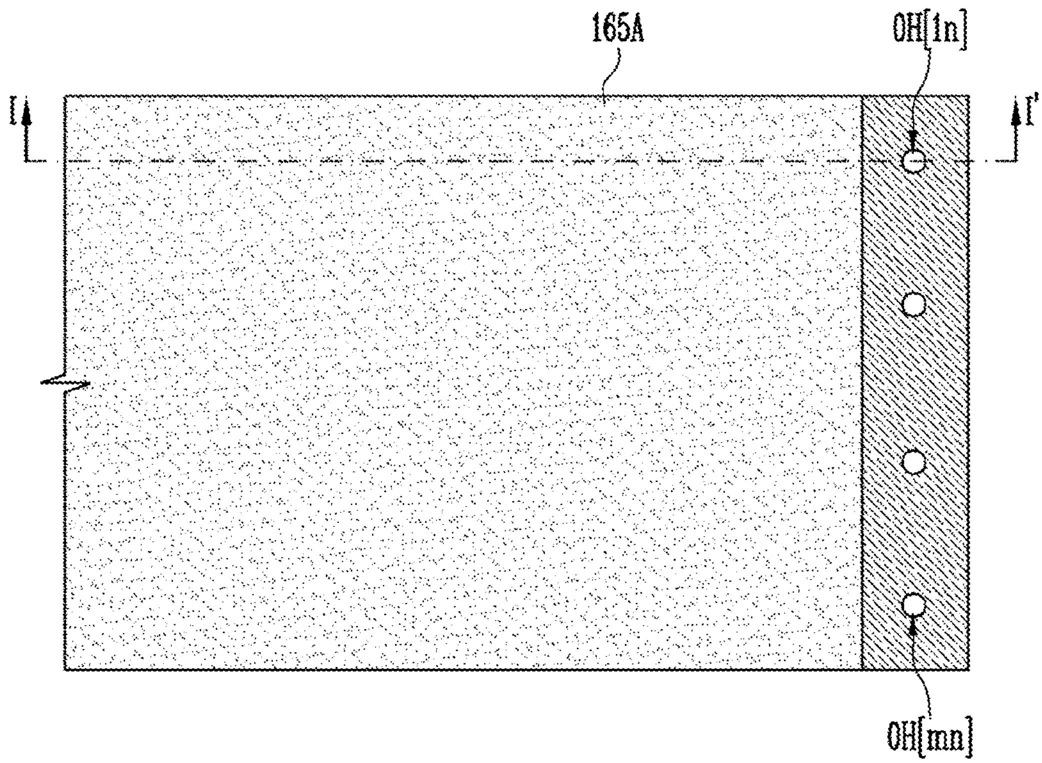
Figure 8B:
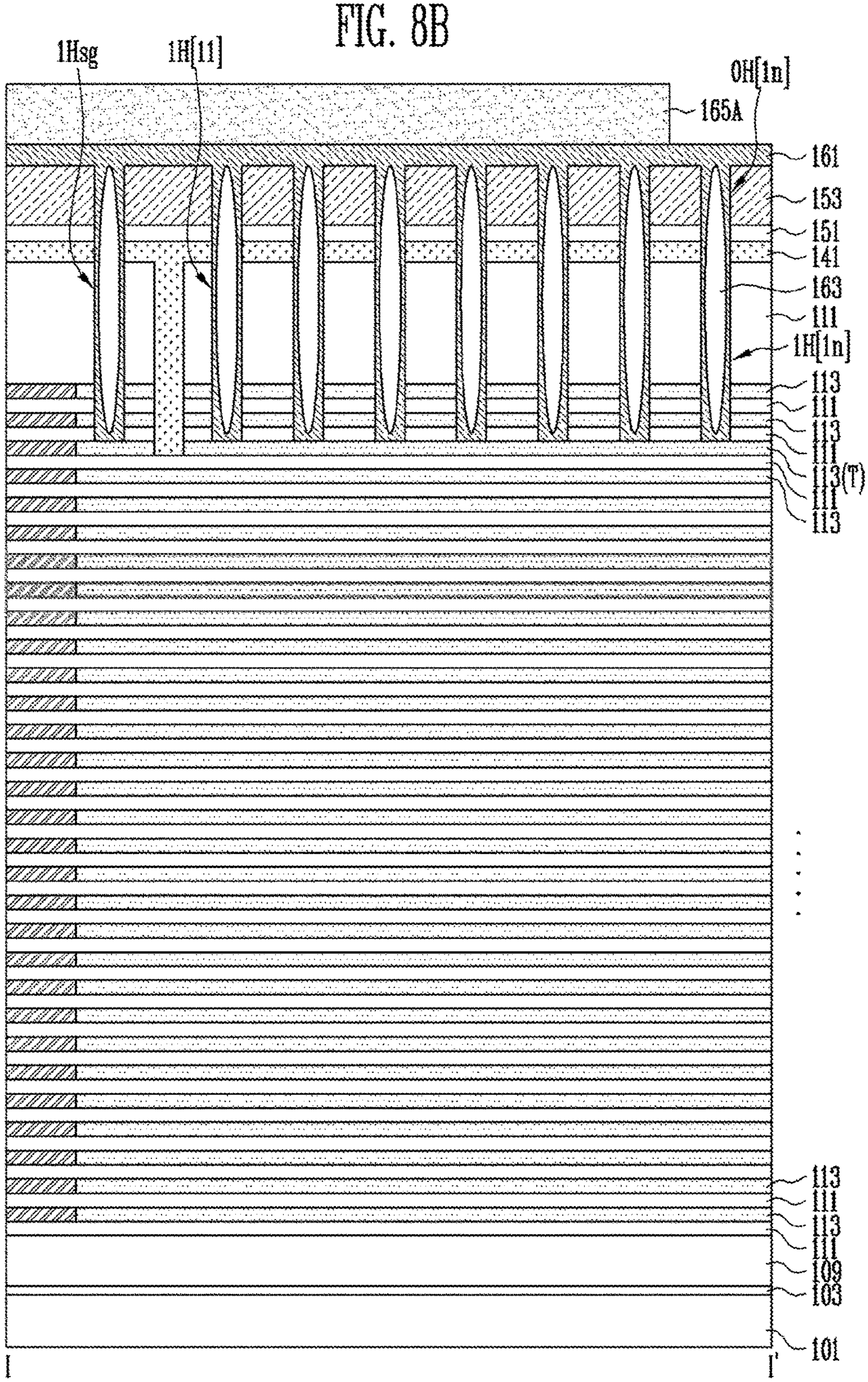
Figure 8C:
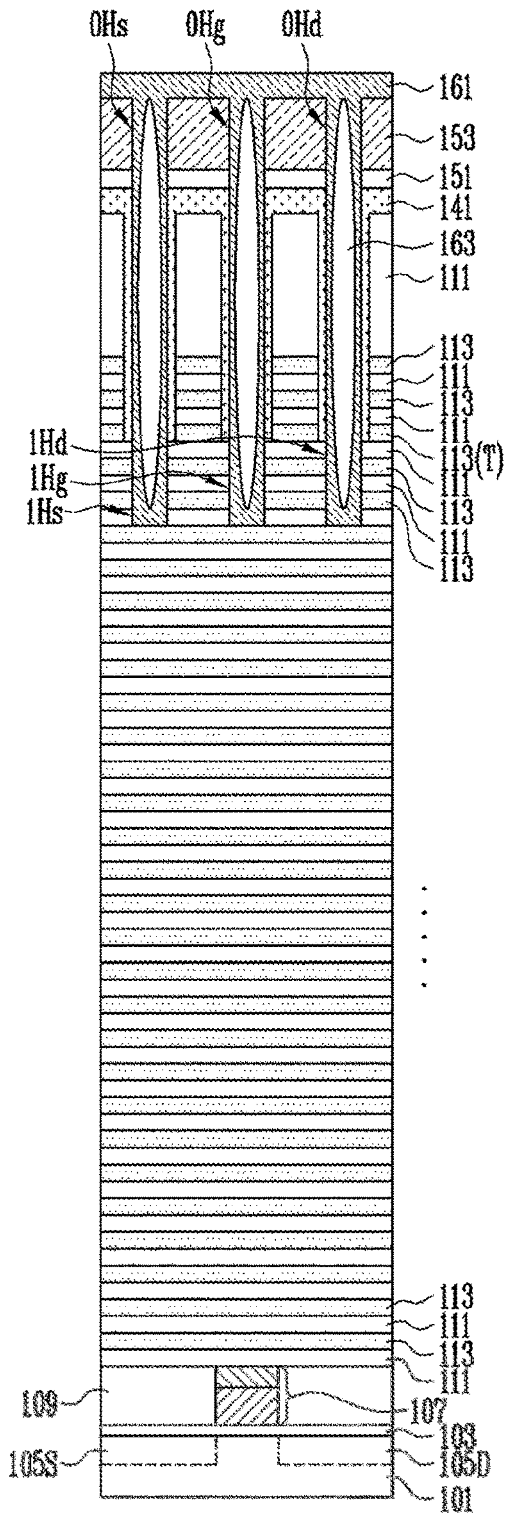

Referring now to FIGS. 8A to 8C, after the photoresist pattern 155 is removed (see FIG. 7B), a second contact mask pattern 165A having a first shape may be formed over the first contact mask pattern 153. The second contact mask pattern 165A having the first shape may be a photoresist pattern.

Before the second contact mask pattern 165A having the first shape is formed, a first gap-filling layer 161 may be further formed. The first gap-filling layer 161 may be formed below the second contact mask pattern 165A. The first gap-filling layer 161 may include a material layer having bad step coverage characteristics so that first air gaps 163 (or gaps filled with gases except air, or gaps filled with gases including air, or gaps emptied of all gases inside) may be formed in the first opening holes OH[11] to OH[mn], the second opening hole OHsg, the third opening holes OHs, OHg, and OHd, and the first contact hole group (1Hsg, 1H[11] to 1H[mn], 1Hs, 1Hg, and 1Hd). For example, the first gap-filling layer 161 may include, for example, an amorphous carbon layer or resin. When the first air gaps 163 are formed in the first gap-filling layer 161, the first opening holes OH[11] to OH[mn], the second opening hole OHsg and the third opening holes OHs, OHg, and OHd may be more easily opened during a subsequent etching process. However, the first opening holes OH[11] to OH[mn], the second opening hole OHsg, the third opening holes OHs, OHg, and OHd, and the first contact hole group (1Hsg, 1H[11] to 1H[mn], 1Hs, 1Hg, and 1Hd) may be completely filled or substantially completely filled with the first gap-filling layer 161 so that air gaps or other gaps (i.e., gaps filled with gases except air, or gaps filled with gases including air, or gaps emptied of all gases inside) may not be formed in the first gap-filling layer 161.

The second contact mask pattern 165A having the first shape may be patterned to open the first opening holes OH[1*n*] to OH[mn] in an n-th column, among the first opening holes OH[11] to OH[mn], and block the first opening holes OH[11] to OH[m(n−1)] in the first to (n−1)-th column. In addition, the second contact mask pattern 165A having the first shape may be patterned to block the second opening hole OHsg and open the third opening holes OHs, OHg, and OHd.

Figure 9A:
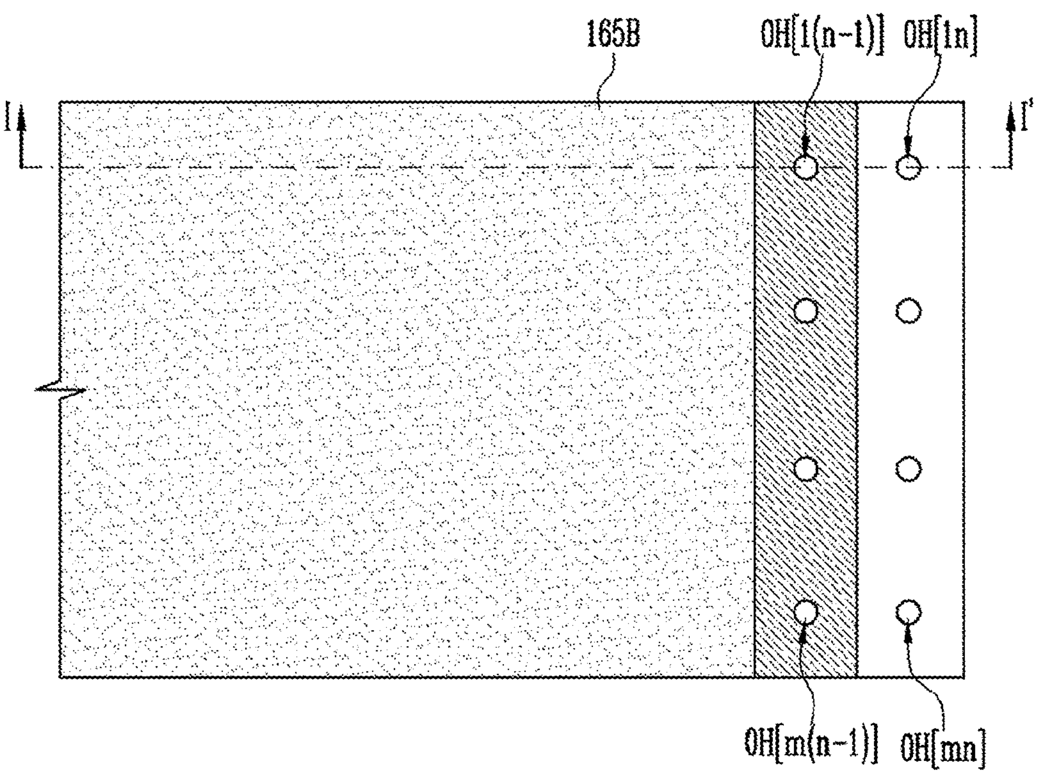
Figure 9B:
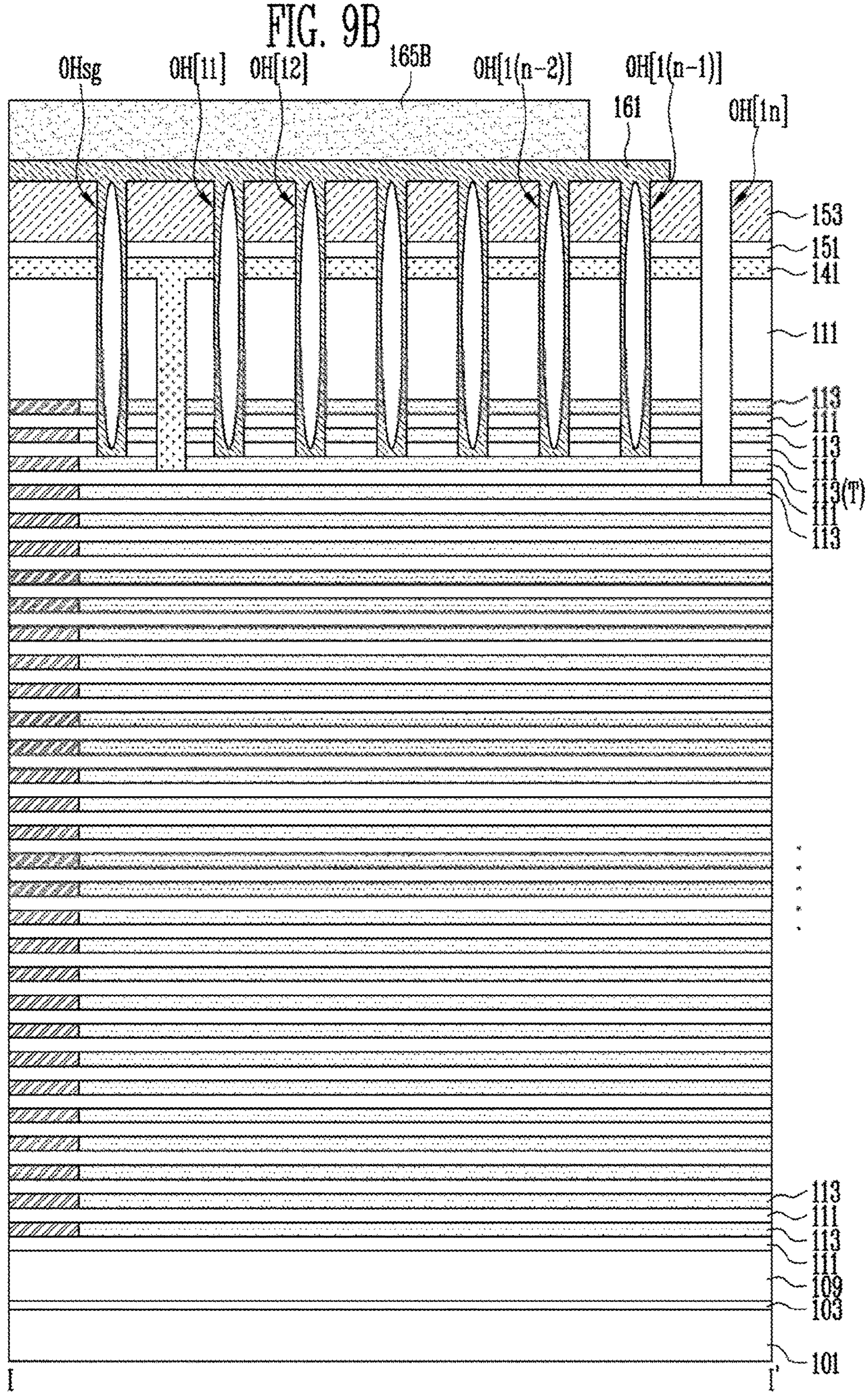
Figure 9C:
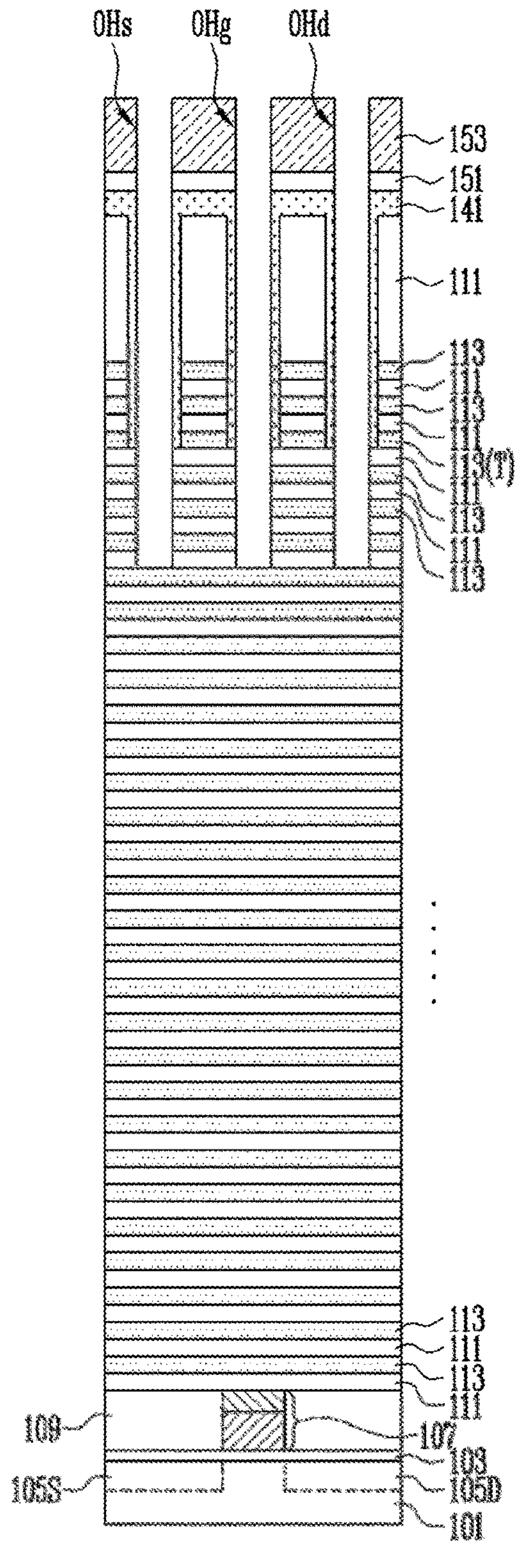

Referring now to FIGS. 9A to 9C, the first gap-filling layer 161, the target sacrificial insulating layer T, and the interlayer insulating layer under the target sacrificial insulating layer T, among the interlayer insulating layers 111, which are exposed through the first opening holes OH[1*n*] to OH[mn] in the n-th column, may be etched by using the second contact mask pattern 165A (see FIG. 8B) having the first shape as an etch barrier. In the peripheral region, the first gap-filling layer 161 (see FIG. 8C), a single interlayer insulating layer and a single sacrificial insulating layer, which are exposed through the third opening holes OHs, OHg, and OHd, may be etched.

Subsequently, the second contact mask pattern 165A having the first shape may be etched to form a second contact mask pattern 165B having a second shape in order to further open the first opening holes OH[1(n−1)] to OH[m(n−1)] in the (n−1)-th column. The second contact mask pattern 165B having the second shape may open the first opening holes OH[1*n*] to OH[mn] in the n-th column and the first opening holes OH[1(n−1)] to OH[m(n−1)]) in the (n−1)-th column and block the first opening holes OH[11] to OH[m(n−2)]. In addition, the second contact mask pattern 165B having the second shape may block the second opening hole OHsg and open the third opening holes OHs, OHg, and OHd.

Figure 10A:
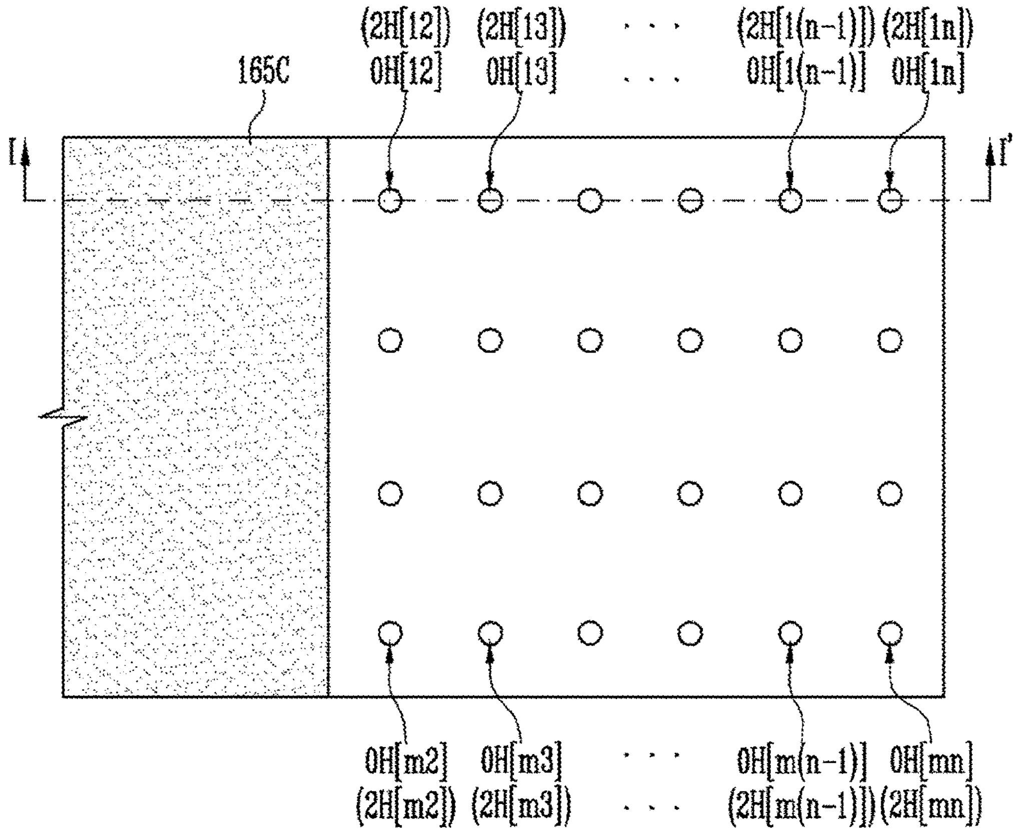
Figure 10B:
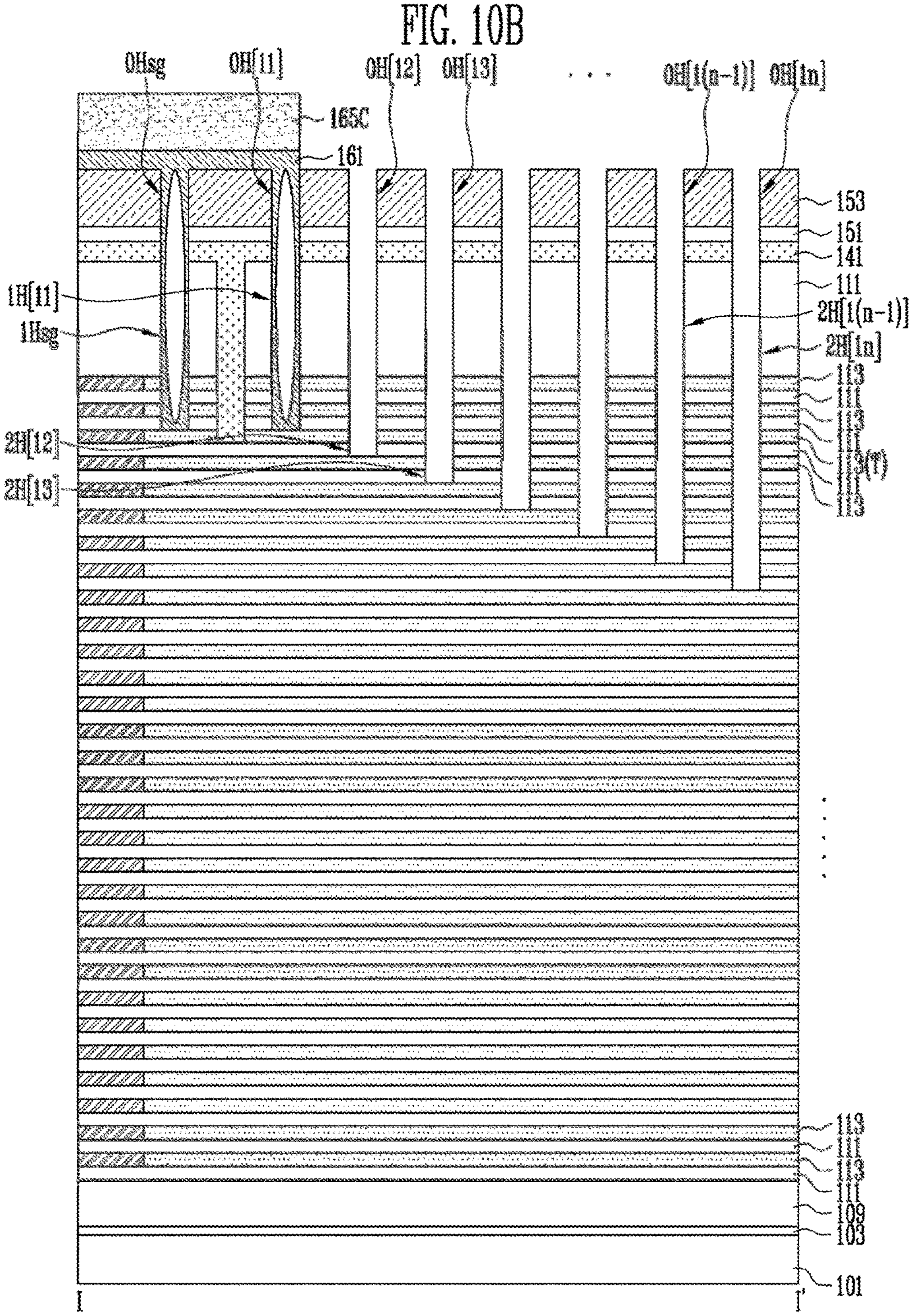
Figure 10C:
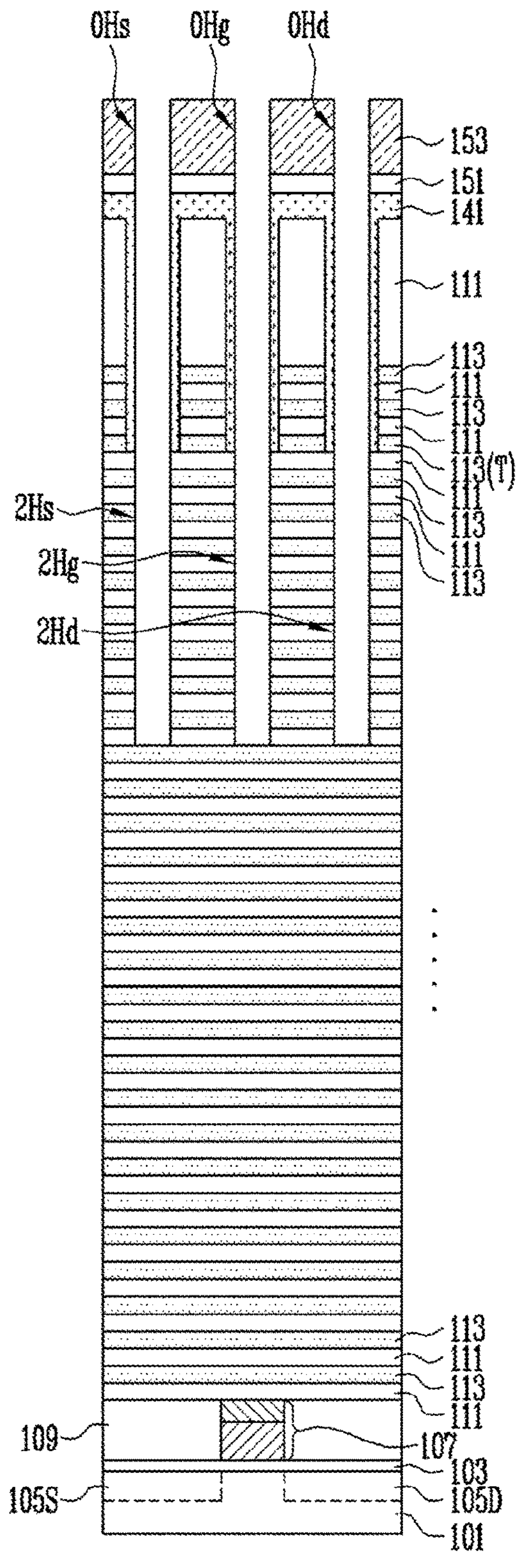

Referring now to FIGS. 10A to 10C, the first gap-filling layer 161, a single sacrificial insulating layer and a single interlayer insulating layer, which are exposed through the first opening holes OH[1*n*] to OH[mn] in the n-th column, the first opening holes (OH[1(n−1)] to OH[m(n−1)]) in the (n−1)-th column and the third opening holes OHs, OHg, and OHd, may be etched by using the second contact mask pattern 165B (see FIG. 9B) having the second shape as an etch barrier.

Subsequently, an etching process of the sacrificial insulating layer and the interlayer insulating layer by using a second contact mask pattern 165C having a smaller size than the second contact mask pattern 165B as an etch barrier may be repeated until a second contact hole group (2H[12] to 2H[mn], 2Hs, 2Hg, and 2Hd) is formed.

In other words, the etching process of the sacrificial insulating layers and the interlayer insulating layers by using the second contact mask pattern 165A, 165B or 165C as an etch barrier may be repeated (n−1) times until the second contact hole group (2H[12] to 2H[mn], 2Hs, 2Hg, and 2Hd) is formed. The etching process of reducing the size of the second contact mask pattern 165A or 165B may be performed each time before the etching process of the sacrificial insulating layers and the interlayer insulating layers is performed. The etching process for reducing the size of the second contact mask pattern 165A or 165B may be performed to open another column of the first opening holes OH[11] to OH[mn].

The second contact hole group may include second preliminary cell contact holes 2H[22] to 2H[mn], second preliminary peripheral contact holes 2Hs, 2Hg, and 2Hd and cell contact holes 2H[12] to 2H[1*n*] in the first row. The cell contact holes 2H[12] to 2H[1*n*] in the first row may open the sacrificial insulating layers from the sacrificial insulating layer down one layer from the target sacrificial insulating layer T, among the sacrificial insulating layers 113, to the n-th sacrificial insulating layer from the target sacrificial insulating layer T. In other words, the cell contact holes 2H[12] to 2H[1*n*] in the first row may open (n−1) sacrificial insulating layers under the target sacrificial insulating layer T. The second preliminary cell contact holes 2H[21] to 2H[mn] arranged in the same column as the cell contact holes 2H[12] to 2H[1*n*] in the first row may have the same height as the cell contact holes 2H[12] to 2H[1*n*] in the first row. The second preliminary peripheral contact holes 2Hs, 2Hg, and 2Hd may be deeper than the second preliminary cell contact holes 2H[22] to 2H[mn]) and the cell contact holes 2H[12] to 2H[1*n*] in the first row.

While the second contact hole group (2H[12] to 2H[mn], 2Hs, 2Hg, and 2Hd) is formed, the heights of the select contact hole 1Hsg, the dummy contact hole 1H[11], and the first preliminary cell contact holes 1H[21] to 1H[m1] in the first column as described above with reference to FIGS. 7A to 7D may be maintained.

Figure 11A:
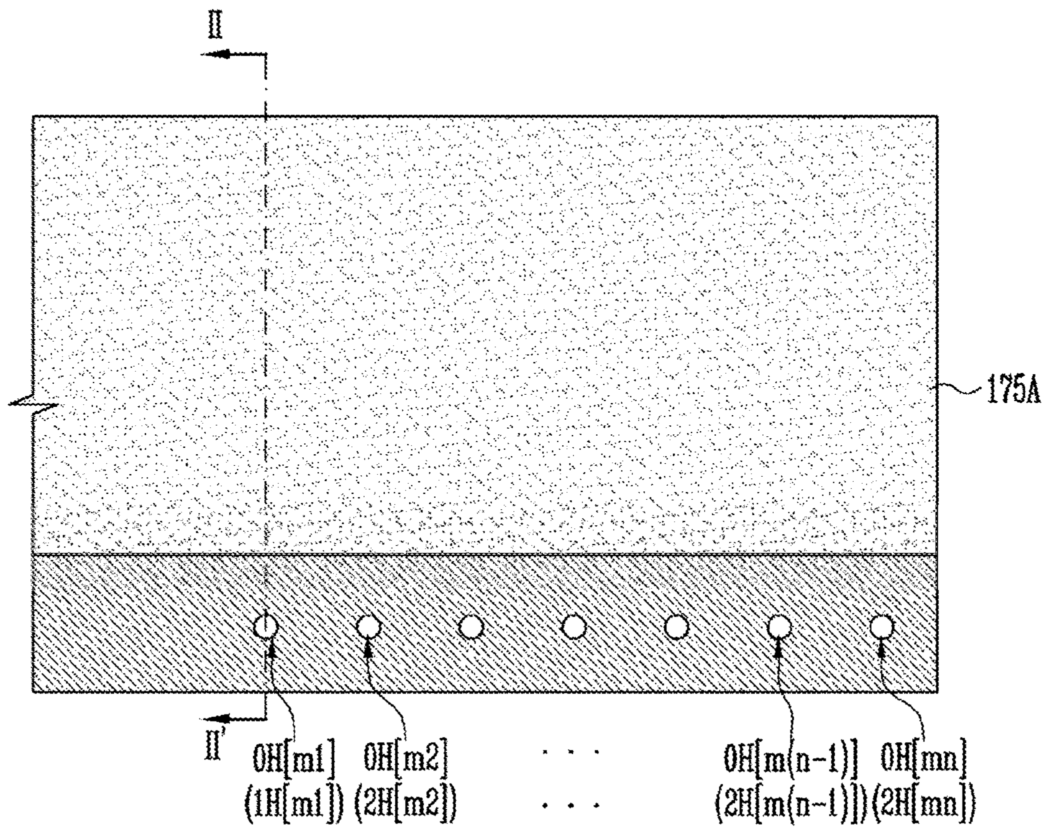
Figure 11B:
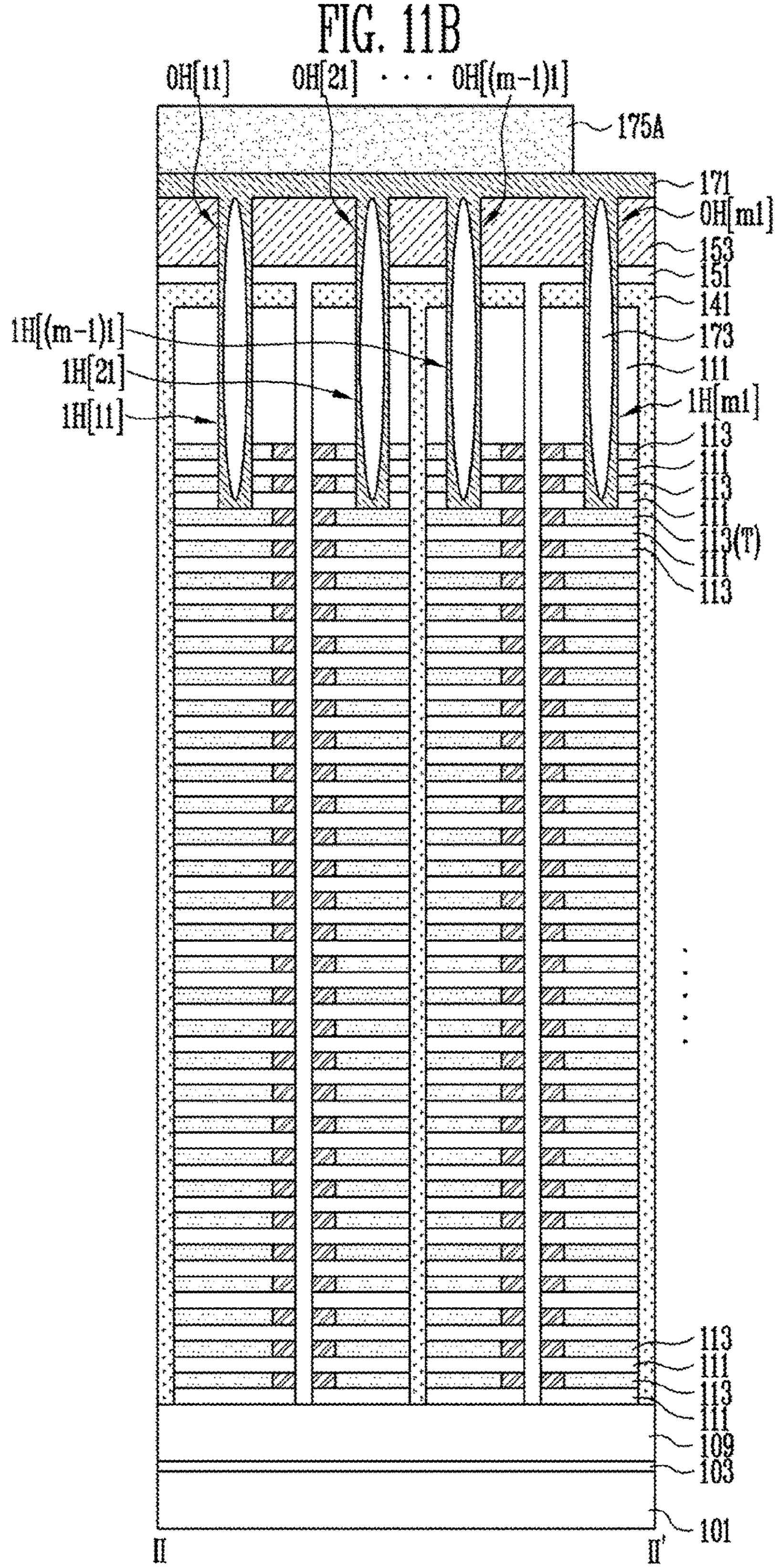
Figure 11C:
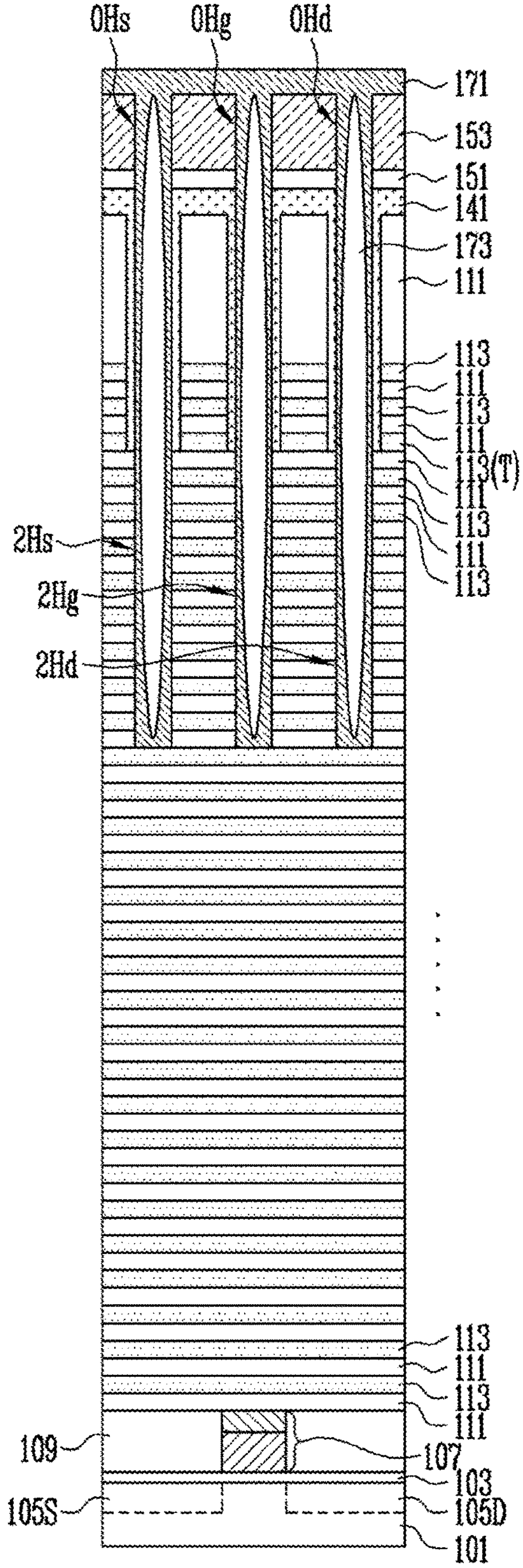

Referring now to FIGS. 11A to 11C, after the second contact mask pattern 165C (see FIG. 10B) and first gap-filling layer 161 (see FIG. 10B) is removed, a third contact mask pattern 175A having a first shape may be formed over the first contact mask pattern 153. The third contact mask pattern 175A having the first shape may be a photoresist pattern.

Before the third contact mask pattern 175A having the first shape is formed, a second gap-filling layer 171 may be further formed. The second gap-filling layer 171 may be formed below the third contact mask pattern 175A. The second gap-filling layer 171 may include a material layer having bad step coverage characteristics so that second air gaps 173 (or gaps filled with gases except air, or gaps filled with gases including air, or gaps emptied of all gases inside) may be formed in the first opening holes OH[11] to OH[mn], the second opening hole OHsg (see FIG. 10B) and the third opening holes OHs, OHg, and OHd and the contact holes 1Hsg, 1H[11] to 1H[m1], 2H[12] to 2H[mn], 2Hs, 2Hg, and 2Hd formed thereunder. For example, the second gap-filling layer 171 may include, for example, an amorphous carbon layer or resin. When the second air gaps 173 are formed in the second gap-filling layer 171, the first opening holes OH[11] to OH[mn], the second opening hole OHsg and the third opening holes OHs, OHg, and OHd may be more easily opened in a subsequent etching process. However, the first opening holes OH[11] to OH[mn], the second opening hole OHsg and the third opening holes OHs, OHg, and OHd and the contact holes 1Hsg, 1H[11] to 1H[m1], 2H[12] to 2H[mn], 2Hs, 2Hg, and 2Hd formed thereunder may be completely filled or substantially completely filled with the second gap-filling layer 171 so as not to form air gaps or other gaps (i.e., gaps filled with gases except air, or gaps filled with gases including air, or gaps emptied of all gases inside) therein.

The third contact mask pattern 175A having the first shape may be patterned to open the first opening holes OH[m1] to OH[mn]) in an m-th row, among the first opening holes OH[11] to OH[mn], and block the first opening holes OH[11] to OH[(m−1)n] in the remaining first to (m−1)-th rows. In addition, the first shape third contact mask pattern 175A may block the second opening hole OHsg and open the third opening holes OHs, OHg, and OHd.

Figure 12A:
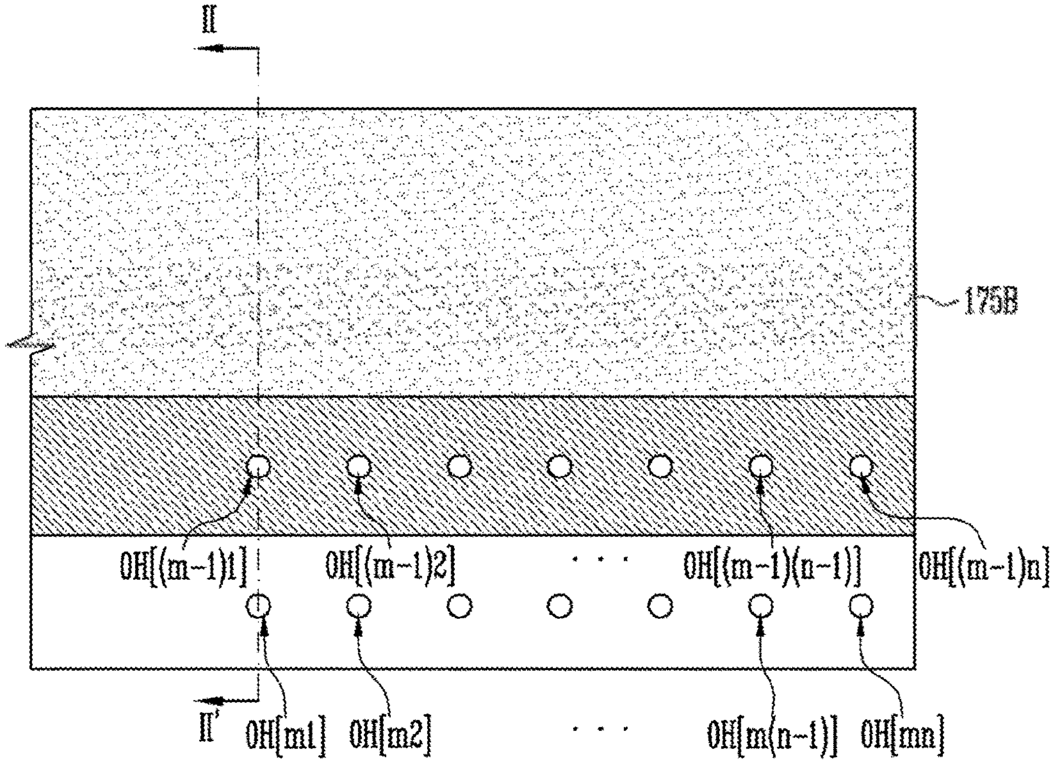
Figure 12B:
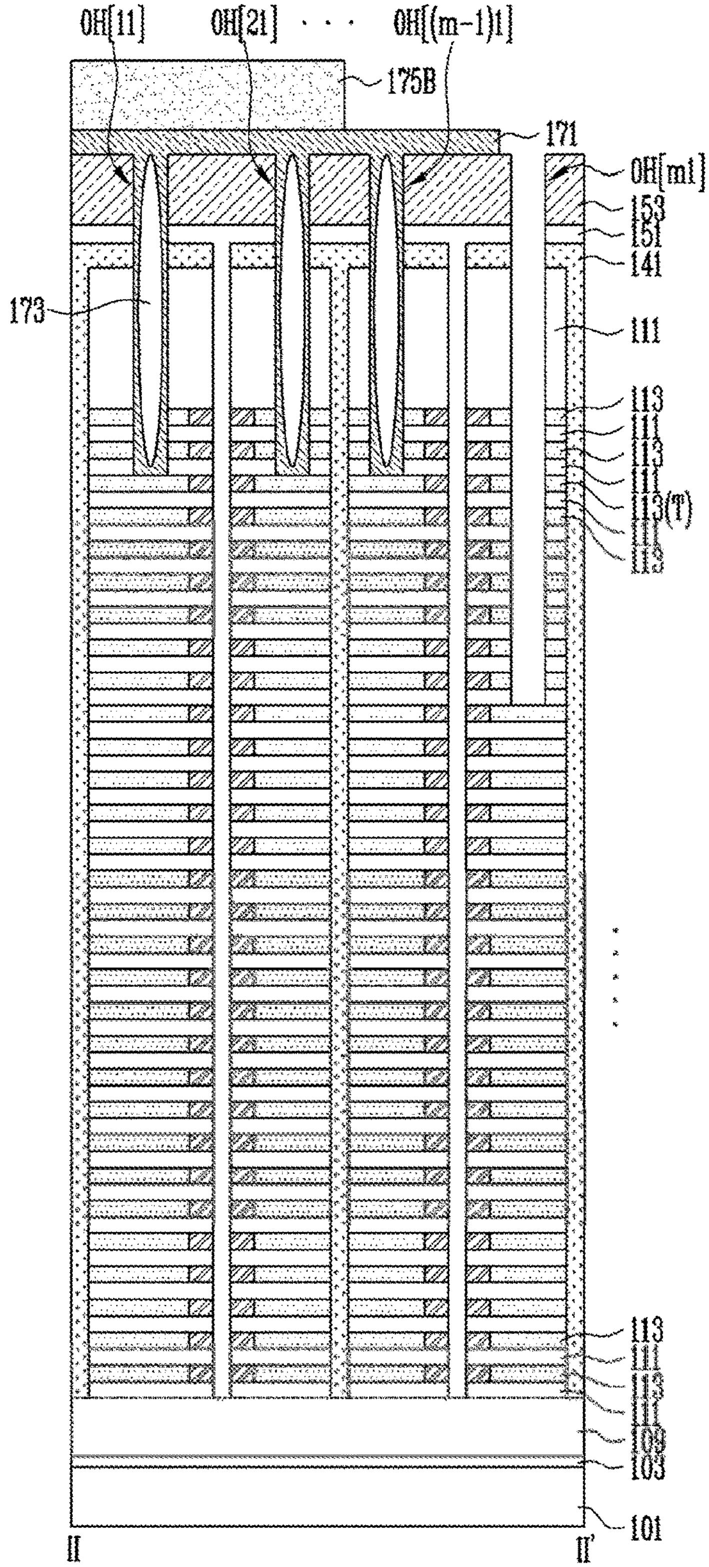
Figure 12C:
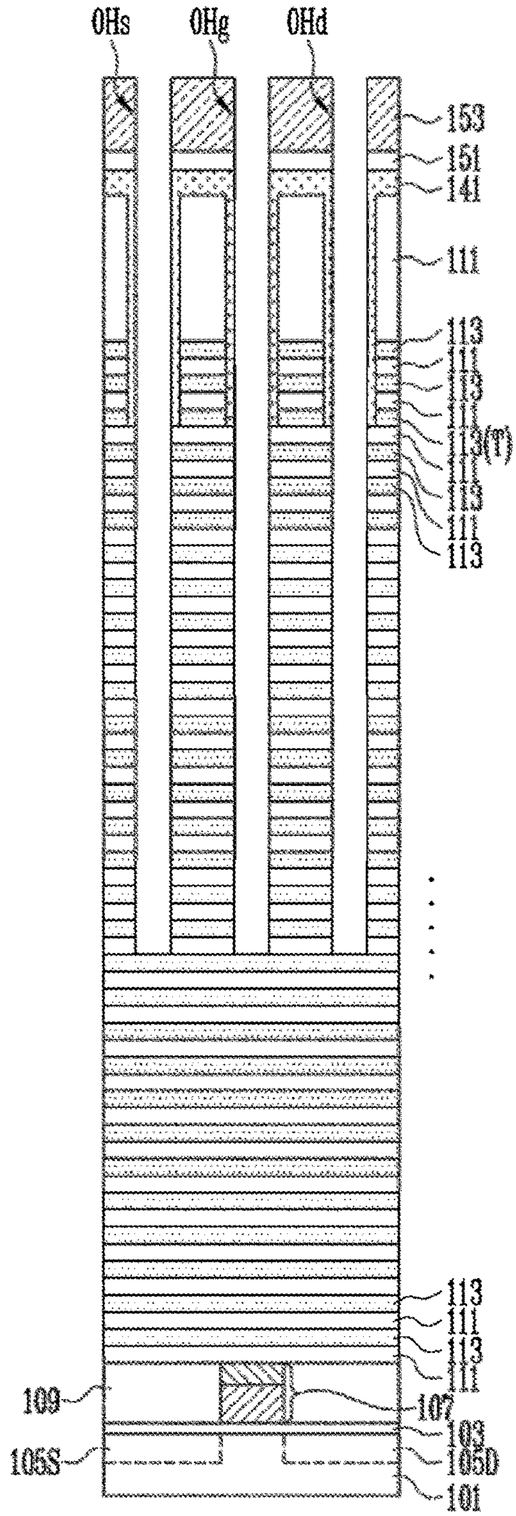

Referring now to FIGS. 12A to 12C, the second gap-filling layer 171, m interlayer insulating layers and m sacrificial insulating layers, which are exposed through the first opening holes OH[m1] to OH[mn] in the m-th row, may be etched by using a second contact mask pattern 175B having a first shape as an etch barrier. The second gap-filling layer 171 exposed through the third opening holes OHs, OHg, and OHd, m interlayer insulating layers and m sacrificial insulating layers in the peripheral region may be etched.

Subsequently, a second shape third contact mask pattern 175B may be formed by etching the third contact mask pattern 175A having the first shape so that the first opening holes (OH[(m−1)1] to OH[(m−1)n] in the (m−1)-th row may be further opened. The third contact mask pattern 175B having a second shape may be patterned to open the first opening holes OH[m1] to OH[mn] in the m-th row and the first opening holes OH[(m−1)1] to OH[(m−1)n] in the (m−1)-th row and block the remaining first opening holes OH[11] to OH[(m−2)n. In addition, the third contact mask pattern 175B having the second shape may block the second opening hole OHsg and open the third opening holes OHs, OHg, and OHd.

Figure 13A:
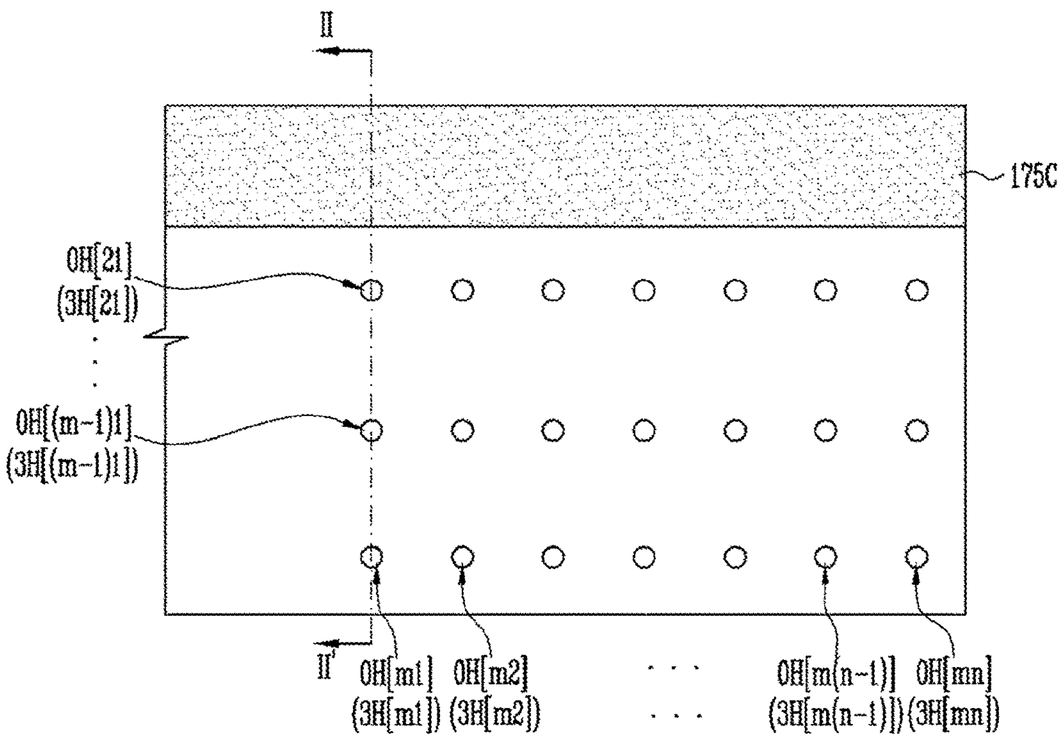
Figure 13B:
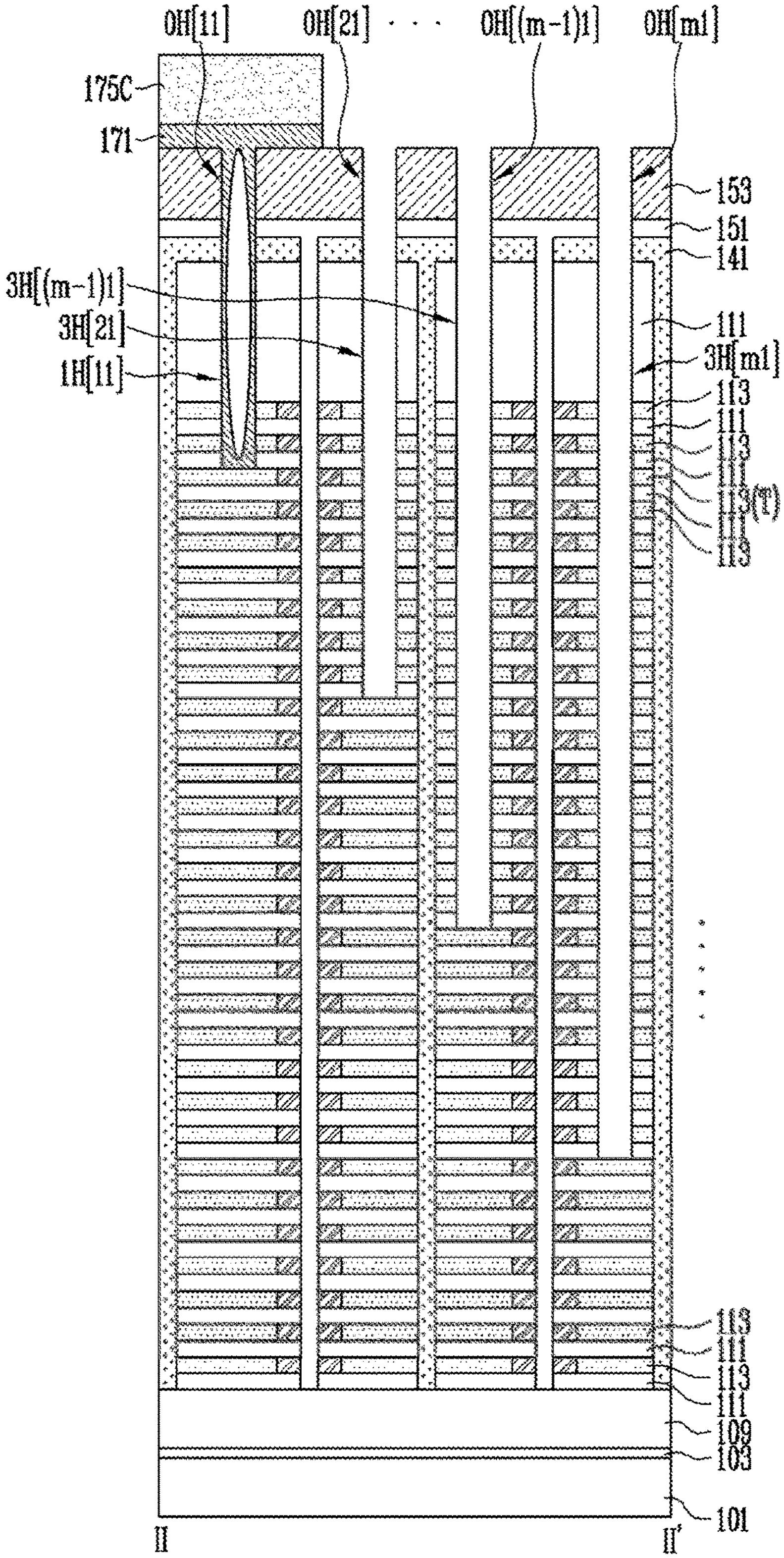
Figure 13C:
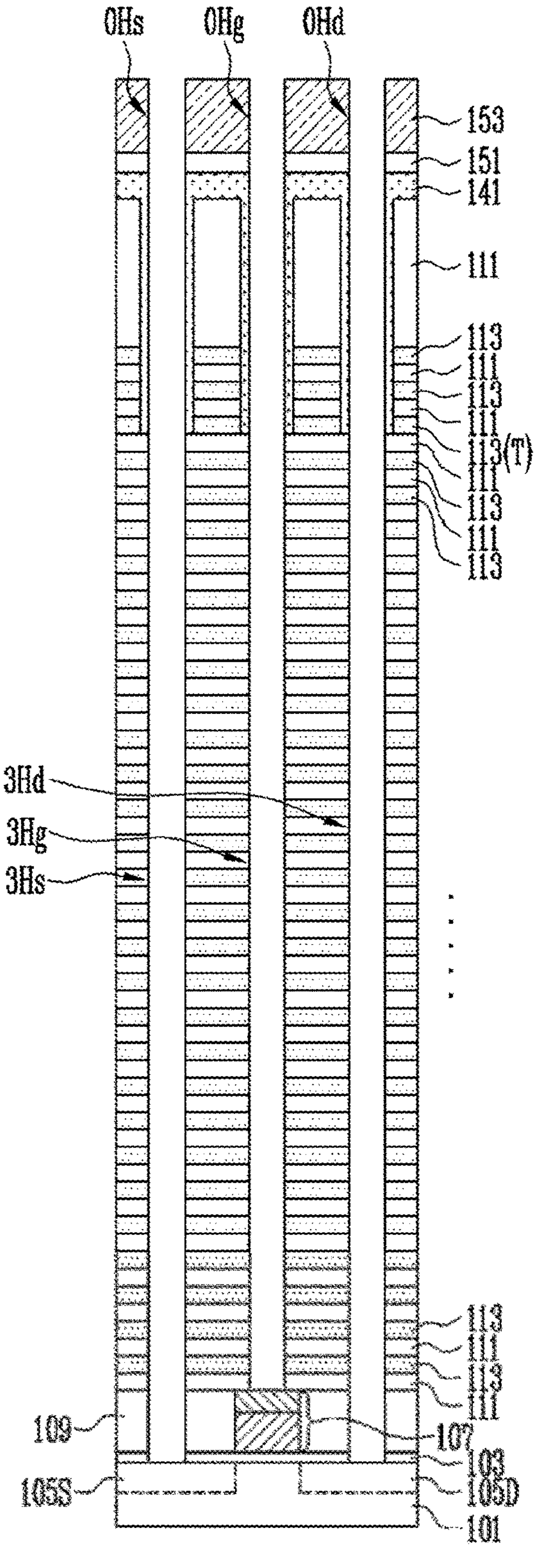
Figure 14A:
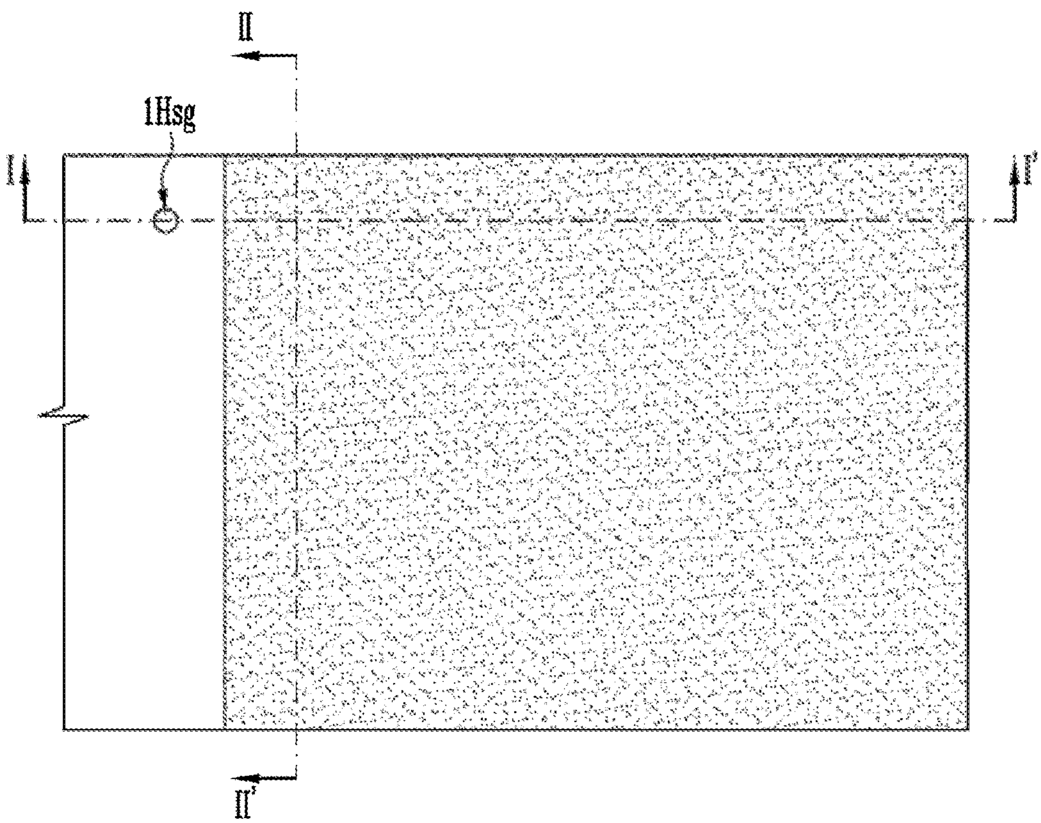
Figure 14B:
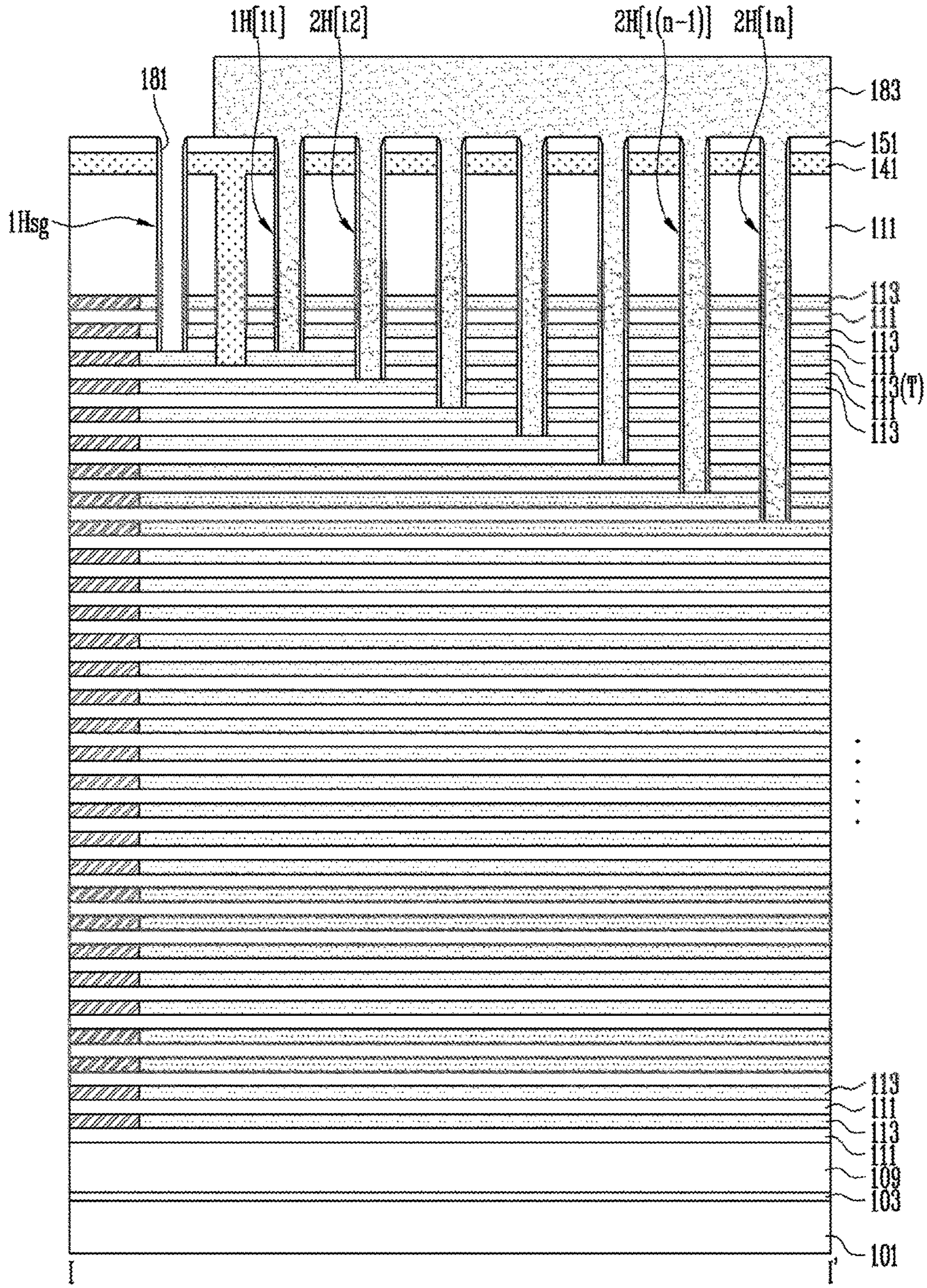
Figure 14C:
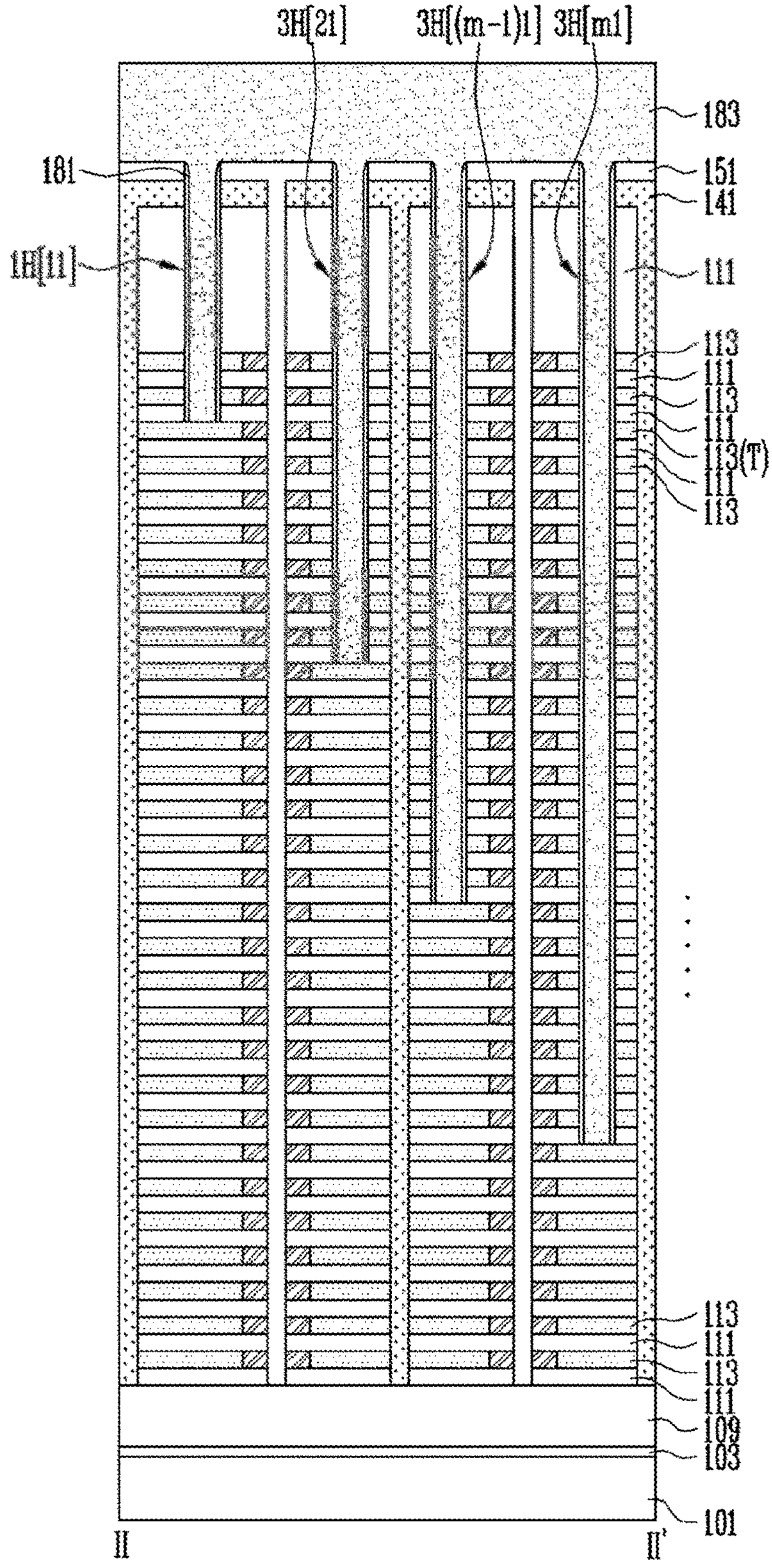
Figure 14D:
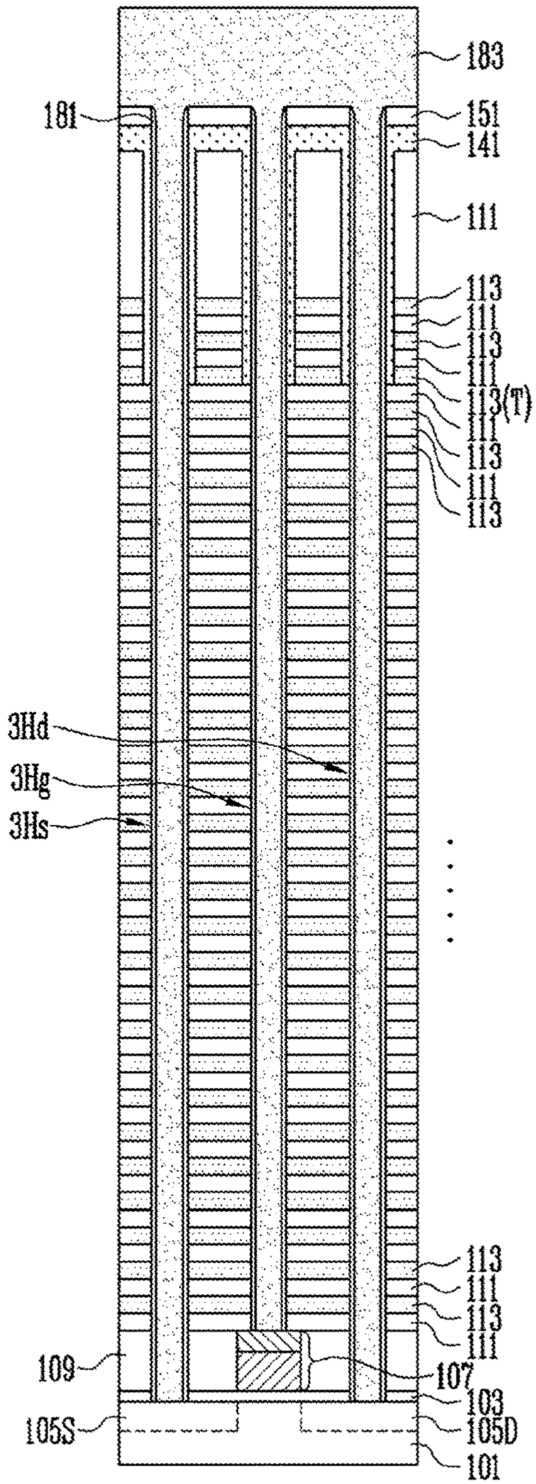

Referring now to FIGS. 13A to 13C, the second gap-filling layer 171, m sacrificial insulating layers and m interlayer insulating layers, which are exposed through the first opening holes OH[m1] to OH[mn] in the m-th row, the first opening holes OH[(m−1)1] to OH[(m−1)n] in the (m−1)-th row, and the third opening holes OHs, OHg, and OHd, may be etched by using the third contact mask pattern 175B (see FIG. 12B) having the second shape as an etch barrier.

An etching process of the sacrificial insulating layers and the interlayer insulating layers may be repeated by using a third contact mask pattern 175C having a smaller size than the second contact mask pattern 175B as an etch barrier until the lowermost sacrificial insulating layer, among the sacrificial insulating layers 113, is exposed. As a result, a third contact hole group (3H[21] to 3H[mn], 3Hs, 3Hg, and 3Hd) may be formed.

In other words, the etching process of the sacrificial insulating layers and the interlayer insulating layers by using the third contact mask pattern 175A, 175B or 175C as an etch barrier may be repeated (m−1) times until the lowermost sacrificial insulating layer, among the sacrificial insulating layers 113, is exposed. An etching process of reducing the size of the third contact mask pattern 175A or 175B may be performed each time before the etching process of the sacrificial insulating layers and the interlayer insulating layers is performed. The etching process for reducing the size of the third contact mask pattern 175A or 175B may be performed to open another row of the first opening holes OH[11] to OH[mn].

The third contact hole group may include cell contact holes 3H[21] to 3H[mn] in the second to m-th rows and peripheral contact holes 3Hs, 3Hg, and 3Hd which have different heights. The cell contact holes 3H[21] to 3H[mn] in the second to m-th rows may have a greater depth than and different heights from the cell contact holes 2H[12] to 2H[1*n*] in the first row. The cell contact holes 2H[12] to 2H[1*n*], and 3H[21] to 3H[mn] may have different heights and open the sacrificial insulating layers 113, respectively. The peripheral contact holes 3Hs, 3Hg, and 3Hd may be deeper than the cell contact holes 2H[12] to 2H[1*n*], and 3H[21] to 3H[mn] and open the source region 105S, the gate 107 and the drain region 105D of the peripheral transistor, respectively.

While the third contact hole group (3H[21] to 3H[mn], 3Hs, 3Hg, and 3Hd) is formed, the heights of the select contact hole 1Hsg and the dummy contact hole 1H[11] as described above with reference to FIGS. 7A to 7D and the heights of the cell contact holes 2H[12] to 2H[1*n*] as described above with reference to FIGS. 10A to 10C may be maintained.

As described above, according to an embodiment, the first contact hole group may be formed by using the first contact mask 153 including the opening holes OHsg, OH[11] to OH[mn], OHs, OHg, and OHd as an etch barrier. Subsequently, while the first contact mask 153 remains, the etching process of the interlayer insulating layers 111 and the sacrificial insulating layers 113 may be repeated in row and column directions, so that the contact holes 1Hsg, 1H[11], 2H[12] to 2H[1*n*], 3H[21] to 3H[mn], 3Hs, 3Hg, and 3Hd having different heights may be formed. According to an embodiment, since the etching process of the interlayer insulating layers 111 and the sacrificial insulating layers 113 is repeated when the first contact mask 153 is not removed, the contact holes 1Hsg, 1H[11], 2H[12] to 2H[1n], 3H[21] to 3H[mn], 3Hs, 3Hg, and 3Hd may be aligned in regions defined by the opening holes OHsg, OH[11] to OH[mn], OHs, OHg, and OHd. Therefore, according to an embodiment, misalignment of the contact holes 1Hsg, 1H[11], 2H[12] to 2H[1n], 3H[21] to 3H[mn], 3Hs, 3Hg, and 3Hd may be prevented.

Referring now to FIGS. 14A to 14D, the remaining third contact mask pattern 175C (see FIG. 13B) and the remaining second gap-filling layer 171 may be removed. Subsequently, the contact holes 1Hsg, 1H[11], 2H[12] to 2H[1n], 3H[21] to 3H[mn], 3Hs, 3Hg, and 3Hd may be filled with a protective layer (not illustrated), and an etch-back process may be performed until the first contact mask pattern 153 (see FIG. 13B) is removed. The protective layer may be removed after the first contact mask pattern 153 is removed. The protective layer may include, for example, a photoresist material or an organic material used as a bottom of anti Reflection Coating (BARC) layer. The process of forming the protective layer may be skipped.

Subsequently, the spacer insulating layers 181 may be formed on sidewalls of the contact holes 1Hsg, 1H[11], 2H[12] to 2H[1n], 3H[21] to 3H[mn], 3Hs, 3Hg, and 3Hd. The spacer insulating layers 181 may be formed of a different material from the sacrificial insulating layers 113, for example, an oxide layer. The spacer insulating layers 181 may be formed by forming an insulating layer on surfaces of the contact holes 1Hsg, 1H[11], 2H[12] to 2H[1n], 3H[21] to 3H[mn], 3Hs, 3Hg, and 3Hd, and etching the insulating layer so that the sacrificial insulating layers 113, the source region 105S, the gate 107 and the drain region 105D may be opened through bottom surfaces of the contact holes 1Hsg, 1H[11], 2H[12] to 2H[1n], 3H[21] to 3H[mn], 3Hs, 3Hg, and 3Hd.

Subsequently, a spacer mask pattern 183 may be formed to open the select contact hole 1Hsg and block the dummy contact hole 1H[11], the cell contact holes 2H[12] to 2H[1n], and 3H[21] to 3H[mn] and the peripheral contact holes 3Hs, 3Hg, and 3Hd. The spacer mask pattern 183 may be a photoresist pattern.

Figure 15A:
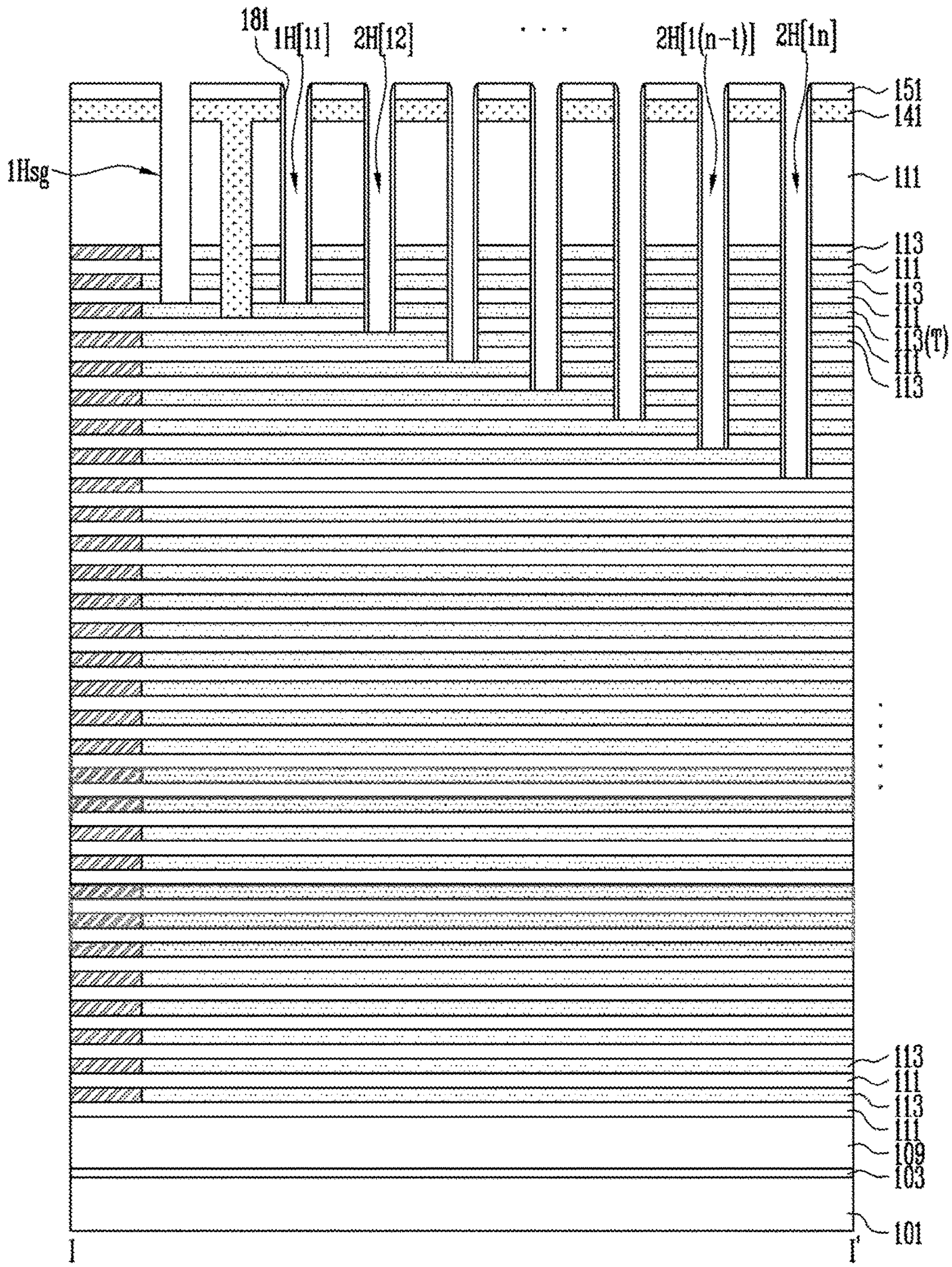
Figure 15B:
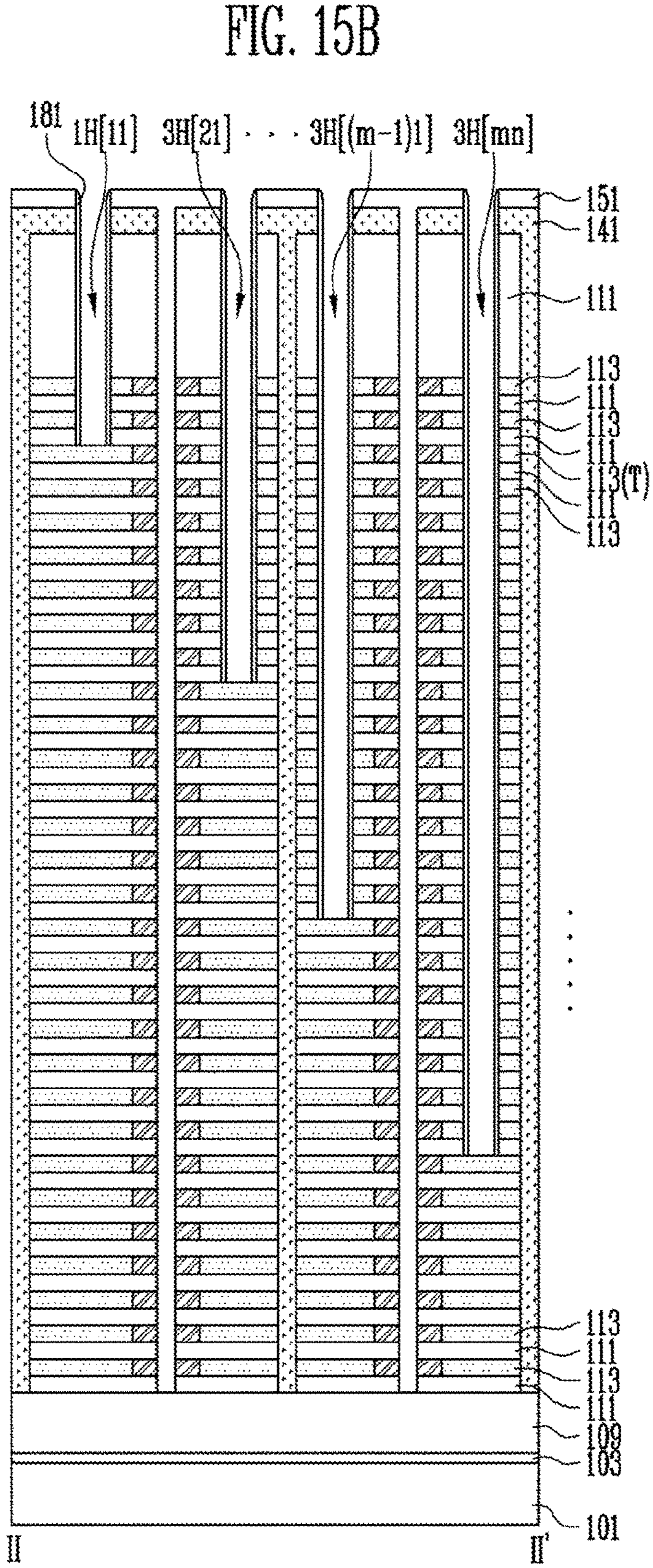
Figure 15C:
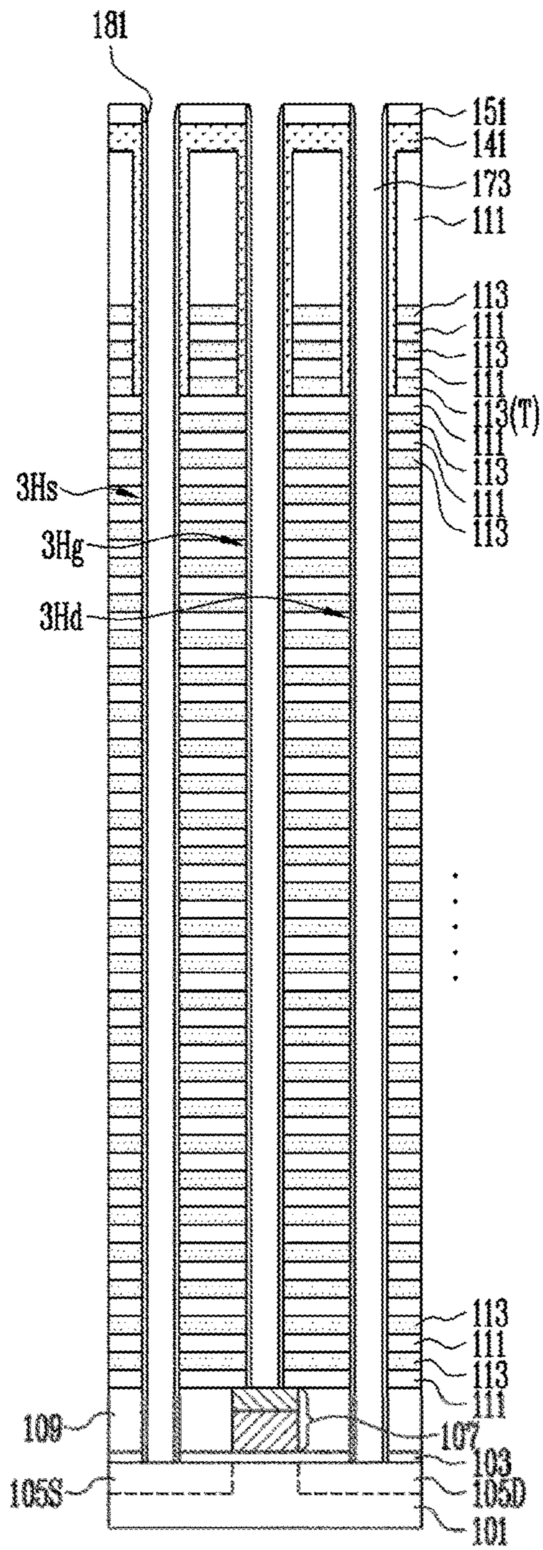

Referring now to FIGS. 15A to 15C, the spacer insulating layer 181 formed on the sidewall of the select contact hole 1Hsg may be removed by using the spacer mask pattern 183 (see FIG. 14B) as an etch barrier. After the spacer insulating layer 181 on the sidewall of the select contact hole 1Hsg is removed, the spacer mask pattern 183 may removed. As a result, the sacrificial insulating layers 113 from the uppermost sacrificial insulating layer to the target sacrificial insulating layer T may be exposed through the select contact hole 1Hsg.

The spacer insulating layers 181 formed on the sidewalls of the dummy contact hole 1H[11], the cell contact holes 2H[12] to 2H[1n], and 3H[21] to 3H[mn] and the peripheral contact holes 3Hs, 3Hg, and 3Hd may remain. Each of the dummy contact hole 1H[11] and the cell contact holes 2H[12] to 2H[1n], and 3H[21] to 3H[mn] may open a single sacrificial insulating layer corresponding thereto.

Figure 16A:
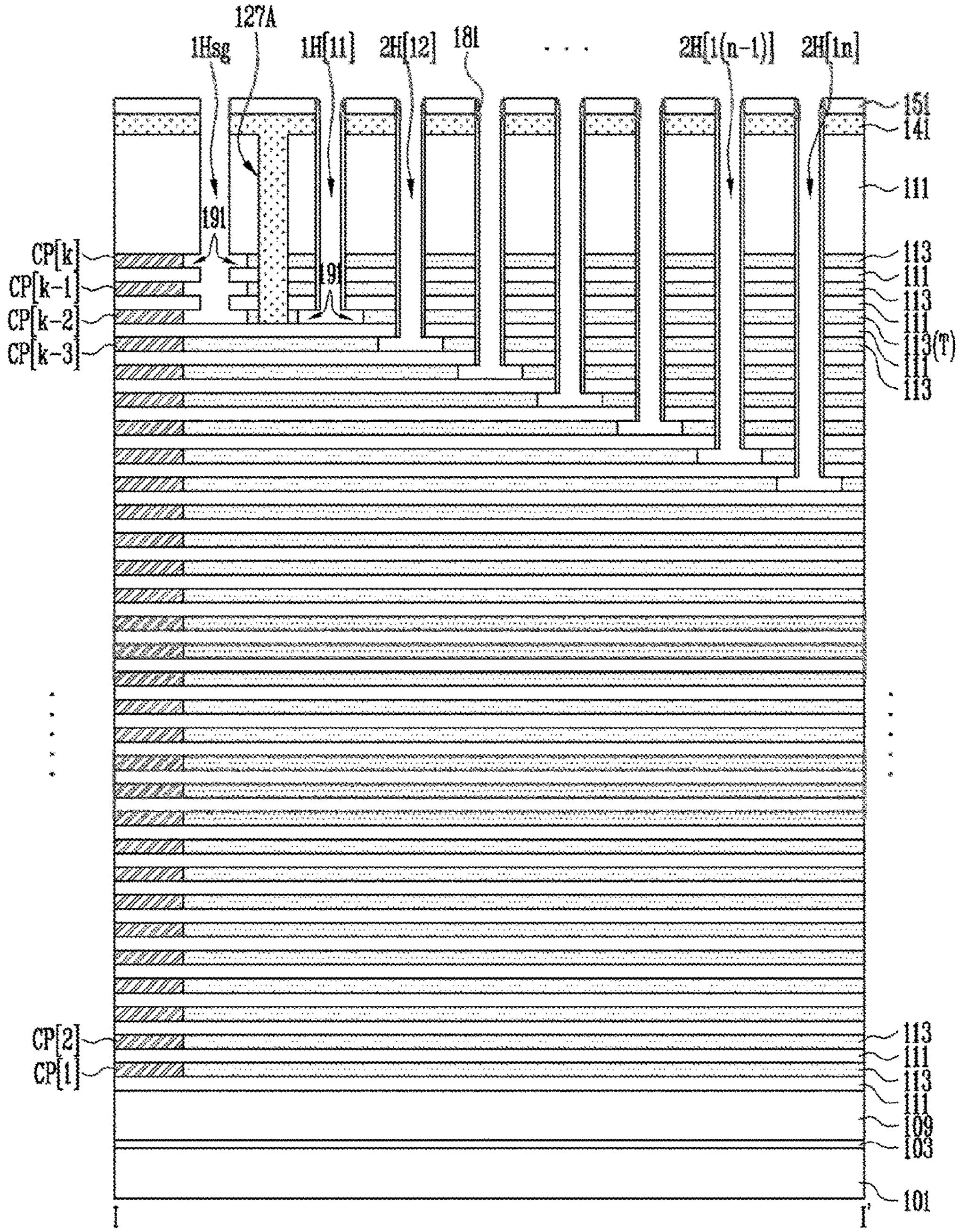
Figure 16B:
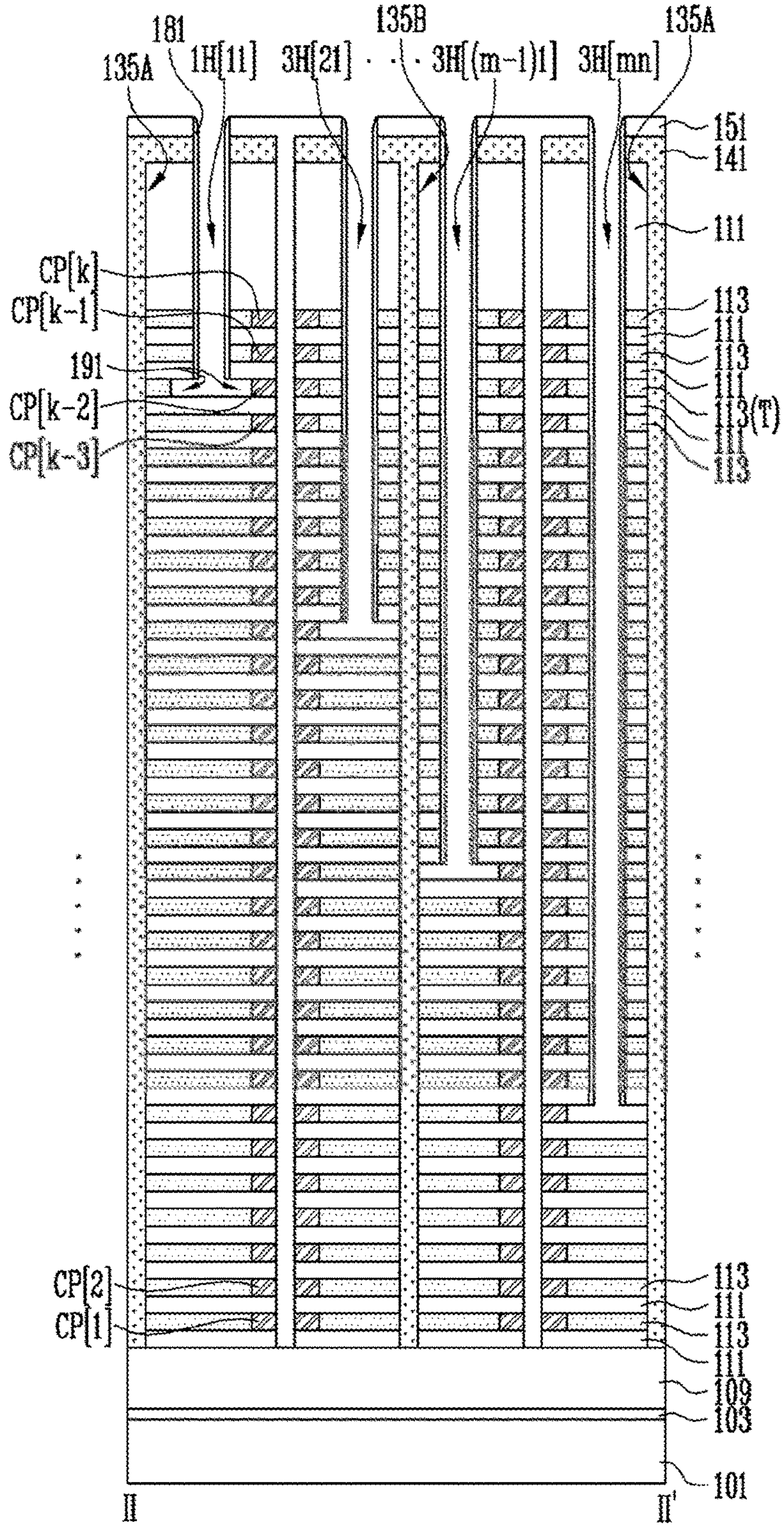
Figure 16C:
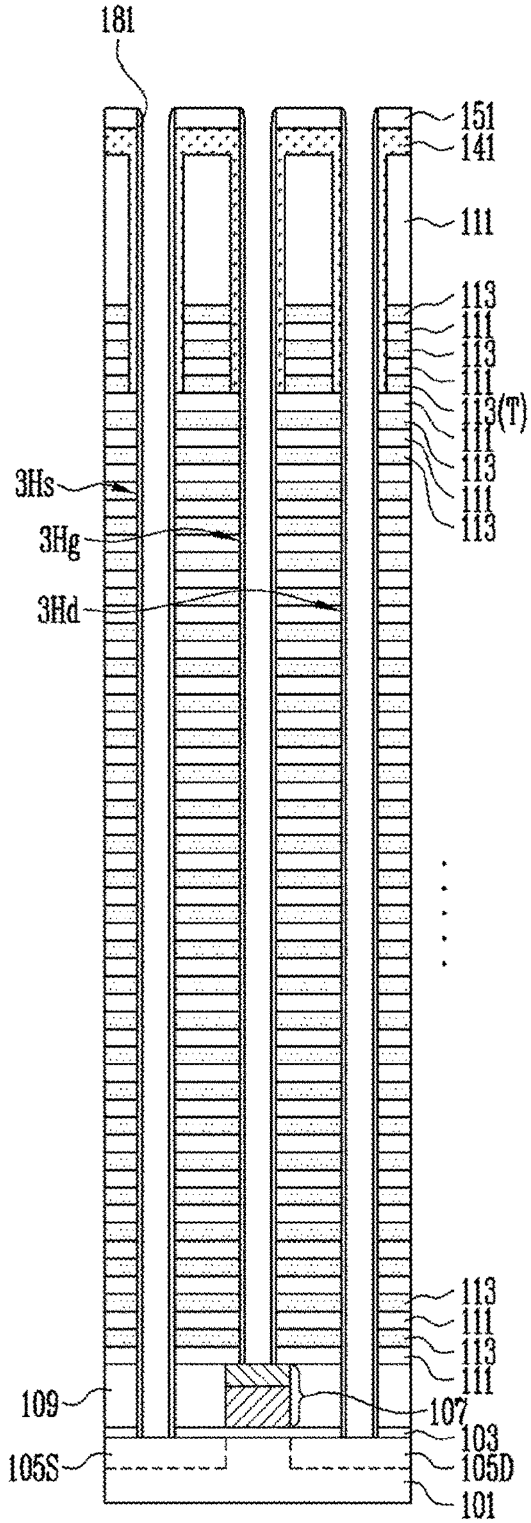

Referring now to FIGS. 16A to 16c, the sacrificial insulating layers 113 opened through the contact holes 1Hsg, 1H[11], 2H[12] to 2H[1n], and 3H[21] to 3H[mn] may be selectively etched until the sidewalls of the conductive patterns CP[1] to CP[k] are exposed, so that grooves 191 may be formed. The first buried insulating layer 141 formed in the trench 127A, the first slit 135A and the second slits 135B may function as an etch stop layer. When the sacrificial insulating layers 113 include, for example, a nitride layer, the sacrificial insulating layers 113 may be selectively etched using, for example, phosphoric acid.

When the sidewalls of the conductive patterns CP[1] to CP[k] are surrounded by the multilayer film (not illustrated) as described above with reference to FIGS. 7A to 7D, an etching process may be performed to remove the multilayer film surrounding the conductive patterns CP[1] to CP[k] after the grooves 191 are formed. The multilayer film may be removed by using a cleaning solution including, for example, sulfuric acid and de-ionized water (DI).

Two or more of the grooves 191 opening two or more layers of the conductive patterns, for example, CP[k−2] to CP[k] which are used as the selection lines SL, among the conductive patterns CP[1] to CP[k], may be coupled to the select contact hole 1Hsg. The lowermost groove, among the grooves 191 coupled to the select contact hole 1Hsg, and the groove 191 coupled to the bottom surface of the dummy contact hole 1H[11] may be formed in the same layer. The conductive patterns CP[1] to CP[k−3] under the selection lines SL may be opened through the grooves 191 connected to the cell contact holes 2H[12] to 2H[1n], and 3H[21] to 3H[mn]. A single groove may be connected to a single cell contact hole.

Figure 17A:
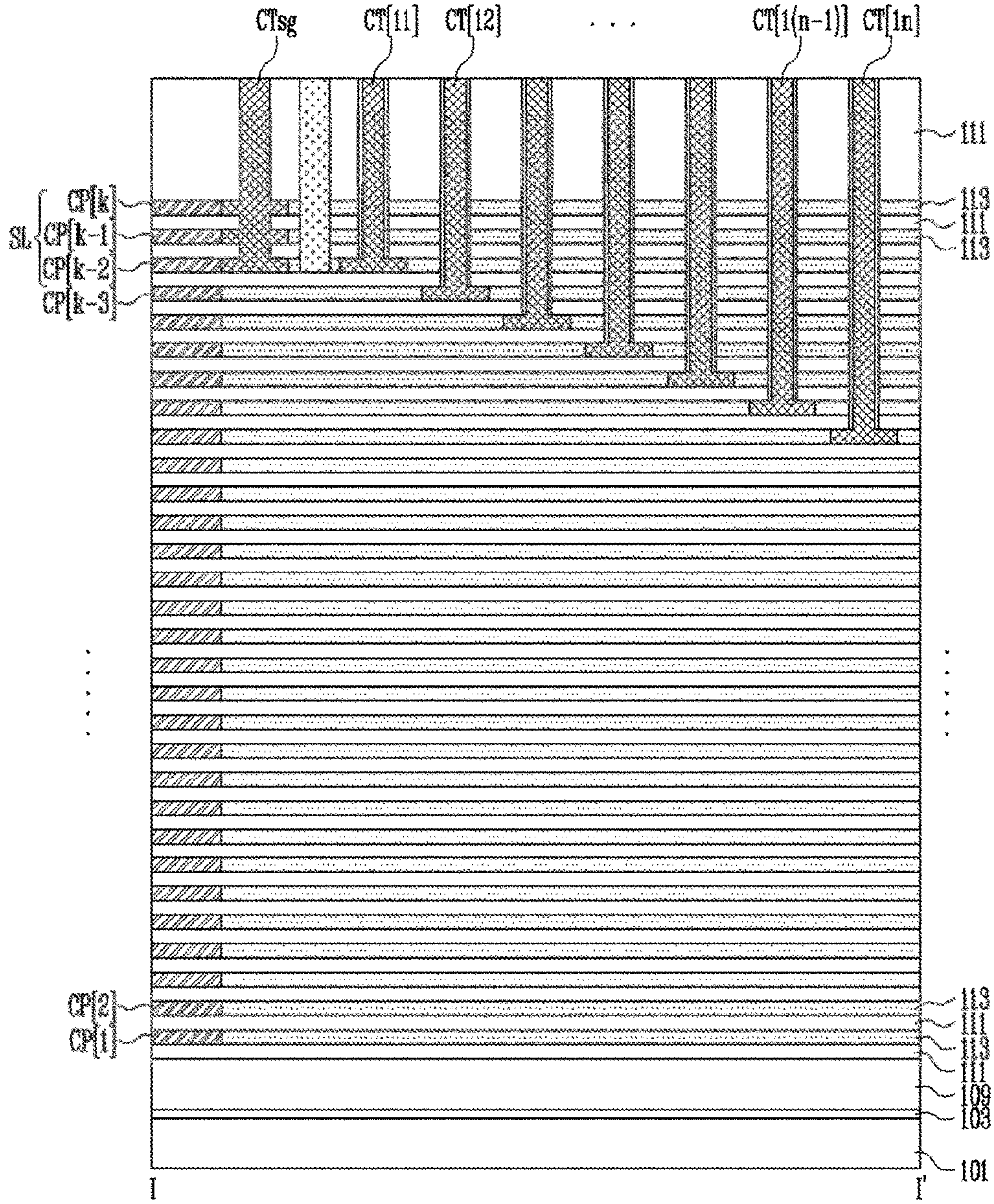
Figure 17B:
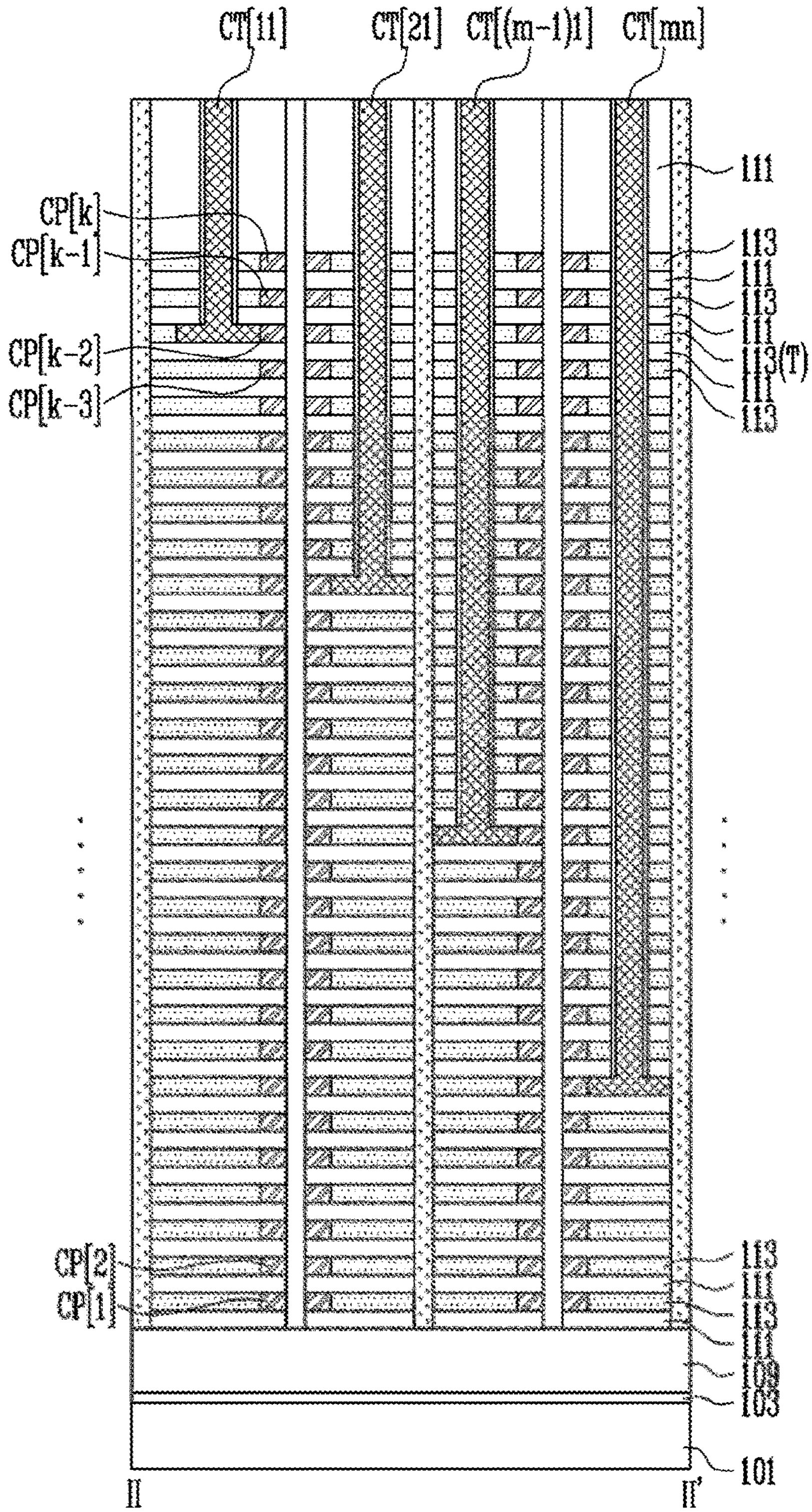
Figure 17C:
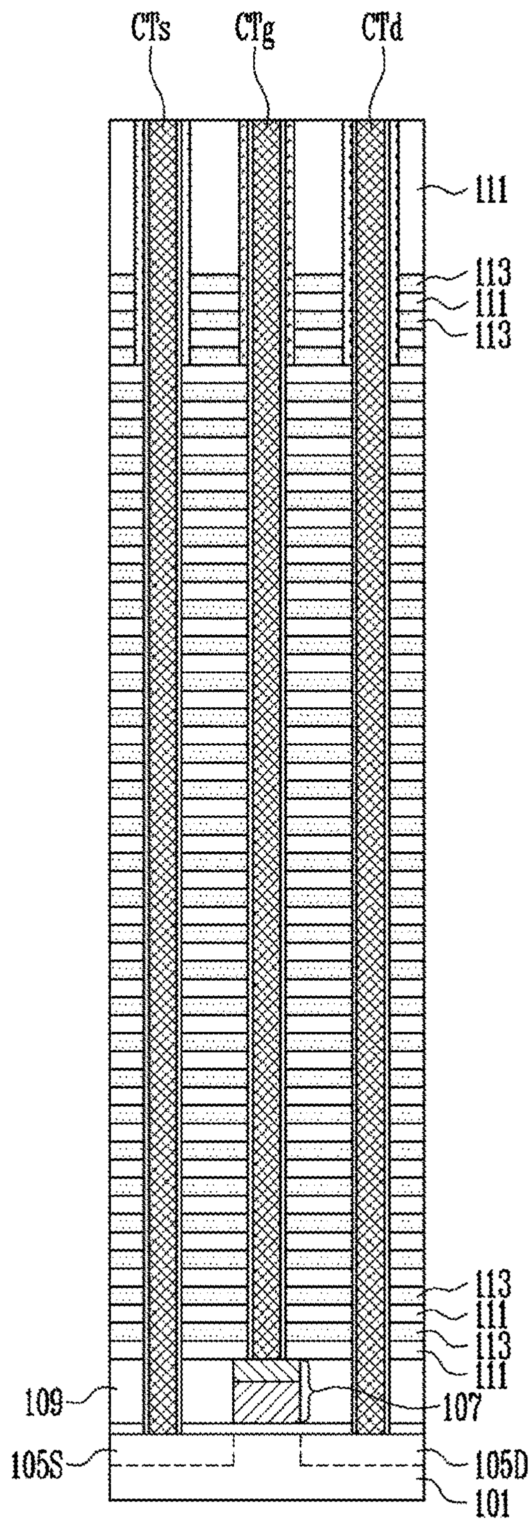

Referring now to FIGS. 17A to 17C, after the grooves 191 (see FIG. 16B) and the contact holes 1Hsg, 1H[11], 2H[12] to 2H[1n], 3H[21] to 3H[mn], 3Hs, 3Hg, and 3Hd are filled with a conductive material, a surface of the conductive material may be planarized until the uppermost interlayer insulating layer, among the interlayer insulating layers 111, is exposed, so that the contact plugs CTsg, CT[11] to CT[mn], CTs, CTg, and CTd are formed. As the conductive material, one of a polysilicon layer, a metal layer and a metal silicide layer may be used among other materials. As the metal layer, tungsten having lower resistance than polysilicon may be used among other materials. When a metal layer is formed as the conductive material, a diffusion barrier layer having a stacked structure including a barrier metal layer, a Ti layer and a TiN layer may be further formed before the metal layer is formed.

The contact plugs may include the select contact plug CTsg, the dummy contact plug CT[11], the cell contact plugs CT[12] to CT[mn], and the peripheral contact plugs CTs, CTg, and CTd. The select contact plug CTsg may be coupled in common to two or more of the conductive patterns, for example, CP[k−2] to CP[k], which are used as the selection lines SL, among the conductive patterns CP[1] to CP[k]. The dummy contact plug CT[11] may be coupled to the conductive pattern CP[k−2] in the same layer as the lowermost conductive pattern, among the conductive patterns CP[k−2] to CP[k] which are used as the selection lines SL. The cell contact plugs CT[12] to CT[mn] may be coupled to the conductive patterns CP[1] to CP[k−3] under the selection lines SL. The peripheral contact plugs CTs, CTg, and CTd may be coupled to the source region 105S, the gate 107 and the drain region 105D of the peripheral transistor, respectively.

According to an embodiment, by selectively etching the sacrificial insulating layers 113 exposed through the contact holes 1Hsg, 1H[11], 2H[12] to 2H[1n], and 3H[21] to 3H[mn] having different depths, the grooves 191 may be automatically aligned with the sidewalls of the conductive patterns CP[1] to CP[k] without errors. The contact plugs CTsg and CT[11] to CT[mn] may include protruding portions filling the grooves 191 automatically aligned with the sidewalls of the conductive patterns CP[1] to CP[k]. Therefore, the protruding portions of the contact plugs CTsg and CT[11] to CT[mn] may be automatically aligned with the sidewalls of the conductive patterns CP[1] to CP[k] without alignment errors.

As described above, according to an embodiment, since the processes are performed so that the contact plugs CTsg and CT[11] to CT[mn] may be automatically aligned with the sidewalls of the conductive patterns CP[1] to CP[k], alignment of the contact plugs CTsg and CT[11] to CT[mn] may be improved.

Figure 18A:
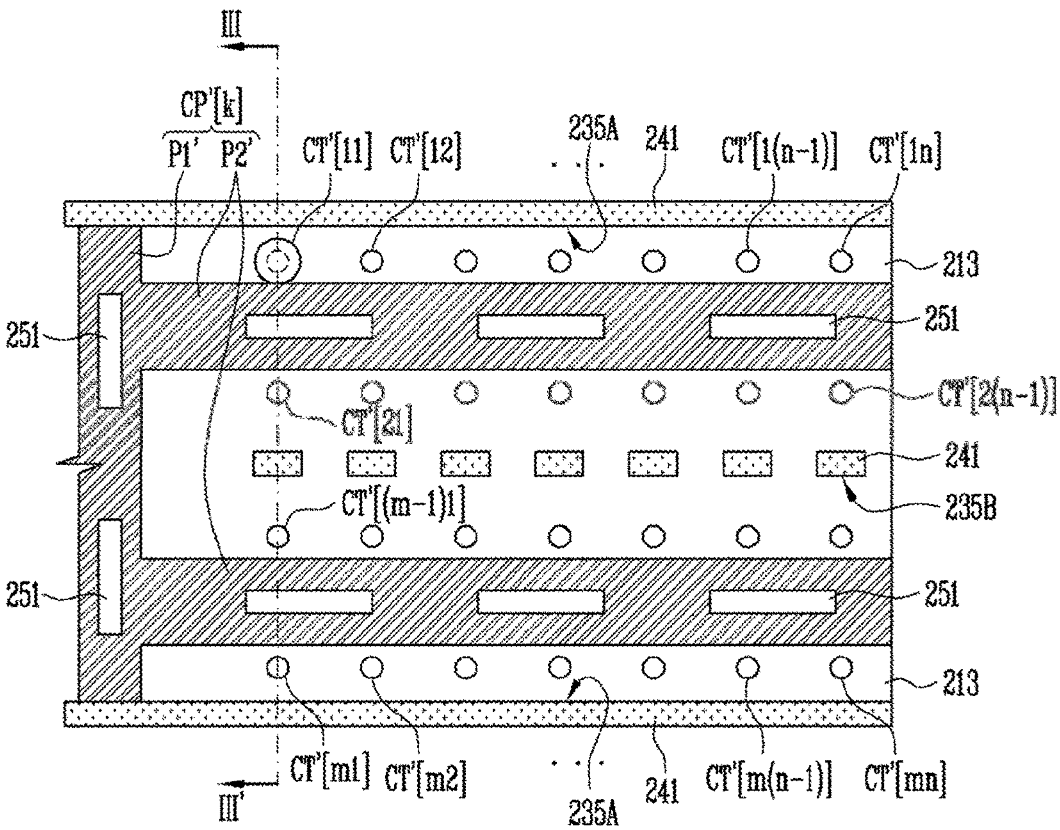
FIGS. 18A and 18B are a plan view and a cross-sectional view illustrating a representation of a contact region of a semiconductor device according to an embodiment.
Figure 18B:
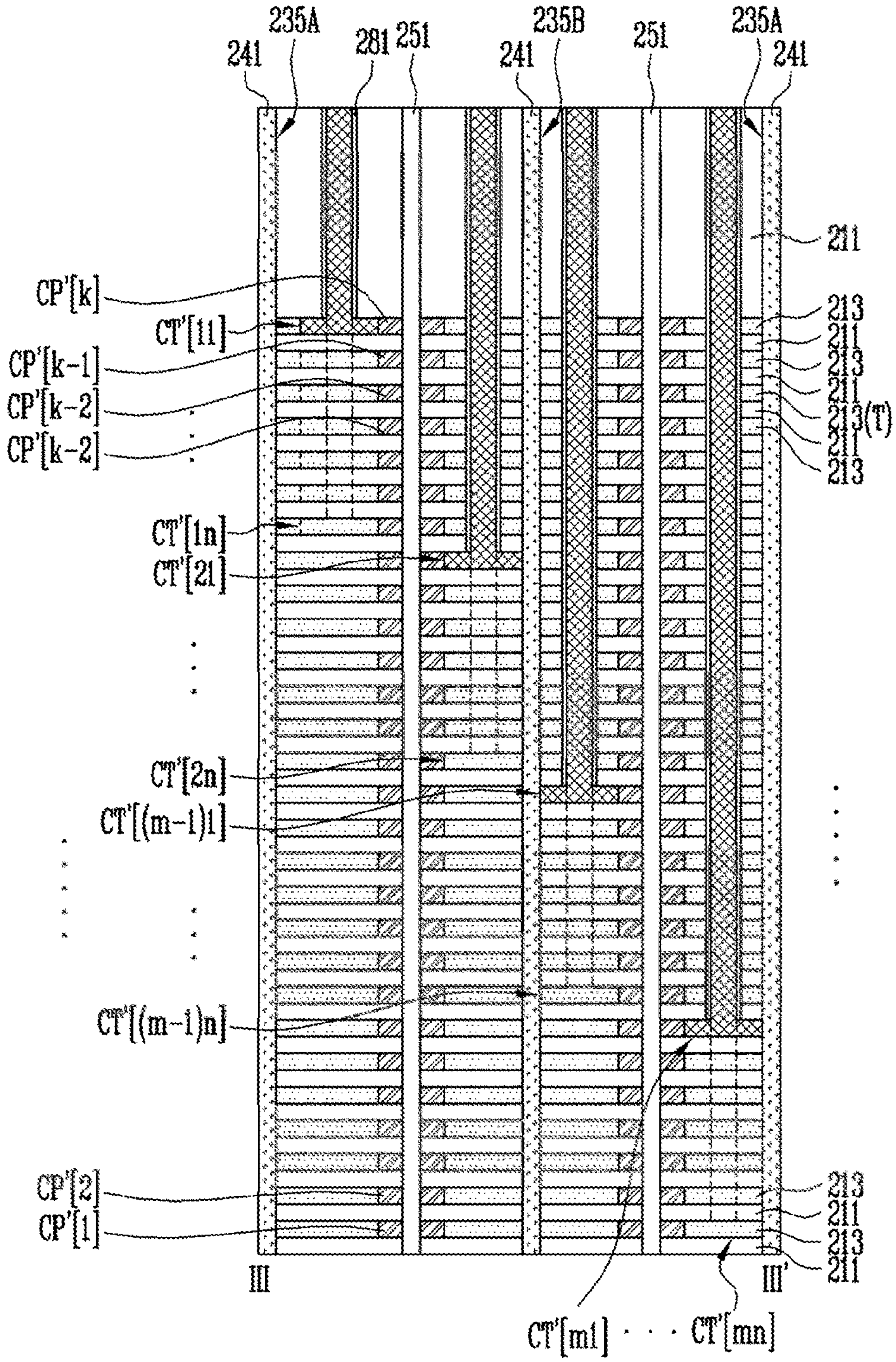

FIGS. 18A and 18B are a plan view and a cross-sectional view illustrating a representation of a contact region of a semiconductor device according to an embodiment. More specifically, FIG. 18A is a plan view illustrating a representation of the contact region, and FIG. 18B is a cross-sectional view taken along line III-III' of FIG. 18A. Particularly, FIG. 18A is a plan view illustrating a horizontal layer on which the uppermost conductive pattern is arranged.

Referring to FIGS. 18A and 18B, a semiconductor device may include horizontal layers stacked over a substrate (not illustrated) and having conductive regions, sacrificial regions. Each of the horizontal layers may be arranged between interlayer insulating layers 211. Conductive patterns CP'[1] to CP'[k], where k is a natural number greater or equal to 2, may be formed in the conductive regions. Sacrificial insulating layers 213 may be formed in the sacrificial regions. The horizontal layers may be separated into units of memory blocks by a first buried insulating layer 241.

The first buried insulating layer 241 may be formed in a first slit 235A separating the horizontal layers in units of memory blocks and a plurality of second slits 235B passing through the horizontal layers in a single memory block. The first buried insulating layer 241 may support the horizontal layers.

The conductive patterns CP'[1] to CP'[k] may extend from a cell region (not illustrated) to the contact region. The conductive patterns CP'[1] to CP'[k] may include word lines and at least one selection line. The selection line may be formed over the word lines.

Each of the word lines and the selection line may include a first portion P1' and a second portion P2' extending from the first portion P1'. The first portion P1' and the second portion P2' may extend in directions crossing each other. Two or more of the second portions P2' may be arranged in a direction crossing the extending direction. The sacrificial insulating layer 213 may be arranged between the two or more second portions P2' in the same horizontal layer.

The conductive patterns CP'[1] to CP'[k] may contact sidewalls of second buried insulating layers 251 passing through the horizontal layers and the interlayer insulating layers 211 and extend to the sides. The conductive patterns CP'[1] to CP'[k] may be coupled to the contact plugs CT'[11] to CT'[mn], respectively, where m and n are natural numbers greater than or equal to 2.

The contact plugs CT[11]' to CT'[mn] may include select contact plugs coupled to selection lines, respectively, and having different depths, and cell contact plugs coupled to word lines, respectively, and having different depths. For example, when the selection lines are arranged on the uppermost conductive pattern CP'[k], among the conductive patterns CP'[1] to CP'[k], and two lower conductive patterns CP'[k−1] and CP'[k−2]), the conductive patterns CP'[k−2] to CP'[k] configured as selection lines may be coupled to the select contact plugs CT'[11] to CT'[13], respectively. In addition, the conductive patterns CP'[1] to CP'[k−3] configured as word lines may be coupled to cell contact plug CT'[14] to CT'[mn], respectively. A lower structure of the conductive patterns CP'[1] to CP'[k−3] configured as word lines may vary depending on a cell structure formed in the cell region.

A different cross-sectional area of each of the contact plugs CT'[11] to CT'[mn] may vary along the length of the contact plug. The contact plugs CT[11]' to CT[mn]' may have the largest cross-sectional area at a depth at which the target conductive patterns CP'[1] to CP'[k] is arranged, respectively. The contact plugs CT'[11] to CT'[mn] may be arranged in a matrix format including a plurality of rows and a plurality of columns. The contact plugs CT'[11] to CT'[mn] may be sequentially arranged with a first depth difference in a row direction and with a second depth difference greater than the first depth difference in a column direction.

Each of the contact plugs CT'[11] to CT'[mn] may include a pillar portion and a protruding portion protruding from a sidewall of the pillar portion. The pillar portion may pass through the interlayer insulating layers 211 and the sacrificial insulating layers 213 and extend to a layer in which a target conductive pattern, i.e., one of the conductive patterns CP'[1] to CP'[k] is located. The protruding portion may protrude from the sidewall of the pillar portion and contact a sidewall of the target conductive pattern, i.e., one of the conductive patterns CP'[1] to CP'[k]. Each of the contact plugs CT'[11] to CT'[mn] may be surrounded by a spacer insulating layer 281. The spacer insulating layer 281 may surround the pillar portion of each of the contact plugs CT'[11] to CT'[mn] except for the protruding portion thereof. The spacer insulating layers 281 may surround first pillar portions of the cell contact plug CT'[14] to CT'[mn] and second pillar portions of the select contact plugs CT'[11] to CT'[13].

The semiconductor device illustrated in FIGS. 18A and 18B may be formed by the manufacturing method described above with reference to FIGS. 4A to 17C. However, since the select contact plugs in the semiconductor device shown in FIGS. 18A and 18B may be coupled to the selection lines, respectively, the process of forming a trench and the process of removing a spacer insulating layer, among the processes described above with reference to FIGS. 4A to 17C, may not be performed.

Figure 19:
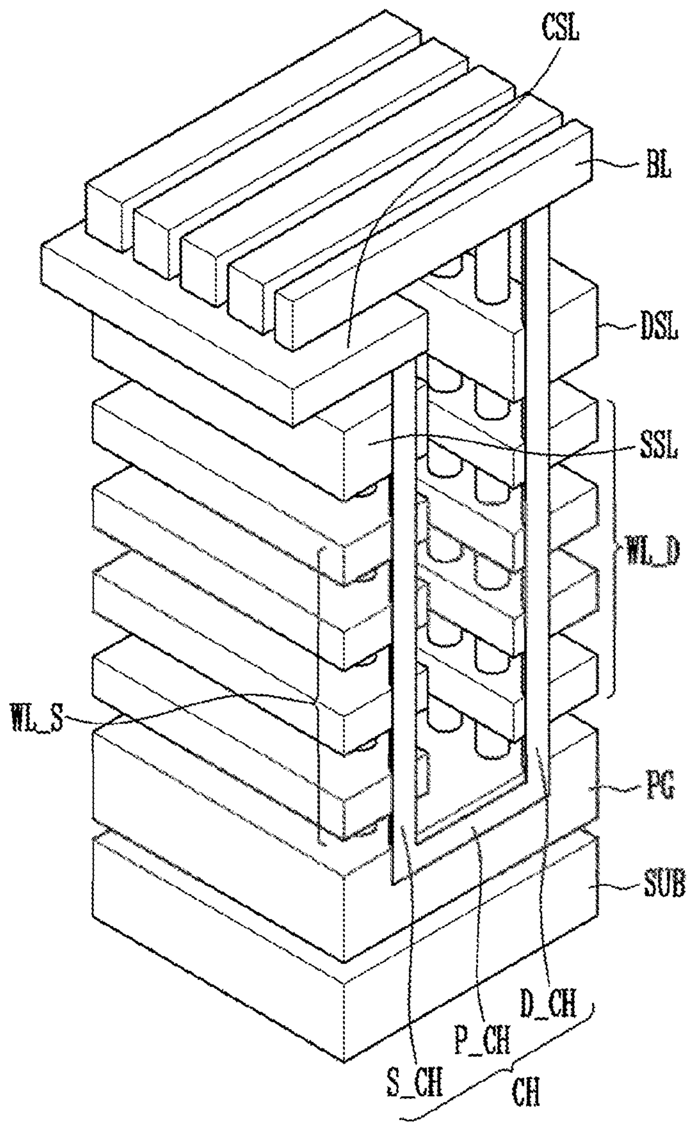
FIGS. 19 and 20 are perspective views illustrating a representation of cell structures of a semiconductor device according to embodiments.
Figure 20:
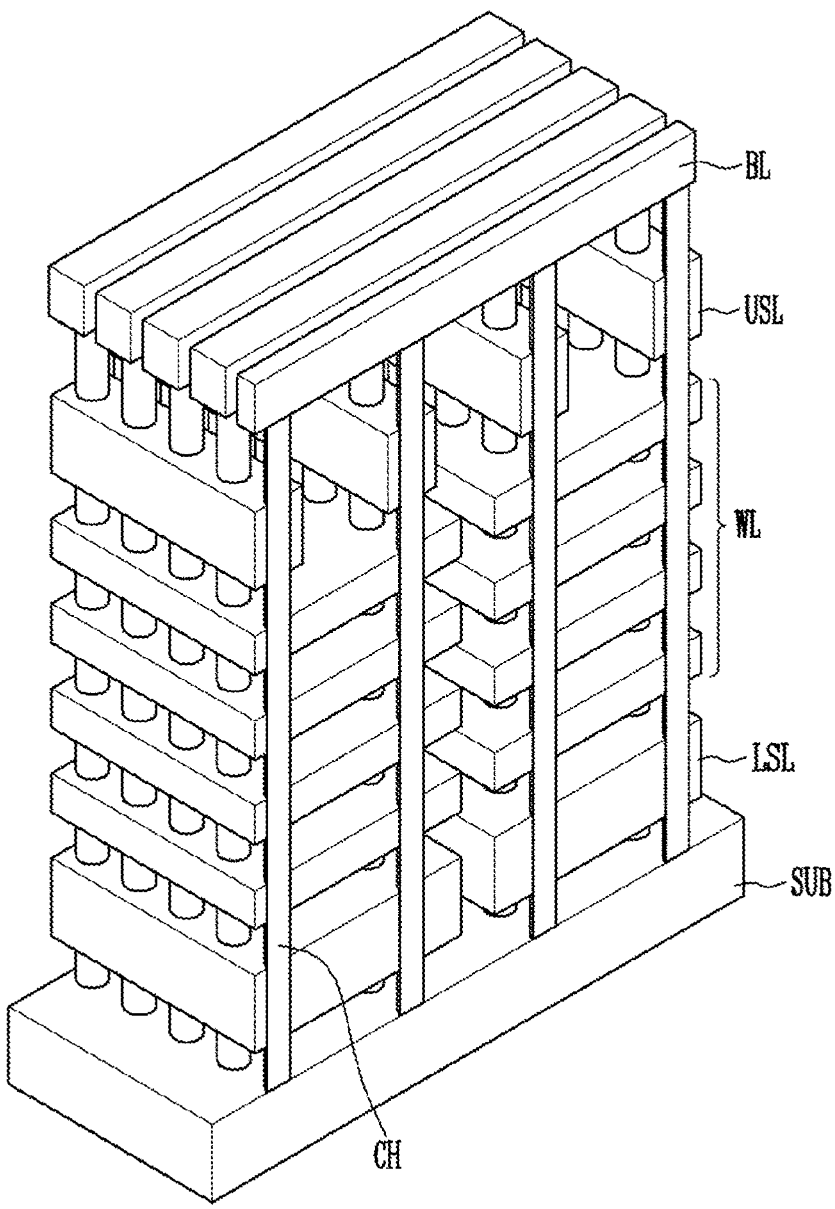

FIGS. 19 and 20 are perspective views illustrating representations of cell structures of a semiconductor device according to various embodiments.

An example in which memory cells are arranged along a U-shaped channel layer CH to form a three-dimensional memory string is described below with reference to FIG. 19.

As illustrated in FIG. 19, the cell structure may include a pipe gate PG, word lines WL_D and WL_S, at least one source selection line SSL and at least one drain selection line DSL stacked over the substrate SUB. The cell structure may include the U-shaped channel layer CH or substantially U-shaped channel layer CH. A multilayer film (not illustrated) including a tunnel insulating layer, a data storage layer and a blocking insulating layer may be formed between the channel layer CH and the word lines WL_D and WL_S. The word lines WL_D and WL_S, the source selection line SSL and the drain selection line DSL may be patterns which are coupled to the conductive patterns described with reference to FIGS. 1A to 18B and formed in the cell region.

The channel layer CH may include a pipe channel layer P_CH, and a source side channel layer S_CH and a drain side channel layer D_CH protruding from the pipe channel layer P_CH. With reference to FIG. 19, it is described as an example in which a pair of the source side channel layer S_CH and the drain side channel layer D_CH are coupled to the pipe channel layer P_CH. However, two or more source side channels layers S_CH may be coupled to the pipe channel layer P_CH and two or more drain side channel layers D_CH may be coupled to the pipe channel layer P_CH depending on the shape of the memory string.

The source side channel layer S_CH may pass through the source side word lines WL_S and the source selection line SSL. The drain side channel layer D_CH may pass through the drain side word lines WL_D and the drain selection line DSL. The source side channel layer S_CH may be coupled to the source line CSL, and the drain side channel layer D_CH may be coupled to the bit line BL.

According to the semiconductor devices having the above-described structure, at least one drain selection transistor, memory cells and at least one source selection transistor coupled in series with each other may form a single memory string and be arranged in a U shape or substantially U-shape.

The above-described cell structures may be formed by using the processes described above with references to FIGS. 4A to 7D after the pipe gate PG is formed.

Referring to FIG. 20, FIG. 20 may be used to describe examples wherein memory cells are arranged in a straight type channel layer CH to form a three-dimensional memory string.

Referring now to FIG. 20, a cell structure may include at least one lower selection line LSL, word lines WL and at least one upper selection line USL stacked over the substrate SUB including a source region. The cell structure may include the straight type channel layer CH coupled to the substrate SUB. A multilayer film (not illustrated) including a tunnel insulating layer, a data storage layer and a blocking insulating layer may be formed between the channel layer CH and the word lines WL. The word lines WL and the upper selection line USL may be patterns coupled to the conductive patterns described above with reference to FIGS. 1A to 18B and formed in cell region. The lower selection line LSL may be a pattern coupled to at least one conductive lowermost conductive pattern, among the conductive patterns described with reference to FIGS. 1A to 18B, and extending to the cell region.

The channel layer CH may be coupled between the substrate SUB and the bit lines BL. Particularly, the channel layer CH may be coupled to the source region of the substrate SUB.

According to the above-described structure, at least one lower selection transistor, memory cells, and at least upper selection transistor coupled in series with each other may form a single memory string and be arranged in a row.

The above-described cell structure may be formed by using the processes described with reference to FIGS. 4A to 7D.

Figure 21:
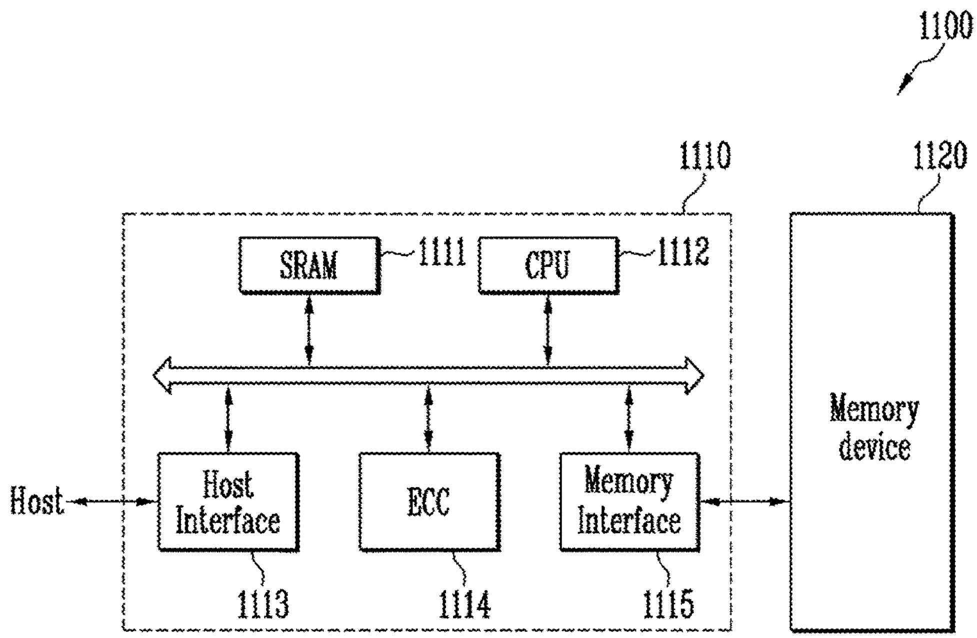
FIG. 21 is a view illustrating the configuration of a representation of a memory system according to an embodiment.

FIG. 21 is a view illustrating a representation of the configuration of a memory system according to an embodiment.

As illustrated in FIG. 21, a memory system 1100 according to an embodiment may include a non-volatile memory device 1120 and a memory controller 1110.

The non-volatile memory device 1120 of FIG. 21 may include the non-volatile memory device described with reference to the above-described embodiments in connection with FIGS. 1A to 20. In addition, the non-volatile memory device 1120 may be a multi-chip package composed of a plurality of flash memory chips.

The memory controller 1110 may be configured to control the non-volatile memory device 1120. The memory controller 1110 may include an SRAM 1111, a CPU 1112, a host interface 1113, an ECC 1114 and a memory interface 1115. The SRAM 1111 may function as an operation memory of the CPU 1112. The CPU 1112 may perform a general control operation for data exchange of the memory controller 1110. The host interface 1113 may include a data exchange protocol of a host being coupled to the memory system 1100. In addition, the ECC 1114 may detect and correct errors included in a data read from the non-volatile memory device 1120. The memory interface 1115 may interface with the non-volatile memory device 1120. The memory controller 1110 may further include a ROM that stores code data to interface with the host.

The memory system 1100 having the above-described configuration may be a solid state disk (SSD) or a memory card in which the memory device 1120 and the memory controller 1110 are combined. For example, when the memory system 1100 is an SSD, the memory controller 1110 may communicate with the outside (e.g., a host) through one of the interface protocols including USB, MMC, PCI-E, SATA, PATA, SCSI, ESDI and IDE.

Figure 22:
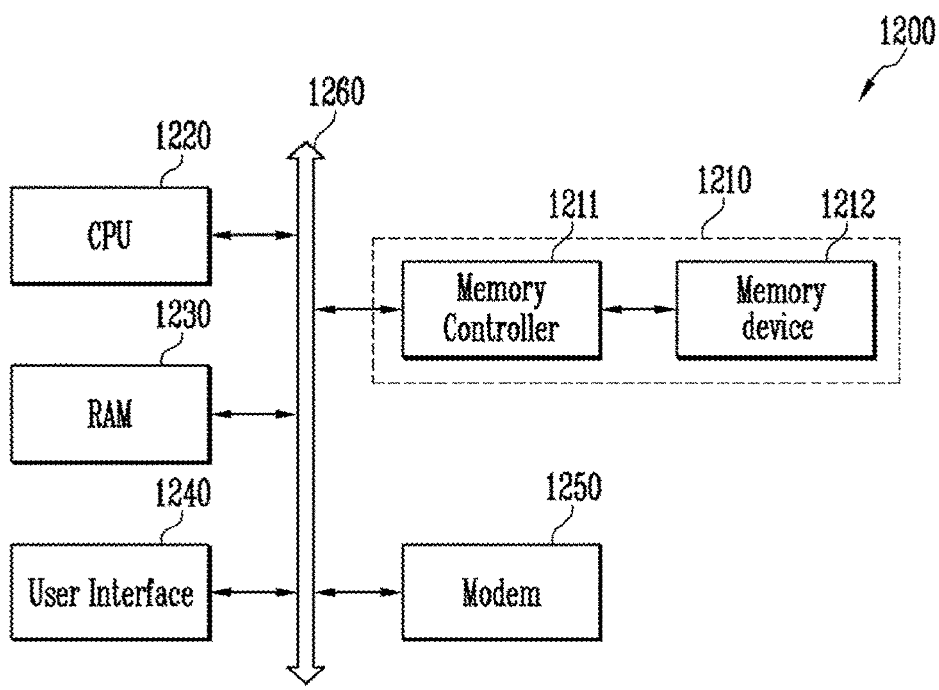
FIG. 22 is a view illustrating a representation of the configuration of a computing system according to an embodiment.

FIG. 22 is a view illustrating a representation of the configuration of a computing system according to an embodiment. The memory device 1212 of FIG. 22 may include the non-volatile memory device described with reference to the above-described embodiments in connection with FIGS. 1A to 21.

As illustrated in FIG. 22, a computing system 1200 according to an embodiment may include a CPU 1220, RAM 1230, a user interface 1240, a modem 1250 and a memory system 1210 that are electrically coupled to a system bus 1260. In addition, when the computing system 1200 is a mobile device, a battery may be further included to apply an operating voltage to the computing system 1200. The computing system 1200 may further include application chipsets, a Camera Image Processor (CIS) and a mobile DRAM.

As described above with reference to FIG. 21, the memory system 1210 may include a non-volatile memory 1212 and a memory controller 1211.

According to the various embodiments, since contact plugs include pillar portions extending in a direction in which conductive patterns, for example, word lines are stacked, and protruding portions protruding from sidewalls of the pillar portions and contacting a sidewall of a target conductive pattern, the contact plugs may be coupled to sidewalls of the conductive patterns.

According to the various embodiments, alignment of the contact plug may be improved by automatically aligning a contact plug with a sidewall of a conductive pattern.

What is claimed is:

1. A semiconductor device, comprising:

a plurality of conductive lines including a first conductive line and a second conductive line;

a plurality of sacrificial insulating layers arranged on sidewalls of the conductive lines; and a plurality of contact plugs including a first contact plug and a second contact plug, the first contact plug having a first pillar portion and a first protruding portion protruding from a part of the first pillar portion overlapped with a sidewall of the first conductive line, in a horizontal direction, so as to be in alignment and contact with the sidewall of the first conductive line, the second contact plug having a second pillar portion and a second protruding portion protruding from a part of the second pillar portion overlapped with a sidewall of the second conductive line, in the horizontal direction, so as to be in alignment and contact with the sidewall of the second conductive line, wherein the plurality of sacrificial insulating layers include an upper sacrificial layer, a lower sacrificial layer and a first sacrificial layer disposed between the upper sacrificial layer and the lower sacrificial layer, wherein the first protruding portion is disposed between the upper sacrificial layer and the lower sacrificial layer to be overlapped with the upper sacrificial layer and the lower sacrificial layer, and wherein the sidewall of the first conductive line, which is not overlapped with the upper sacrificial layer and the lower sacrificial layer, contacts with the first protruding portion.

2. The semiconductor device of claim 1, wherein the first conductive line and the second conductive line are disposed in different planes, and the first protruding portion and the second protruding portion are disposed in different planes.

3. The semiconductor device of claim 1, further comprising:

insulating layers formed in between the first and the second conductive lines.

4. The semiconductor device of claim 1, further comprising:

insulating layers formed with a gap between adjacent insulating layers and surrounding sidewalls of the first and the second pillar portions.

5. The semiconductor device of claim 1, wherein the plurality of sacrificial insulating layers include a second sacrificial layer, and wherein the second sacrificial layer is adjacent to and in plane with the second conductive line.

6. The semiconductor device of claim 5, further comprising:

the second sacrificial layer extending to sidewalls of the second protruding portion of the second contact plug.

7. The semiconductor device of claim 1, further comprising:

the first pillar portion of the first contact plug having a first end at a top surface of the first contact plug and a second end at a bottom surface of the first contact plug; and the second pillar portion of the second contact plug having a first end at a top surface of the second contact plug and a second end at a bottom surface of the second contact plug.

8. The semiconductor device of claim 1, further comprising:

the plurality of conductive lines including a third conductive line and a fourth conductive line; and the plurality of contact plugs including a third contact plug, the third contact plug having a third pillar portion, a third protruding portion and a fourth protruding portion, the third protruding portion extending from a part of the third pillar portion overlapped with a sidewall of the third conductive line, in the horizontal direction, so as to be in alignment and contact with the sidewall of the third conductive line, the fourth protruding portion extending from a part of the third pillar portion overlapped with a sidewall of the fourth conductive line, in the horizontal direction, so as to be in alignment and contact with the sidewall of the fourth conductive line.

9. The semiconductor device of claim 8, wherein the third conductive line and the fourth conductive line are disposed in different planes, and the third protruding portion and the fourth protruding portion are disposed in different planes.

10. The semiconductor device of claim 8, further comprising:

insulating layers formed in between the third and the fourth conductive lines.

11. The semiconductor device of claim 8, further comprising:

insulating layers formed with a gap between adjacent insulating layers and surrounding sidewalls of the third and the fourth protruding portions.

12. The semiconductor device of claim 8, wherein the plurality of sacrificial insulating layers include a third sacrificial layer and a fourth sacrificial layer, wherein the third sacrificial layer is adjacent to and in plane with the third conductive line, and wherein the fourth sacrificial layer is adjacent to and in plane with the fourth conductive line.

13. The semiconductor device of claim 12, further comprising:

the third sacrificial layer extending to a sidewall of the third protruding portion of the third contact plug; and the fourth sacrificial layer extending to a sidewall of the fourth protruding portion of the third contact plug.

14. A semiconductor device, comprising:

a plurality of conductive lines including a first conductive line and a second conductive line;

a plurality of sacrificial insulating layers arranged on sidewalls of the conductive lines, the plurality of sacrificial insulating layers including a first sacrificial insulating layer and a second sacrificial insulating layer; and a plurality of contact plugs including a first contact plug, the first contact plug having a first pillar portion, a first protruding portion and a second protruding portion, the first protruding portion extending from a part of the first pillar portion overlapped with a sidewall of the first conductive line, in a horizontal direction, so as to be in alignment and contact with the sidewall of the first conductive line, the second protruding portion extending from a part of the first pillar portion overlapped with a sidewall of the second conductive line, in the horizontal direction, so as to be in alignment and contact with the sidewall of the second conductive line, wherein the first protruding portion is formed between the first conductive line and the first sacrificial insulating layer, and the second protruding portion is formed between the second conductive line and the second sacrificial insulating layer.

15. The semiconductor device of claim 14, wherein the first and the second conductive lines comprise first and second select lines, respectively.

16. The semiconductor device of claim 14, wherein the first conductive line and the second conductive line are disposed in different planes, and the first protruding portion and the second protruding portion are disposed in different planes.

17. The semiconductor device of claim 14, further comprising:

an insulating layer formed in between the first and the second conductive lines.

18. The semiconductor device of claim 14, further comprising:

insulating layers formed with a gap between adjacent sacrificial insulating layers and surrounding a sidewall of the first pillar portion.

19. A semiconductor device, comprising:

a plurality of conductive lines disposed in different planes;

a plurality of contact plugs arranged in a matrix format; and a plurality of sacrificial insulating layers arranged on sidewalls of the conductive lines, wherein each of the contact plugs passes through at least one of the sacrificial insulating layers, the contact plugs including:

a plurality of first contact plugs arranged in a first row of the matrix format; and a plurality of second contact plugs arranged in a second row of the matrix format, each first contact plug having a first pillar portion and a first protruding portion protruding from a part of the first pillar portion overlapped with a corresponding one of the conductive lines, so as to be in alignment and contact with a sidewall of a corresponding one of the conductive lines, each second contact plug having a second pillar portion and a second protruding portion protruding from a part of the second pillar portion overlapped with a corresponding one of the conductive lines, so as to be in alignment and contact with a sidewall of a corresponding one of the conductive lines, wherein the alignments and contacts between the contact plugs and the conductive lines are made at different depths of the semiconductor device, and wherein the conductive lines are disposed between the first contact plugs and the second contact plugs.

20. The semiconductor device of claim 19, further comprising:

insulating layers formed in between the plurality of conductive lines and surrounding the sidewalls of the first and the second pillar portions.

* * * * *